(12) United States Patent
Li et al.

(10) Patent No.: US 12,389,523 B2
(45) Date of Patent: Aug. 12, 2025

(54) HEAT DISSIPATION APPARATUS AND ELECTRONIC DEVICE

(71) Applicant: HUAWEI TECHNOLOGIES CO., LTD., Guangdong (CN)

(72) Inventors: Lan Li, Shenzhen (CN); Linfang Jin, Dongguan (CN); Jinyan Hu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 267 days.

(21) Appl. No.: 18/254,737

(22) PCT Filed: Nov. 29, 2021

(86) PCT No.: PCT/CN2021/134155
§ 371 (c)(1),
(2) Date: May 26, 2023

(87) PCT Pub. No.: WO2022/111709
PCT Pub. Date: Jun. 2, 2022

(65) Prior Publication Data
US 2024/0008167 A1 Jan. 4, 2024

(30) Foreign Application Priority Data
Nov. 30, 2020 (CN) .......................... 202011373611.2

(51) Int. Cl.
*H05K 1/00* (2006.01)
*H05K 1/02* (2006.01)
*H05K 1/14* (2006.01)

(52) U.S. Cl.
CPC ........... *H05K 1/0206* (2013.01); *H05K 1/144* (2013.01); *H05K 2201/042* (2013.01)

(58) Field of Classification Search
CPC . H05K 1/0206; H05K 1/144; H05K 2201/042
(Continued)

(56) References Cited

U.S. PATENT DOCUMENTS

| 2002/0008963 | A1* | 1/2002 | DiBene, II | ............. | H05K 3/368 |
|---|---|---|---|---|---|
| | | | | | 361/720 |
| 2006/0126310 | A1* | 6/2006 | Watanabe | ............... | G06F 1/203 |
| | | | | | 361/720 |

(Continued)

FOREIGN PATENT DOCUMENTS

JP H0215700 A 1/1990

OTHER PUBLICATIONS

Extended European Search Report in European Appln No. 21897209.9, dated Apr. 12, 2024, 15 pages.

*Primary Examiner* — Zhengfu J Feng
(74) *Attorney, Agent, or Firm* — Fish & Richardson P.C.

(57) ABSTRACT

An example heat dissipation apparatus is connected to a heat sink. The example heat dissipation apparatus includes a first circuit board, a second circuit board, a support post, a main heat generation component, and a thermal conductive assembly. The second circuit board is located on a side of the first circuit board, and is spaced from the first circuit board. The support post is connected between the first circuit board and the second circuit board to form an air layer between the first circuit board and the second circuit board. The main heat generation component is mounted on the second circuit board. The thermal conductive assembly is connected between a second thermal conductive layer of the first circuit board and a third thermal conductive layer of the second circuit board.

20 Claims, 21 Drawing Sheets

(58) Field of Classification Search
USPC .......................................................... 361/720
See application file for complete search history.

(56)  References Cited

U.S. PATENT DOCUMENTS

| | | | |
|---|---|---|---|
| 2008/0130234 A1* | 6/2008 | Maehara | H05K 7/205 |
| | | | 361/704 |
| 2010/0321895 A1* | 12/2010 | Hill | F28F 21/02 |
| | | | 29/829 |
| 2012/0299173 A1* | 11/2012 | Mohammed | H01L 25/105 |
| | | | 438/107 |
| 2017/0188477 A1* | 6/2017 | Matsuda | H05K 1/144 |

* cited by examiner

HEAT DISSIPATION APPARATUS AND ELECTRONIC DEVICE

CROSS-REFERENCE TO RELATED APPLICATIONS

This application is a National Stage of International Patent Application No. PCT/CN2021/134155, filed on Nov. 29, 2021, which claims priority to Chinese Patent Application No. 202011373611.2, filed on Nov. 30, 2020. Both of the aforementioned applications are hereby incorporated by reference in their entireties.

TECHNICAL FIELD

This application relates to the field of circuit board technologies, and in particular, to a heat dissipation apparatus and an electronic device.

BACKGROUND

With rapid development of electronic communication technologies, functions of an electronic device inevitably trend to be diversified. Currently, the electronic device may be provided with a heat dissipation apparatus, and the heat dissipation apparatus includes a plurality of circuit boards that are disposed in a stacked manner, so that a plurality of functional components can be mounted on different circuit boards, to improve component integration. However, a larger quantity of functional components results in a higher heat flux density of the heat dissipation apparatus, and consequently, the heat dissipation apparatus cannot meet a heat dissipation requirement, and has low reliability.

SUMMARY

This application provides a heat dissipation apparatus and an electronic device. The heat dissipation apparatus has a low heat flux density, high heat dissipation efficiency, and good working reliability.

According to a first aspect, this application provides a heat dissipation apparatus, including a first circuit board, a second circuit board, a support post, a main heat generation component, and a thermal conductive assembly.

The first circuit board includes a first thermal conductive layer and a second thermal conductive layer that are spaced from each other, and a thermal conductive structure, where the thermal conductive structure is connected between the first thermal conductive layer and the second thermal conductive layer, and the first thermal conductive layer is configured to connect to a heat sink.

The second circuit board is located on a side of the first circuit board and spaced from the first circuit board. The second circuit board includes a third thermal conductive layer and a fourth thermal conductive layer that are spaced from each other, and a thermal conductive structure, and the thermal conductive structure is connected between the third thermal conductive layer and the fourth thermal conductive layer.

The support post is connected between the first circuit board and the second circuit board, to form an air layer between the first circuit board and the second circuit board.

The main heat generation component is mounted on the second circuit board, and a heat dissipation pin of the main heat generation component is connected to the fourth thermal conductive layer.

The thermal conductive assembly is connected between the first thermal conductive layer of the second circuit board and the second thermal conductive layer.

In the heat dissipation apparatus shown in this application, heat generated when the main heat generation component works may be sequentially transferred to the fourth thermal conductive layer by using the heat dissipation pin, transferred to the thermal conductive assembly by using a second thermal conductive structure and the third thermal conductive layer, transferred to the second thermal conductive layer by using the thermal conductive assembly, and transferred to the heat sink by using a first thermal conductive structure and the first thermal conductive layer of the first circuit board, so as to dissipate heat for the main heat generation component.

The fourth thermal conductive layer, the second thermal conductive structure and the third thermal conductive layer of the second circuit board, the thermal conductive assembly, the second thermal conductive layer, the first thermal conductive structure, the first thermal conductive layer, and the heat sink form a three-dimensional heat dissipation topology network. The three-dimensional heat dissipation topology network may receive, by using the heat dissipation pin, heat generated when the main heat generation component works, to dissipate heat for the main heat generation component. This effectively reduces a junction temperature of the main heat generation component, effectively resolves a heat dissipation problem of the main heat generation component, and improves working efficiency and a service life of the main heat generation component, so that the heat dissipation apparatus has a low heat density, high heat dissipation efficiency, and good working reliability.

In an implementation, the first thermal conductive layer and the second thermal conductive layer are arranged at an interval in a thickness direction of the first circuit board, and the second thermal conductive layer is located on a side that is of the first circuit board and that is close to the second circuit board.

The third thermal conductive layer and the fourth thermal conductive layer are arranged at an interval in a thickness direction of the second circuit board, and the fourth thermal conductive layer is located on a side that is of the second circuit board and that is away from the first circuit board.

The main heat generation component is mounted on the side that is of the second circuit board and that is away from the first circuit board, and the thermal conductive assembly is located in the air layer.

In the heat dissipation apparatus shown in this application, the main heat generation component and the heat sink are spaced from each other by the first circuit board and the second circuit board. Heat generated when the main heat generation component works may be effectively diffused by using the three-dimensional heat dissipation topology network, so that the junction temperature of the main heat generation component can be reduced, a heat dissipation problem of the main heat generation component can be resolved, and working efficiency and a service life of the main heat generation component can be improved.

In an implementation, in the thickness direction of the second circuit board, the main heat generation component at least partially overlaps the second thermal conductive structure, to shorten a heat dissipation path for transferring heat of the main heat generation component to the third thermal conductive layer by using the fourth thermal conductive layer and the second thermal conductive structure. This helps improve heat dissipation efficiency of the main heat generation component.

In an implementation, the heat dissipation apparatus includes a solder layer, and the solder layer is electrically connected between the heat dissipation pin of the main heat generation component and the fourth thermal conductive layer.

In another implementation, the heat dissipation apparatus includes a solder layer and a conducting wire, the solder layer is connected between the heat dissipation pin of the main heat generation component and a thermal conductive layer of the second circuit board, and the conducting wire is electrically connected between the main heat generation component and the fourth thermal conductive layer.

In an implementation, an orthographic projection of the main heat generation component on the first circuit board is located on the first circuit board. In other words, in the thickness direction of the first circuit board, the main heat generation component overlaps the first circuit board.

In an implementation, in the thickness direction of the second circuit board, the thermal conductive assembly at least partially overlaps the second thermal conductive structure, to shorten a heat dissipation path for transferring heat of the main heat generation component to the thermal conductive assembly by using the fourth thermal conductive layer, the second thermal conductive structure, and the third thermal conductive layer. This helps improve heat dissipation efficiency of the main heat generation component.

In an implementation, in the thickness direction of the first circuit board, the thermal conductive assembly at least partially overlaps the thermal conductive structure of first circuit board, to shorten a heat dissipation path for transferring heat of the main heat generation component to the first thermal conductive layer through the thermal conductive assembly, the second thermal conductive layer, and the first thermal conductive structure. This helps improve heat dissipation efficiency of the main heat generation component.

In an implementation, the thermal conductive assembly includes two thermal conductive blocks and a thermal interface material layer, one thermal conductive block is connected to the second thermal conductive layer, the other thermal conductive block is connected to the third thermal conductive layer, and the thermal interface material layer is connected between the two thermal conductive blocks.

The thermal interface material may fill an air gap and tolerance redundancy between the two thermal conductive blocks, to reduce interface thermal resistance between the two thermal conductive blocks, and improve heat transfer efficiency between the two thermal conductive blocks.

In an implementation, the thermal conductive assembly includes a thermal conductive post, and the thermal conductive post is connected between the second thermal conductive layer and the third thermal conductive layer.

In an implementation, the heat dissipation apparatus further includes a first component, and the first component is mounted on the first circuit board or the second circuit board.

The thermal conductive post and the support post are both made of a metal material and are both in a grounded state.

When there is one thermal conductive post, the thermal conductive post and the support post are respectively located on both sides of the first component.

Alternatively, when there are a plurality of thermal conductive posts, the plurality of thermal conductive posts and the support post are disposed in a mutually spaced manner around the first component, or the plurality of thermal conductive posts and the support post are fixedly connected to each other to enclose a metal frame, and the first component is located on an inner side of the metal frame.

The thermal conductive post and the support post may form an electromagnetic shielding structure of the first component, to have a specific electromagnetic shielding function, so that electromagnetic interference caused by an external component to the first component is avoided, or the first component is prevented from causing electromagnetic interference to another component.

In an implementation, the first component includes one or more of an antenna module, a front-end module, a modem, a signal transceiver, a memory, a flash memory, a connector, a functional sensor, a resistor, a capacitor, an inductor, or a crystal oscillator.

In an implementation, the thermal conductive assembly includes a packaging component, the packaging component of the thermal conductive assembly is provided with a heat dissipation channel, and the heat dissipation channel of the packaging component of the thermal conductive assembly is connected between the second thermal conductive layer and the third thermal conductive layer.

In the heat dissipation apparatus shown in this application, the fourth thermal conductive layer, the second thermal conductive structure, and the third thermal conductive layer of the second circuit board, the heat dissipation channel of the packaging component of the thermal conductive assembly, the second thermal conductive layer, the first thermal conductive structure, the first thermal conductive layer, and the heat sink jointly form a three-dimensional heat dissipation topology network, so as to help improve integration of the heat dissipation apparatus.

In an implementation, the packaging component of the thermal conductive assembly includes:
    a bearing plate, where a heat dissipation part is disposed inside the bearing plate;
    a heat dissipation pin, located on one side of the bearing plate and connected to the heat dissipation part of the bearing plate;
    a heat dissipation post, located on the other side of the bearing plate and connected to the heat dissipation part of the bearing plate; and
    a packaging layer, covering the bearing plate and the heat dissipation post, where the heat dissipation post is exposed relative to the packaging layer.

The heat dissipation pin, the heat dissipation part of the bearing plate, and the heat dissipation post form the heat dissipation channel of the packaging component of the thermal conductive assembly.

In an implementation, the packaging component of the thermal conductive assembly includes:
    a bearing plate, where a heat dissipation part is disposed inside the bearing plate;
    a heat dissipation pin, located on one side of the bearing plate and connected to the heat dissipation part of the bearing plate;
    a heat dissipation post, located on the other side of the bearing plate and connected to the heat dissipation part of the bearing plate;
    a packaging layer, covering the bearing plate and the heat dissipation post, where the heat dissipation post is exposed relative to the packaging layer; and
    an auxiliary heat dissipation layer, covering the heat dissipation post and the packaging layer.

The heat dissipation pin, the heat dissipation part of the bearing plate, the heat dissipation post, and the auxiliary heat dissipation layer form the heat dissipation channel of the packaging component of the thermal conductive assembly.

In an implementation, the thermal conductive assembly further includes a thermal conductive block.

When there is one thermal conductive block, the thermal conductive block is connected between the heat dissipation channel of the packaging component of the thermal conductive assembly and the second thermal conductive layer, or the thermal conductive block is connected between the heat dissipation channel of the packaging component of the thermal conductive assembly and the third thermal conductive layer.

When there are two thermal conductive blocks, one thermal conductive block is connected between the heat dissipation channel of the packaging component of the thermal conductive assembly and the second thermal conductive layer, and the other thermal conductive block is connected between the heat dissipation channel of the packaging component of the thermal conductive assembly and the third thermal conductive layer.

In an implementation, the thermal conductive assembly further includes a thermal interface material layer, and the thermal interface material layer is connected between the thermal conductive block and the heat dissipation channel of the packaging component of the thermal conductive assembly.

The thermal interface material may fill an air gap and tolerance redundancy between the thermal conductive block and the heat dissipation channel of the packaging component of the thermal conductive assembly, to reduce interface thermal resistance between the thermal conductive block and the heat dissipation channel, and improve heat transfer efficiency between the thermal conductive block and the heat dissipation channel.

In an implementation, a circuit board stacking structure further includes a connection layer, and the connection layer is made of solder, or the connection layer is made of a thermal interface material, or the connection layer is made of a thermal conductive adhesive.

When there is one connection layer, the connection layer is connected between the thermal conductive assembly and the second thermal conductive layer, or the connection layer is connected between the thermal conductive assembly and the third thermal conductive layer.

Alternatively, when there are two connection layers, one connection layer is connected between the thermal conductive assembly and the second thermal conductive layer, and the other connection layer is connected between the thermal conductive assembly and the third thermal conductive layer.

In an implementation, the thermal conductive structure of the first circuit board includes a chip, the chip of the first thermal conductive structure is provided with a heat dissipation channel, and the heat dissipation channel of the chip of the first thermal conductive structure is connected between the first thermal conductive layer of the first circuit board and the second thermal conductive layer.

In the heat dissipation apparatus shown in this application, the fourth thermal conductive layer, the second thermal conductive structure, and the third thermal conductive layer of the second circuit board, the thermal conductive assembly, the second thermal conductive layer, the heat dissipation channel of the chip of the first thermal conductive structure, and the first thermal conductive layer of the first circuit board, and the heat sink jointly form a three-dimensional heat dissipation topology network, to help improve an area utilization benefit of the first circuit board and improve integration of the heat dissipation apparatus.

In an implementation, the chip of the first circuit board includes:

a wafer layer;
a thermal conductive surface layer, where the thermal conductive surface layer is located on one side of the wafer layer and is connected to the wafer layer;
a leg, where the leg is located on the other side of the wafer layer and is connected to the wafer layer; and
a packaging layer, where the packaging layer covers the wafer layer, the thermal conductive surface layer, and the leg, and the thermal conductive surface layer and the leg are exposed relative to the packaging layer.

The thermal conductive surface layer, the wafer layer, and the leg form the heat dissipation channel of the chip of the first circuit board.

The wafer layer is made of a semiconductor material like silicon, gallium nitride, or silicon carbide. The semiconductor material has good thermal conductive performance, which helps high-density integration of high thermal-conductivity materials in the heat dissipation apparatus, and effectively reduces thermal resistance of the three-dimensional heat dissipation topology network.

In an implementation, the second thermal conductive structure includes a chip, the chip of the second circuit board is provided with a heat dissipation channel, and the heat dissipation channel of the chip of the second circuit board is connected between the third thermal conductive layer and the second thermal conductive layer.

In the heat dissipation apparatus shown in this application, the fourth thermal conductive layer, the heat dissipation channel of the chip of the second thermal conductive structure and the third thermal conductive layer of the second circuit board, the thermal conductive assembly, the second thermal conductive layer, the first thermal conductive structure and the first thermal conductive layer of the first circuit board, and the heat sink jointly form a three-dimensional heat dissipation topology network, to help improve an area utilization benefit of the second circuit board and improve integration of the heat dissipation apparatus.

In an implementation, the chip of the second circuit board includes:

a wafer layer;
a thermal conductive surface layer, where the thermal conductive surface layer is located on one side of the wafer layer and is connected to the wafer layer;
a leg, where the leg is located on the other side of the wafer layer and is connected to the wafer layer; and
a packaging layer, where the packaging layer covers the wafer layer, the thermal conductive surface layer, and the leg, and the thermal conductive surface layer and the leg are exposed relative to the packaging layer.

The thermal conductive surface layer, the wafer layer, and the leg form the heat dissipation channel of the chip of the second circuit board.

The wafer layer is made of a semiconductor material like silicon, gallium nitride, or silicon carbide. The semiconductor material has good thermal conductive performance, which helps high-density integration of high thermal-conductivity materials in the heat dissipation apparatus, and effectively reduces thermal resistance of the three-dimensional heat dissipation topology network.

In an implementation, the main heat generation component is a multimedia application processor, a system on chip, a central processing unit, a power management unit, or a radio frequency power amplifier.

In an implementation, the heat dissipation apparatus further includes a flexible printed circuit, and the flexible printed circuit is electrically connected between the first circuit board and the second circuit board, to implement a communication connection between the first circuit board and the second circuit board.

According to a second aspect, this application provides an electronic device, including a heat sink and the heat dissipation apparatus according to any one of the implementations, where the heat sink is connected to a first thermal conductive layer of a first circuit board.

In an implementation, the electronic device further includes a heat transfer part, and the heat transfer part is connected between the heat sink and the first thermal conductive layer of the first circuit board, to implement heat transfer between the heat sink and the first thermal conductive layer.

In an implementation, in a thickness direction of the first circuit board, the heat transfer part at least partially overlaps a first thermal conductive structure, to shorten a heat dissipation path for transferring heat to the heat transfer part through the second thermal conductive layer, the first thermal conductive structure, and the first thermal conductive layer. This improves heat dissipation efficiency of the main heat generation component.

In an implementation, the heat transfer part includes a heat transfer block, and the heat transfer block is connected between the first thermal conductive layer and the heat sink.

In an implementation, the heat transfer part includes a packaging component, the packaging component of the heat transfer part is provided with a heat dissipation channel, and the heat dissipation channel of the packaging component of the heat transfer part is connected between the heat sink and the first thermal conductive layer.

In the electronic device shown in this application, the fourth thermal conductive layer, the second thermal conductive structure, and the third thermal conductive layer of the second circuit board, the thermal conductive assembly, the second thermal conductive layer, the first thermal conductive structure, the first thermal conductive layer, the heat dissipation channel of the packaging component of the heat transfer part, and the heat sink jointly form a three-dimensional heat dissipation topology network, to help improve integration of the electronic device.

In an implementation, the packaging component of the heat transfer part includes:
  a bearing plate, where a heat dissipation part is disposed inside the bearing plate;
  a heat dissipation pin, located on one side of the bearing plate and connected to the heat dissipation part of the bearing plate;
  a heat dissipation post, located on the other side of the bearing plate and connected to the heat dissipation part of the bearing plate; and
  a packaging layer, covering the bearing plate and the heat dissipation post, where the heat dissipation post is exposed relative to the packaging layer.

The heat dissipation pin, the heat dissipation part of the bearing plate, and the heat dissipation post form the heat dissipation channel of the packaging component of the heat transfer part.

In an implementation, the packaging component of the heat transfer part includes:
  a bearing plate, where a heat dissipation part is disposed inside the bearing plate;
  a heat dissipation pin, located on one side of the bearing plate and connected to the heat dissipation part of the bearing plate;
  a heat dissipation post, located on the other side of the bearing plate and connected to the heat dissipation part of the bearing plate;
  a packaging layer, covering the bearing plate and the heat dissipation post, where the heat dissipation post is exposed relative to the packaging layer; and
  an auxiliary heat dissipation layer, covering the heat dissipation post and the packaging layer.

The heat dissipation pin, the heat dissipation part of the bearing plate, the heat dissipation post, and the auxiliary heat dissipation layer form the heat dissipation channel of the packaging component of the heat transfer part.

In an implementation, a circuit board stacking structure further includes a heat transfer layer, where the heat transfer layer is made of solder, or the heat transfer layer is made of a thermal interface material, or the heat transfer layer is made of a thermal conductive adhesive.

When there is one heat transfer layer, the heat transfer layer is connected between the heat transfer part and the first thermal conductive layer of the first circuit board, or the heat transfer layer is connected between the heat transfer part and the heat sink.

When there are two heat transfer layers, one heat transfer layer is connected between the heat transfer part and the first thermal conductive layer of the first circuit board, and the other heat transfer layer is connected between the heat transfer part and the heat sink.

In an implementation, the electronic device further includes an auxiliary heat transfer layer, the auxiliary heat transfer layer is made of a thermal interface material, and the auxiliary heat transfer layer is connected between the heat sink and the first thermal conductive layer.

The thermal interface material may fill an air gap and tolerance redundancy between the heat sink and the first thermal conductive layer, to reduce interface thermal resistance between the heat sink and the first thermal conductive layer, and improve heat transfer efficiency between the heat sink and the first thermal conductive layer.

In an implementation, the heat sink is a middle frame, a graphite film, a graphene film, a thermal conductive metal film, a heat pipe heat sink, a vapor chamber heat sink, or a fan.

BRIEF DESCRIPTION OF DRAWINGS

To describe the technical solutions in embodiments of this application or in the background more clearly, the following briefly describes the accompanying drawings for describing embodiments of this application or the background.

DESCRIPTION OF EMBODIMENTS

The following describes embodiments of this application with reference to the accompanying drawings in embodiments of this application.

Figure 1:
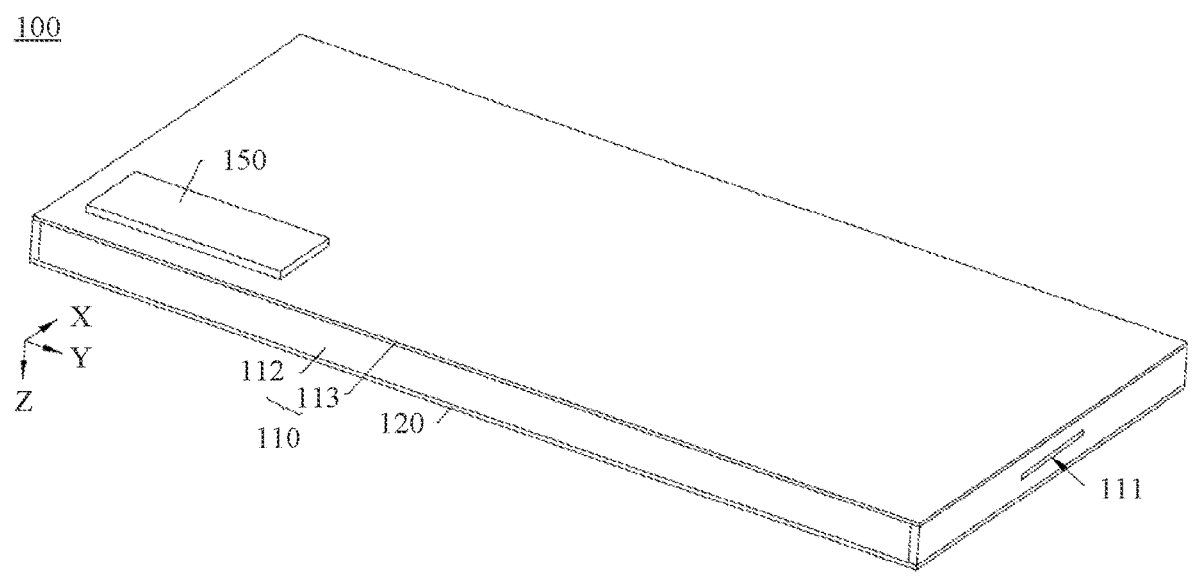
FIG. 1 is a schematic diagram of a structure of an electronic device according to an embodiment of this application.
Figure 2:
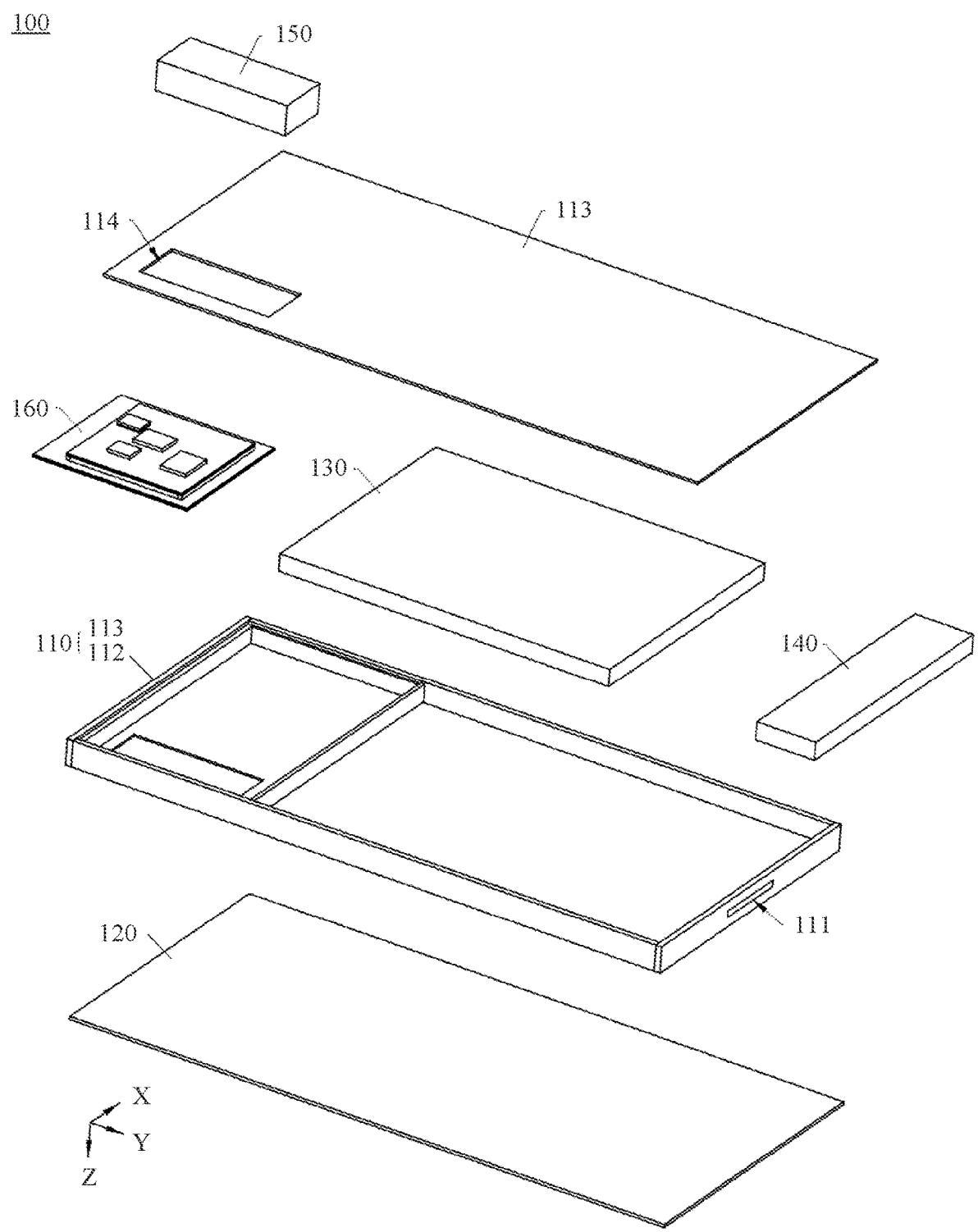
FIG. 2 is a schematic exploded view of a partial structure of the electronic device shown in FIG. 1.

FIG. 1 is a schematic diagram of a structure of an electronic device 100 according to an embodiment of this application, and FIG. 2 is a schematic exploded view of a partial structure of the electronic device 100 shown in FIG. 1 from another angle. For ease of description below, in FIG. 1, a width direction of the electronic device 100 is defined as an X-axis direction, a length direction of the electronic device 100 is defined as a Y-axis direction, a height direction of the electronic device 100 is defined as a Z-axis direction, and a height direction (that is, the Z-axis direction) of the electronic device 100 is perpendicular to the width direction (that is, the X-axis direction) and the length direction (that is, the Y-axis direction) of the electronic device 100.

The electronic device 100 may be an electronic product like a mobile phone, a tablet computer, an in-vehicle infotainment, a multimedia player, an e-book reader, a notebook computer, a point of sales terminal (POS machine for short) in-vehicle device, or a wearable device. The wearable device may be a smart band, a smart watch, augmented reality (AR) glasses, virtual reality (VR) glasses, or the like. In the embodiment shown in FIG. 1, an example in which the electronic device 100 is a mobile phone is used for description.

The electronic device 100 includes a housing 110, a screen 120, a battery 130, a speaker module 140, a camera module 150, and a heat dissipation apparatus 160. The housing 110 is provided with a sound outlet hole 111. The screen 120 is mounted on the housing 110, and is enclosed with the housing 110 to form an overall internal cavity (not shown in the figure). The overall internal cavity communicates with the sound outlet hole 111. The battery 130, the speaker module 140, the camera module 150, and the heat dissipation apparatus 160 are all mounted in the overall internal cavity. The battery 130 can supply power to the screen 120, the speaker module 140, the camera module 150, and the heat dissipation apparatus 160. The speaker module 140 can vibrate and make a sound, and the sound is diffused to an external environment through the sound outlet hole 111, to implement sound making of the electronic device 100. The camera module 150 can collect light outside the electronic device 100, and form corresponding image data. It should be understood that, in embodiments of this application, that a component or a module is mounted in the overall internal cavity does not mean that the component or the module needs to be completely located in the overall internal cavity, and the component or the module may be partially or completely located in the overall internal cavity.

The housing 110 includes a middle frame 112 and a rear cover 113. The sound outlet hole 111 is provided on the middle frame 112. In this embodiment, the rear cover 113 is provided with an avoidance hole 114, and the avoidance hole 114 penetrates through the rear cover 113 in a thickness direction of the rear cover 113. Specifically, the rear cover 113 is fixedly connected to a side of the middle frame 112. The rear cover 113 may be detachably mounted on the middle frame 112, to facilitate maintenance and replacement of a component or a module like the battery 130 inside the electronic device 100. In this case, the middle frame 112 may be made of a metal alloy material like a titanium alloy or an aluminum-magnesium alloy, and the rear cover 113 may be made of engineering plastic such as a polycarbonate (PC), an acrylonitrile butadiene styrene copolymer (ABS), glass or ceramic, or a metal alloy like a titanium alloy or an aluminum-magnesium alloy. In some other embodiments, the rear cover 113 and the middle frame 112 may be integrally formed, to improve structural stability of the electronic device 100. In this case, the middle frame 112 and the rear cover 113 may be made of one metal material or a combination of a plurality of metal materials.

Figure 3:
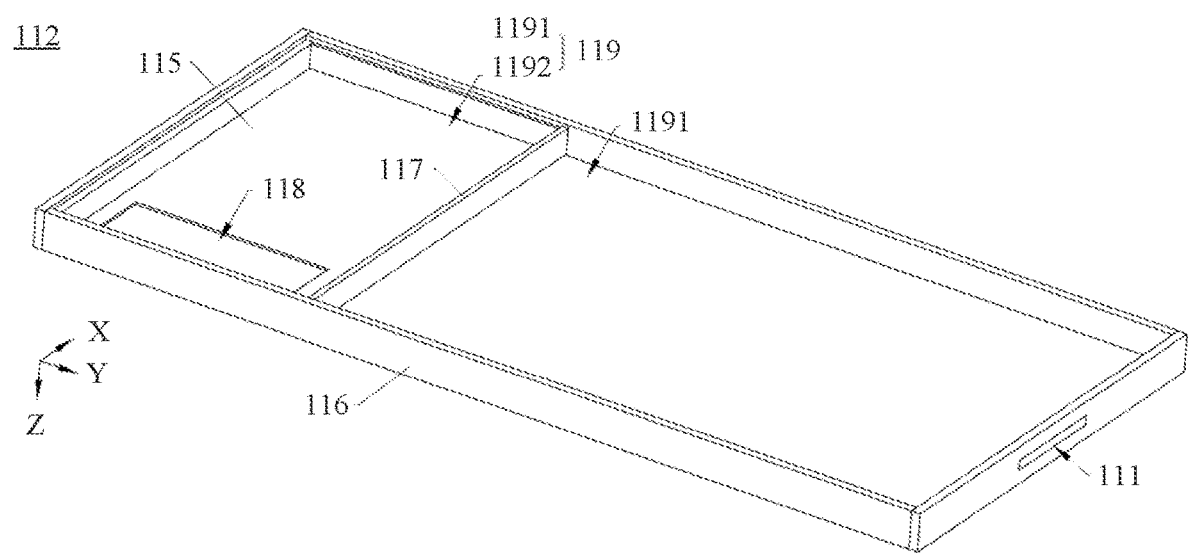
FIG. 3 is a schematic diagram of a structure of a middle frame of a housing in an electronic device shown in FIG. 2.
Figure 4:
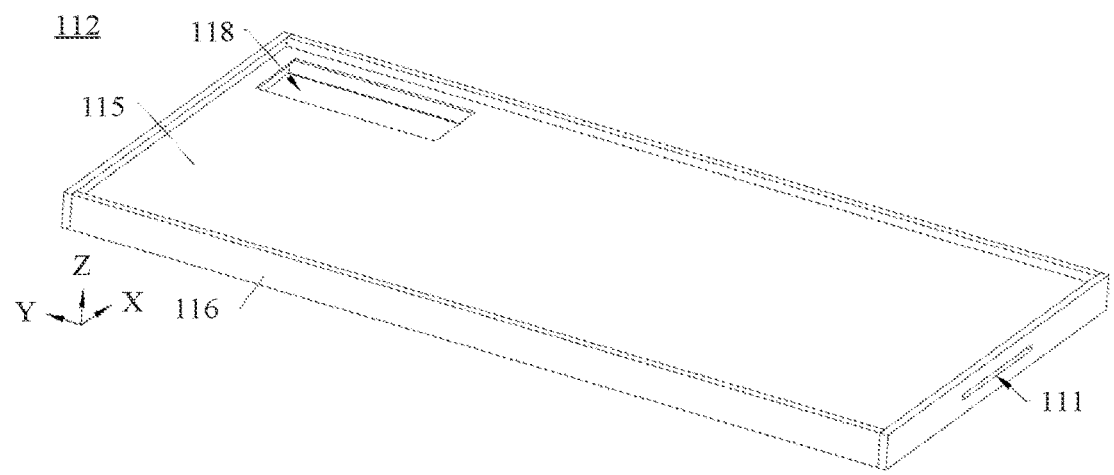
FIG. 4 is a schematic diagram of a structure of the middle frame shown in FIG. 3 from another angle.

FIG. 3 is a schematic diagram of a structure of a middle frame 112 of a housing 110 of the electronic device 100 shown in FIG. 2, and FIG. 4 is a schematic diagram of a structure of the middle frame 112 shown in FIG. 3 from another angle.

The middle frame 112 includes a middle plate 115, a bezel 116, and a spacer 117. The sound outlet hole 111 is disposed on the bezel 116. In this embodiment, the middle plate 115 is provided with an avoidance hole 118, and the avoidance hole 118 penetrates through the middle plate 115 in a thickness direction of the middle plate 115. The bezel 116 is fixedly connected to a periphery of the middle plate 115, and is enclosed with the middle plate 115 to form accommodating space 119. The accommodating space 119 communicates with the avoidance hole 118. The spacer 117 is located on an inner side of the bezel 116, and is fixedly connected to the bezel 116, and divides the accommodating space 119 into first accommodating space 1191 and second accommodating space 1192. The first accommodating space 1191 communicates with the sound outlet hole 111, and the second accommodating space 1192 communicates with the avoidance hole 118.

Refer to FIG. 1 again. The screen 120 is fixedly connected to the other side of the middle frame 112, that is, the screen 120 is mounted on a side that is of the middle frame 112 and that is away from the rear cover 113, to be specific, the screen 120 and the rear cover 113 are mounted on two opposite sides of the middle frame 112. In this case, a direction in which the rear cover 113 points to the screen 120 is the Z-axis direction shown in the figure. When the user uses the electronic device 100, the screen 120 is placed toward the user, and the rear cover 113 is placed away from the user. Specifically, the screen 120 includes a display surface (not shown in the figure) and a non-display surface (not shown in the figure) that are disposed opposite to each other. The display surface is a surface on which the screen 120 is away from the middle frame 112, and is used to display a picture. The screen 120 may include a cover and a display fastened to the cover. The cover plate may be made of a transparent material like glass. The display may be a liquid crystal display (LCD) or an organic light-emitting diode display (OLED).

Figure 5:
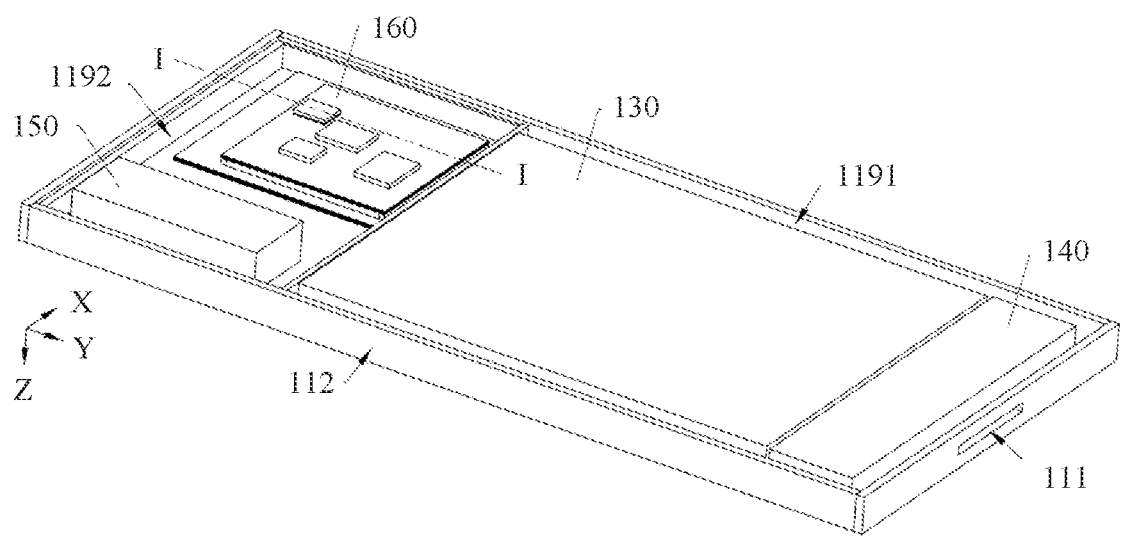
FIG. 5 is a schematic diagram of an assembled structure of a middle frame, a battery, a speaker module, a camera module, and a heat dissipation apparatus of a housing of the electronic device shown in FIG. 2.

Refer to FIG. 1 and FIG. 5. FIG. 5 is a schematic diagram of an assembled structure of a middle frame 112, a battery 130, a speaker module 140, a camera module 150, and a heat dissipation apparatus 160 of a housing 110 of the electronic device 100 shown in FIG. 2.

The battery 130 and the speaker module 140 are mounted in the first accommodating space 1191, and the camera module 150 and the heat dissipation apparatus 160 are mounted in the second accommodating space 1192. Specifically, the camera module 150 is exposed relative to the housing 110. In this embodiment, the camera module 150 is a rear-facing camera module 150 of the electronic device 100. The camera module 150 passes through the avoidance hole 118 (as shown in FIG. 4) of the middle plate 115 and the avoidance hole 114 (as shown in FIG. 2) of the rear cover 113, and is exposed relative to the rear cover 113. In this case, a portion of the camera module 150 is accommodated in the second accommodating space 1192, and a portion of the camera module 150 protrudes relative to the rear cover 113. It should be noted that, that the camera module 150 is exposed relative to the rear cover 113 means that the rear cover 113 does not completely cover the camera module 150. In some other embodiments, the camera module 150 may be flush with the rear cover 113, or the camera module 150 may be completely accommodated in the second accommodating space 1192 without passing through the avoidance hole 114 of the rear cover 113.

Figure 6:
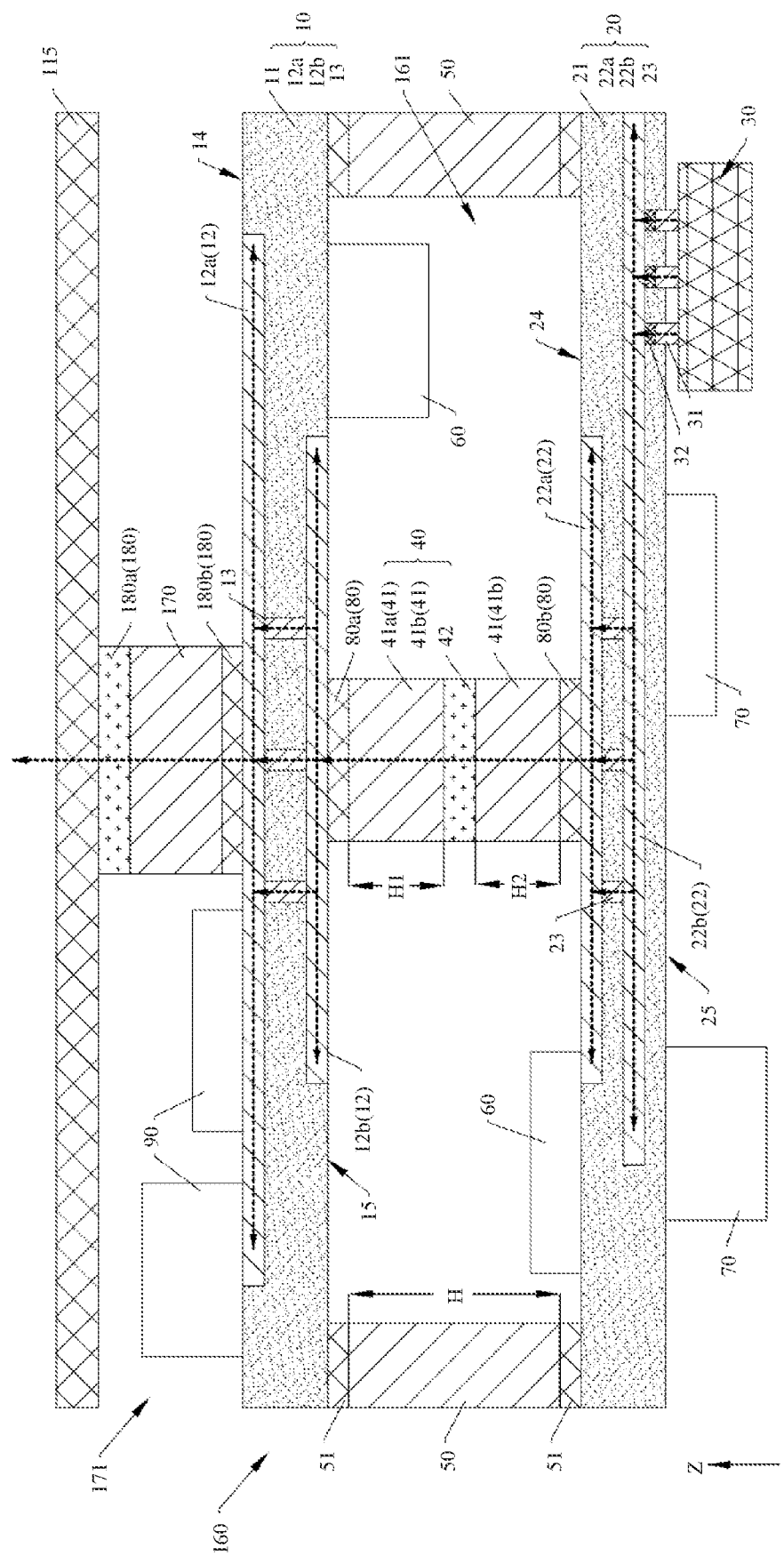
FIG. 6 is a schematic diagram of a partial cross-sectional structure cut from the structure shown in FIG. 5 along I-I according to an embodiment.

FIG. 6 is a schematic diagram of a partial cross-sectional structure cut from the structure shown in FIG. 5 along I-I according to an embodiment. "Cut along I-I" means being cut in a plane on which an I-I line is located. The following description of the accompanying drawings is understood in a same or similar way.

The heat dissipation apparatus 160 is fixedly connected to the middle frame 112. The heat dissipation apparatus 160 is fixedly connected to the middle plate 115. The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20. The thermal conductive assembly 40 is connected between the first circuit board 10 and the second circuit board 20.

It should be understood that when the heat dissipation apparatus 160 is described in this embodiment of this application, orientation terms such as "top" and "bottom" are used for describing mainly based on the display orientation in FIG. 6, but are not used for indicating or implying that an indicated apparatus or element shall have a specific orientation, or be constructed and operated in a specific orientation, where a positive direction toward the Z axis is "top", and a negative direction toward the Z axis is "bottom". Therefore, this cannot be understood as a limitation on an orientation of the heat dissipation apparatus 160 in an actual application scenario.

In this embodiment, the first circuit board 10 includes a substrate 11, two thermal conductive layers 12, and a first thermal conductive structure 13. The substrate 11 includes a top surface 14 and a bottom surface 15 that are disposed back to each other. Both the two thermal conductive layers 12 and the first thermal conductive structure 13 are embedded into the substrate 11. The two thermal conductive layers 12 are disposed in a mutually spaced manner, and the first thermal conductive structure 13 is connected between the two thermal conductive layers 12. It should be understood that the "connection" mentioned in the description of the heat dissipation apparatus 160 in this embodiment of this application includes two cases: "direct connection" and "indirect connection". The following related descriptions may be understood in the same way.

Specifically, the two thermal conductive layers 12 are respectively a first thermal conductive layer 12a and a second thermal conductive layer 12b, and the first thermal conductive layer 12a and the second thermal conductive layer 12b are arranged at an interval in a thickness direction of the first circuit board 10. The first thermal conductive layer 12a is exposed relative to the top surface 14 of the substrate 11. A top surface (not shown in the figure) of the first thermal conductive layer 12a is flush with the top surface 14 of the substrate 11. It should be understood that, that the first thermal conductive layer 12a is exposed relative to the top surface 14 of the substrate 11 means that the substrate 11 does not completely cover the first thermal conductive layer 12a. In some other embodiments, a top surface of the first thermal conductive layer 12a may protrude relative to the top surface 14 of the substrate 11, or a top surface of the first thermal conductive layer 12a may be recessed relative to the top surface 14 of the substrate 11.

The second thermal conductive layer 12b is located on a side that is of the first circuit board 10 and that faces the second circuit board 20. Specifically, the second thermal conductive layer 12b is located on a bottom side of the first thermal conductive layer 12a, is parallel to and spaced from the first thermal conductive layer 12a, and is exposed relative to the bottom surface 15 of the substrate 11. A bottom surface (not shown in the figure) of the second thermal conductive layer 12b is flush with the bottom surface 15 of the substrate 11. It should be understood that, that the second thermal conductive layer 12b is exposed relative to the bottom surface 15 of the substrate 11 means that the substrate 11 does not completely cover the second thermal conductive layer 12b. In some other embodiments, a bottom surface of the second thermal conductive layer 12b may protrude relative to the bottom surface 15 of the substrate 11, or a bottom surface of the second thermal conductive layer 12b may be recessed relative to the bottom surface 15 of the substrate 11.

In this embodiment, both the first thermal conductive layer 12a and the second thermal conductive layer 12b are ground planes. The first thermal conductive layer 12a and the second thermal conductive layer 12b may be made of a metal material like copper, silver, aluminum, magnesium, or tin, to ensure that the first thermal conductive layer 12a and the second thermal conductive layer 12b have high thermal conductivity.

The first thermal conductive structure 13 is connected between the first thermal conductive layer 12a and the second thermal conductive layer 12b, to implement heat transfer and an electrical connection between the first thermal conductive layer 12a and the second thermal conductive layer 12b. The first thermal conductive structure 13 includes a plurality of thermal conductive parts, and the plurality of thermal conductive parts 13 are spaced from each other, to increase a heat transfer path between the first thermal conductive layer 12a and the second thermal conductive layer 12b, and increase a heat transfer speed between the first thermal conductive layer 12a and the second thermal conductive layer 12b.

In some embodiments, the substrate 11 is provided with a communication hole (not shown in the figure) that connects the first thermal conductive layer 12a and the second thermal conductive layer 12b. The communication hole is a through hole or a buried hole. The thermal conductive part is located in the communication hole to connect the first thermal conductive layer 12a and the second thermal conductive layer 12b. The thermal conductive part may be made of a metal material like copper, silver, aluminum, magnesium, or tin, to ensure that the first thermal conductive structure 13 has high thermal conductivity, and improve heat transfer efficiency between the first thermal conductive layer 12a and the second thermal conductive layer 12b. In this case, the thermal conductive part may be a metal post formed by filling the communication hole with the metal material, or the thermal conductive part may be a metal layer formed by partially covering or completely covering a hole wall of the communication hole with the metal material.

In some other embodiments, the first circuit board 10 may alternatively include three or more thermal conductive layers 12 and the first thermal conductive structure 13, where the first thermal conductive structure 13 includes a plurality of thermal conductive parts, and each thermal conductive part is connected between two thermal conductive layers 12, to implement heat transfer and electrical communication between the plurality of thermal conductive layers 12, and ensure uniform diffusion of heat inside the first circuit board 10.

In this embodiment, the second circuit board 20 is disposed opposite to the first circuit board 10. It should be understood that, that the second circuit board 20 is disposed opposite to the first circuit board 10 means that in a Z-axis direction, the second circuit board 20 at least partially overlaps the first circuit board 10. In other words, an orthographic projection of the second circuit board 20 in a plane on which the bottom surface 15 of the first circuit board 10 is located is at least partially located in the bottom surface 15 of the first circuit board 10, or an orthographic projection of the first circuit board 10 in a plane on which the top surface 14 of the second circuit board 20 is located is at least partially located in the top surface 14 of the second circuit board 20. In some other embodiments, the second circuit board 20 and the first circuit board 10 may not be disposed opposite to each other, that is, in the Z-axis direction, the second circuit board 20 and the first circuit board 10 are completely staggered, and do not overlap.

The second circuit board 20 and the first circuit board 10 are disposed opposite to each other. The second circuit board 20 includes a substrate 21, two thermal conductive layers 22, and a second thermal conductive structure 23. The substrate 21 includes a top surface 24 and a bottom surface 25 that are disposed back to each other. Both the two thermal conductive layers 22 and the second thermal conductive structure 23 are embedded into the substrate 21. The two thermal conductive layers 22 are disposed in a mutually spaced manner, and the second thermal conductive structure 23 is connected between the two thermal conductive layers 22. Specifically, the two thermal conductive layers 22 are respectively a third thermal conductive layer 22a and a fourth thermal conductive layer 22b, and the third thermal conductive layer 22a and the fourth thermal conductive layer 22b are arranged at an interval in a thickness direction of the second circuit board 20. The third thermal conductive layer 22a is exposed relative to the top surface 24 of the substrate 21. A top surface (not shown in the figure) of the third thermal conductive layer 22a is flush with the top surface 24 of the substrate 21. It should be understood that, that the third thermal conductive layer 22a is exposed relative to the top surface 24 of the substrate 21 means that the substrate 22 does not completely cover the third thermal conductive layer 22a. In some other embodiments, a top surface of the third thermal conductive layer 22a may protrude relative to the top surface 24 of the substrate 21, or a top surface of the third thermal conductive layer 22a may be recessed relative to the top surface 24 of the substrate 21.

The fourth thermal conductive layer 22b is located on a side that is of the second circuit board 20 and that is away from the first circuit board 10. Specifically, the fourth thermal conductive layer 22b is located on the bottom side of the third thermal conductive layer 22a, is parallel to and spaced from the third thermal conductive layer 22a, and is located between the bottom surface 25 and the top surface 24 of the substrate 21. In this embodiment, both the third thermal conductive layer 22a and the fourth thermal conductive layer 22b are ground planes. The third thermal conductive layer 22a and the fourth thermal conductive layer 22b may be made of a metal material like copper, silver, aluminum, magnesium, or tin, to ensure that the third thermal conductive layer 22a and the fourth thermal conductive layer 22b have high thermal conductivity.

The second thermal conductive structure 23 is connected between the third thermal conductive layer 22a and the fourth thermal conductive layer 22b, to implement heat transfer and an electrical connection between the third thermal conductive layer 22a and the fourth thermal conductive layer 22b. The second thermal conductive structure 23 includes a plurality of thermal conductive parts, and the plurality of thermal conductive parts are spaced from each other, to increase a heat transfer path between the third thermal conductive layer 22a and the fourth thermal conductive layer 22b, and increase a heat transfer speed between the third thermal conductive layer 22a and the fourth thermal conductive layer 22b.

In some embodiments, the substrate 21 is provided with a communication hole (not shown in the figure) that connects the third thermal conductive layer 22a and the fourth thermal conductive layer 22b. The communication hole is a through hole or a buried hole. The thermal conductive part of the second thermal conductive structure 23 is located in the communication hole, to connect the third thermal conductive layer 22a and the fourth thermal conductive layer 22b. The thermal conductive part of the second thermal conductive structure 23 may be made of a metal material like copper, silver, aluminum, magnesium, or tin, to ensure that the second thermal conductive structure 23 has high thermal conductivity, and improve heat transfer efficiency between the third thermal conductive layer 22a and the fourth thermal conductive layer 22b. In this case, the thermal conductive part of the second thermal conductive structure 23 may be a metal post formed by filling the communication hole with the metal material, or the thermal conductive part of the second thermal conductive structure 23 may be a metal layer formed by partially covering or completely covering a hole wall of the communication hole with the metal material.

In some other embodiments, the second circuit board 20 may alternatively include three or more thermal conductive layers 22 and the second thermal conductive structure 23, where the second thermal conductive structure 23 includes a plurality of thermal conductive parts, and each thermal conductive part of the second thermal conductive structure 23 is connected between two thermal conductive layers 22, to implement heat transfer and electrical communication between the plurality of thermal conductive layers 22, and ensure uniform diffusion of heat inside the second circuit board 20.

In addition, the heat dissipation apparatus 160 further includes a support post 50, where the support post 50 is connected between the first circuit board 10 and the second circuit board 20, to form an air layer 161 between the first circuit board 10 and the second circuit board 20, so that electronic components are mounted on surfaces that are of the first circuit board 10 and the second circuit board 20 and that are opposite to each other. This not only increases function diversity of the heat dissipation apparatus 160, but also improves integration of the heat dissipation apparatus 160. The support post 50 may be made of a high-strength material like metal or high-strength plastic, to ensure structural stability of the heat dissipation apparatus 160.

For example, the heat dissipation apparatus 160 further includes a plurality of first components 60, and the plurality of first components 60 are all located in the accommodating space 151. Some of the first components 60 are mounted on the first circuit board 10 and electrically connected to the first circuit board 10, and some of the first components 60 are mounted on the second circuit board 20 and electrically connected to the second circuit board 20. The first component 60 may include one or more of functional components such as an antenna module, a front-end module, a modem, a signal transceiver, a memory, a flash memory, a connector, a functional sensor, a resistor, a capacitor, an inductor, or a crystal oscillator.

In this embodiment, there are two support posts 50, and the two support posts 50 are spaced from each other, to ensure structural stability of the heat dissipation apparatus 160. Specifically, the support post 50 is connected between the substrate 11 of the first circuit board 10 and the substrate 21 of the second circuit board 20. For example, the support post 50 may be connected to the substrate 11 of the first circuit board 10 and the substrate 21 of the second circuit board 20 through bonding. In this case, the heat dissipation apparatus 160 includes two bonding layers 51, one bonding layer 51 is connected between the bottom surface 15 of the substrate 11 of the first circuit board 10 and the top surface 14 of the support post 50, and the other bonding layer 51 is connected between the bottom surface 15 of the support post 50 and the top surface 14 of the substrate 21 of the second circuit board 20. In other words, the support post 50 is respectively connected to the first circuit board 10 and the second circuit board 20 at intervals through the two bonding layers 51. A height of the support post 50 is H. It should be understood that, the height refers to a size in a Z-axis direction, and the related description in the following description may be understood in the same way.

The main heat generation component 30 is mounted on a side that is of the second circuit board 20 and that is away from the first circuit board 10, that is, the main heat generation component 30 is mounted on a bottom side of the second circuit board 20. The main heat generation component 30 is electrically connected to the second circuit board 20. For example, the main heat generation component 30 is mounted on the second circuit board 20 in a form of flip-chip package. In some other embodiments, the main heat generation component 30 may alternatively be mounted on a side that is of the second circuit board 20 and that faces the first circuit board 10, that is, the main heat generation component 30 may alternatively be mounted on a top side of the second circuit board 20.

The main heat generation component 30 may be a high heat generation component like a multimedia application processor (MAP), a system on chip (SOC), a central processing unit (CPU), a power management unit (PMU) or a radio frequency power amplifier (PA). The main heat generation component 30 includes a heat dissipation pin 31, and the heat dissipation pin 31 is connected to the thermal conductive layer 22 of the second circuit board 20. Specifically, the heat dissipation pin 31 is connected to the fourth thermal conductive layer 22b, to implement heat transfer and electrical communication between the main heat generation component 30 and the second circuit board 20. That is, the main heat generation component 30 may not only transfer, by using the heat dissipation pin 31, heat generated during operation to the second circuit board 20, but also implement electrical communication with the second circuit board 20 by using the heat dissipation pin 31. In this case, the heat dissipation pin 31 has both heat dissipation and grounding functions, that is, the heat dissipation pin 31 may be used as a grounding pin of the main heat generation component 30.

The heat dissipation pin 31 is electrically connected to the fourth thermal conductive layer 22b through soldering. In this case, the heat dissipation apparatus 160 includes a solder layer 32, and the solder layer 32 is connected between the heat dissipation pin 31 and the fourth thermal conductive layer 22b. That is, the heat dissipation pin 31 is indirectly connected to the fourth thermal conductive layer 22b by using the solder layer 32. In some other embodiments, the heat dissipation pin 31 may alternatively be connected to the third thermal conductive layer 22a, or the heat dissipation pin 31 may alternatively be connected to the second thermal conductive structure 23.

In this embodiment, an orthographic projection of the main heat generation component 30 on the first circuit board 10 is located in the first circuit board 10. That is, in the thickness direction (that is, the Z-axis direction in the figure) of the first circuit board 10, the main heat generation component 30 overlaps the first circuit board 10. That is, an orthographic projection of the main heat generation component 30 on the bottom surface 15 (that is, the bottom surface of the first circuit board 10) of the substrate 11 is located on the bottom surface 15 of the substrate 11. In addition, in the Z-axis direction, the main heat generation component 30 and the second thermal conductive structure 23 are completely staggered. In this case, an orthographic projection of the main heat generation component 30 and an orthographic projection of the first thermal conductive structure 13 on the fourth thermal conductive layer 22b are completely staggered, that is, the orthographic projection of the main heat generation component 30 and the orthographic projection of the first thermal conductive structure 13 on the fourth thermal conductive layer 22b do not overlap at all.

Specifically, the main heat generation component 30 and the first thermal conductive structure 13 are respectively connected to two ends of the fourth thermal conductive layer 22b. Heat generated when the main heat generation component 30 works is sequentially transferred to one end of the fourth thermal conductive layer 22b by using the heat dissipation pin 31, transferred to the other end of the fourth thermal conductive layer 22b, and transferred to the third thermal conductive layer 22a by using the second thermal conductive structure 23. This helps implement uniform diffusion of heat generated by the main heat generation component 30 on the second circuit board 20, and improves heat dissipation efficiency of the main heat generation component 30.

In addition, the heat dissipation apparatus 160 may further include a plurality of second components 70, where the plurality of second components 70 are mounted on the bottom side of the second circuit board 20 in a mutually spaced manner, and are electrically connected to the second circuit board 20, to increase function diversity of the heat dissipation apparatus 160 and improve integration of the heat dissipation apparatus 160. The second component 70 may include one or more of functional components such as an antenna module, a front-end module, a modem, a signal transceiver, a memory, a flash memory, a connector, a functional sensor, a resistor, a capacitor, an inductor, or a crystal oscillator.

The thermal conductive assembly 40 is connected between the thermal conductive layer 12 of the first circuit board 10 and the thermal conductive layer 22 of the second circuit board 20, to implement heat transfer between the first circuit board 10 and the second circuit board 20. The thermal conductive assembly 40 is located in the air layer 161, and is connected between the second thermal conductive layer 12b and the third thermal conductive layer 22a. In this embodiment, in the Z-axis direction, the thermal conductive assembly 40 at least partially overlaps the first thermal conductive structure 13 and the second thermal conductive structure 23. In this case, an orthographic projection of the thermal conductive assembly 40 and an orthographic projection of the first thermal conductive structure 13 on the second thermal conductive layer 12b are at least partially overlapped, and the orthographic projection of the thermal conductive assembly 40 and an orthographic projection of the second thermal conductive structure 23 on the third thermal conductive layer 22a are at least partially overlapped. This helps shorten a heat dissipation path in which heat generated when the main heat generation component 30 works is transferred from the fourth thermal conductive layer 22b to the thermal conductive assembly 40, and then transferred from the thermal conductive assembly 40 to the first thermal conductive layer 12a of the second circuit board 10, and improves heat dissipation efficiency of the main heat generation component 30.

In addition, the thermal conductive assembly 40 is further electrically connected between the thermal conductive layer 12 of the first circuit board 10 and the thermal conductive layer 22 of the second circuit board 20, to implement an electrical connection between the thermal conductive layer 12 of the first circuit board 10 and the thermal conductive layer 22 of the second circuit board 20. In this way, electrical communication between the first circuit board 10 and the second circuit board 20 is implemented. In this embodiment, the thermal conductive assembly 40 includes two thermal conductive blocks 41 and a thermal interface material (TIM) layer 42. The thermal interface material layer 42 is connected between the two thermal conductive blocks 41. One thermal conductive block 41 is connected to the thermal conductive layer 12 of the first circuit board 10, and the other thermal conductive block 41 is connected to the thermal conductive layer 22 of the second circuit board 20. That is, the two thermal conductive blocks 41 are respectively connected to the thermal conductive layer 12 of the first circuit board 10 and the thermal conductive layer 22 of the second circuit board 20. For example, the thermal conductive block 41 is made of a metal material like copper, silver, aluminum, magnesium, or tin.

Specifically, the two thermal conductive blocks 41 are respectively a first thermal conductive block 41a and a second thermal conductive block 41b, and the second thermal conductive block 41b is located on a bottom side of the first thermal conductive block 41a. The first thermal conductive block 41a is connected to the second thermal conductive layer 12b, and is electrically connected to the second thermal conductive layer 12b. The second thermal conductive block 41b is connected to the third thermal conductive layer 22a, and is electrically connected to the third thermal conductive layer 22a. A height of the first thermal conductive block 41a is H1, and a height of the second thermal conductive block 41b is H2. In this case, H/2<H1+H2<H. In some other embodiments, the first thermal conductive block 41a may alternatively be connected to the first thermal conductive layer 12a, and the second thermal conductive block 41b may alternatively be connected to the fourth thermal conductive layer 22b.

The thermal interface material layer 42 is connected between the first thermal conductive block 41a and the second thermal conductive block 41b. A thermal interface material may be added between the first thermal conductive block 41a and the second thermal conductive block 41b through mounting, dispensing, coating or the like, to form the thermal interface material layer 42. In this case, the first thermal conductive block 41a and the second thermal conductive block 41b are indirectly connected by using the thermal interface material layer 42, to implement heat transfer and an electrical connection. The thermal interface material is located between the first thermal conductive block 41a and the second thermal conductive block 41b, and may fill an air gap and tolerance redundancy between the first thermal conductive block 41a and the second thermal conductive block 41b, to reduce interface thermal resistance between the first thermal conductive block 41a and the second thermal conductive block 41b, and improve heat transfer efficiency. The thermal interface material layer 42 may be a material like a thermal conductive gasket or thermal conductive silicone that includes metal particles or carbon-based high thermal conductive particles.

In addition, the heat dissipation apparatus 160 further includes two connection layers 80. One connection layer 80 is connected between the thermal conductive layer 12 of the first circuit board 10 and the thermal conductive assembly 40, to implement heat transfer and electrical communication between the first circuit board 10 and the thermal conductive assembly 40. The other connection layer 80 is connected between the thermal conductive layer 22 of the second circuit board 20 and the thermal conductive assembly 40, to implement heat transfer and electrical communication between the second circuit board 20 and the thermal conductive assembly 40. In other words, the thermal conductive assembly 40 respectively implements an indirect connection to the thermal conductive layer 12 of the first circuit board 10 and the thermal conductive layer 22 of the second circuit board 20 by using the two connection layers 80.

In some other embodiments, the heat dissipation apparatus 160 may include only one connection layer 80, and the connection layer 80 is connected between the thermal conductive layer 12 of the first circuit board 10 and the thermal conductive assembly 40, that is, the thermal conductive assembly 40 is indirectly connected to the thermal conductive layer 12 of the first circuit board 10 by using the connection layer 80, and is directly connected to the thermal conductive layer 22 of the second circuit board 20. Alternatively, the connection layer 80 is connected between the thermal conductive layer 22 of the second circuit board 20 and the thermal conductive assembly 40, that is, the thermal conductive assembly 40 is indirectly connected to the thermal conductive layer 22 of the second circuit board 20 by using the connection layer 80, and is directly connected to the thermal conductive layer 12 of the first circuit board 10.

Specifically, the two connection layers 80 are respectively a first connection layer 80a and a second connection layer 80b, the first connection layer 80a is connected between the thermal conductive layer 12 of the first circuit board 10 and the thermal conductive assembly 40, and the second connection layer 80b is connected between the thermal conductive layer 22 of the second circuit board 20 and the thermal conductive assembly 40. Specifically, the first connection layer 80a is connected between the second thermal conductive layer 12b and the first thermal conductive block 41a, and the second connection layer 80b is connected between the third thermal conductive layer 22a and the second thermal conductive block 41b.

In an implementation, the connection layer 80 is made of solder. That is, the connection layer 80 is a solder layer. Specifically, the first thermal conductive block 41a is soldered to the second thermal conductive layer 12b through soldering, and is electrically connected to the second thermal conductive layer 12b. The second thermal conductive block 41b is soldered to the third thermal conductive layer 22a through soldering, and is electrically connected to the third thermal conductive layer 22a. In this case, heat transfer and electrical communication may be implemented between the first circuit board 10 and the second circuit board 20 by using the two connection layers 80 and the thermal conductive assembly 40.

In another implementation, the connection layer 80 is made of a thermal interface material. That is, the connection layer 80 is a thermal interface material layer. For example, the thermal interface material may be added between the first thermal conductive block 41a and the second thermal conductive layer 12b through mounting, dispensing, coating or the like, to form the first connection layer 80a. In this case, the first thermal conductive block 41a is indirectly connected to the second thermal conductive layer 12b by using the thermal interface material, to implement heat transfer and an electrical connection to the second thermal conductive layer 12b. The thermal interface material is located between the first thermal conductive block 41a and the second thermal conductive layer 12b, and may fill an air gap and tolerance redundancy between the first thermal conductive block 41a and the second thermal conductive layer 12b, to reduce interface thermal resistance between the first thermal conductive block 41a and the second thermal conductive layer 12b, and improve heat transfer efficiency between the first thermal conductive block 41a and the second thermal conductive layer 12b.

The thermal interface material may be added between the second thermal conductive block 41b and the third thermal conductive layer 22a through mounting, dispensing, coating or the like, to form the second connection layer 80b. In this case, the second thermal conductive block 41b is indirectly connected to the third thermal conductive layer 22a by using the thermal interface material, to implement heat transfer and an electrical connection to the third thermal conductive layer 22a. The thermal interface material is located between the second thermal conductive block 41b and the third thermal conductive layer 22a, and may fill an air gap and tolerance redundancy between the second thermal conductive block 41b and the third thermal conductive layer 22a, to reduce interface thermal resistance between the second thermal conductive block 41b and the third thermal conductive layer 22a, and improve thermal conductive efficiency between the second thermal conductive block 41b and the third thermal conductive layer 22a.

In a third implementation, the connection layer 80 is made of a thermal conductive adhesive. That is, the connection layer 80 is a thermal conductive adhesive layer. Specifically, the first thermal conductive block 41a is connected to the second thermal conductive layer 12b through bonding, and the second thermal conductive block 41b is connected to the third thermal conductive layer 22a through bonding. In this case, heat transfer may be implemented between the first circuit board 10 and the second circuit board 20 by using two thermal conductive adhesive layers and the thermal conductive assembly 40. In addition, the thermal conductive adhesive layer further has a conductive function, and the first circuit board 10 and the second circuit board 20 may be electrically connected by using two thermal conductive adhesive layers and the thermal conductive assembly 40. The thermal conductive adhesive may be a thermal conductive silver adhesive, and conductive particles in the thermal conductive silver adhesive may be made of a material like sintered silver, a lead-tin alloy, or a gold-tin alloy.

In some other implementations, the two connections layers 80 may alternatively be different. For example, one connection layer 80 is made of solder, and the other connection layer 80 is made of a thermal interface material or a thermal conductive adhesive, or one connection layer 80 is made of a thermal interface material, and the other connection layer 80 is made of a thermal conductive adhesive.

In this embodiment, in the air layer 161 between the first circuit board 10 and the second circuit board 20, there are only the plurality of first components 60, the thermal conductive assembly 40, and the two connection layers 80, and there is no packaging layer covering the first component 60, the thermal conductive assembly 40, and the connection layer 80. That is, the remaining medium is all air, which not only can reduce a costs waste caused by a packaging process, but also can simplify an assembly process of the heat dissipation apparatus 160.

In addition, the electronic device 100 further includes a heat transfer part 170, and the heat transfer part 170 is connected between the heat dissipation apparatus 160 and the middle frame 112. Specifically, the heat transfer part 170 is connected between the first circuit board 10 and the middle plate 115, to form accommodating space 171 between the first circuit board 10 and the middle plate 115, so that an electronic component is mounted on a surface that is of the first circuit board 10 and that faces the middle plate 115 to form a heat dissipation apparatus 160 in a "sandwich" form. This can not only increase function diversity of the heat dissipation apparatus 160, but also improve integration of the heat dissipation apparatus 160. For example, the heat dissipation apparatus 160 may further include a plurality of third components 90, and the plurality of third components 90 are all located in the accommodating space 171. The plurality of third components 90 are mounted on the first circuit board 10 in a mutually spaced manner, and are electrically connected to the first circuit board 10. The third component 90 includes one or more of functional components such as an antenna module, a front-end module, a modem, a signal transceiver, a memory, a flash memory, a connector, a functional sensor, a resistor, a capacitor, an inductor, or a crystal oscillator.

In this embodiment, the heat transfer part 170 is connected between the thermal conductive layer 12 of the first circuit board 10 and the middle plate 115, to implement heat transfer between the heat dissipation apparatus 160 and the middle plate 115. In other words, the heat dissipation apparatus 160 may transfer heat to the middle plate 115 by using the heat transfer part 170, to implement heat dissipation. In this case, the middle frame 112 is made of metal, and may be used as a heat sink of the heat dissipation apparatus 160. In some other embodiments, the middle frame 112 may not be used as a heat sink of the heat dissipation apparatus 160. The electronic device 100 may further include a heat sink specially configured to dissipate heat for the heat dissipation apparatus 160. The heat sink may be a graphite film, a graphene film, a thermal conductive metal film, a heat pipe (HP) heat sink, a vapor chamber (VC) heat sink or a fan.

In the Z-axis direction, the heat transfer part 170 at least partially overlaps the first thermal conductive structure 13. In this case, an orthographic projection of the heat transfer part 170 and an orthographic projection of the first thermal conductive structure 13 on the first thermal conductive layer 12a are at least partially overlapped. This helps shorten a heat dissipation path in which heat generated when the main heat generation component 30 works is transferred from the second thermal conductive layer 12b to the middle frame 112, and improves heat dissipation efficiency of the main heat generation component 30.

In this embodiment, the heat transfer part 170 is a heat transfer block, and the heat transfer block is connected between the second thermal conductive layer 12b and the middle plate 115, to implement heat transfer between the first circuit board 10 and the middle plate 115. The heat transfer block may be made of a metal material like copper, silver, aluminum, magnesium or tin to ensure high thermal conductivity of the heat transfer block. In addition, the heat transfer block is electrically connected between the thermal conductive layer 12 of the first circuit board 10 and the middle plate 115. It should be understood that, the middle frame 112 of the electronic device 100 is configured to ground, and the thermal conductive layer 12 of the first circuit board 10 is electrically connected to the middle plate 115 by using the heat transfer block, to implement grounding of the thermal conductive layer 12 of the first circuit board 10. In this case, because the thermal conductive layer 22 of the second circuit board 20 is electrically connected to the thermal conductive layer 12 of the first circuit board 10, grounding of the thermal conductive layer 22 of the second circuit board 20 is also implemented.

In addition, the electronic device 100 further includes two heat transfer layers 180. One heat transfer layer 180 is connected between the heat transfer part 170 and the middle plate 115, to implement heat transfer between the heat transfer part 170 and the middle plate 115. The other heat transfer layer 180 is connected between the heat transfer part 170 and the thermal conductive layer 12 of the first circuit board 10, to implement heat transfer between the heat transfer part 170 and the first circuit board 10. In other words, the heat transfer part 170 is indirectly connected to the middle plate 115 and the thermal conductive layer 12 of the first circuit board 10 by using the two heat transfer layers 180.

In some other embodiments, the electronic device 100 may include only one heat transfer layer 180, and the heat transfer layer 180 is connected between the heat transfer part 170 and the middle plate 115. In other words, the heat transfer part 170 is indirectly connected to the middle plate 115 by using the heat transfer layer 180, and is directly connected to the thermal conductive layer 12 of the first circuit board 10. Alternatively, the heat transfer layer 180 is connected between the heat transfer part 170 and the thermal conductive layer 12 of the first circuit board 10, that is, the heat transfer part 170 is connected to the thermal conductive layer 12 of the first circuit board 10 at an interval by using the heat transfer layer 180, and is directly connected to the middle plate 115. Alternatively, the electronic device 100 may not include the heat transfer layer 180, and the heat transfer part 170 is directly connected to the middle plate 115 and the thermal conductive layer 12 of the first circuit board 10.

Specifically, the two heat transfer layers 180 are respectively a first heat transfer layer 180 and a second heat transfer layer 180. The first heat transfer layer 180 is connected between the heat transfer part 170 and the middle plate 115, and the second heat transfer layer 180 is connected between the heat transfer part 170 and the thermal conductive layer 12 of the first circuit board 10.

In this embodiment, the first heat transfer layer 180 is made of a thermal interface material. That is, the first heat transfer layer 180 is a thermal interface material layer. Specifically, the thermal interface material may be added between the heat transfer part 170 and the middle plate 115 through mounting, dispensing, coating or the like, to form the first heat transfer layer 180. In this case, heat transfer and an electrical connection are implemented between the heat transfer part 170 and the middle plate 115 by using the thermal interface material. The thermal interface material is located between the heat transfer part 170 and the middle plate 115, and may fill an air gap and tolerance redundancy between the heat transfer part 170 and the middle plate 115, to reduce interface thermal resistance between the heat transfer part 170 and the middle plate 115, and improve heat transfer efficiency between the heat transfer part 170 and the middle plate 115. In some other embodiments, the first heat transfer layer 180 may alternatively be made of solder. In this case, the heat transfer part 170 is connected to the middle plate 115 through soldering. Alternatively, the first heat transfer layer 180 may be made of a thermal conductive adhesive. In this case, the heat transfer part 170 is connected to the middle plate 115 through bonding.

The second heat transfer layer 180 is connected between the heat transfer part 170 and the first thermal conductive layer 12*a*. In this embodiment, the second connection layer 80*b* is made of a thermal conductive adhesive. That is, the second connection layer 80*b* is a thermal conductive adhesive layer. Specifically, the heat transfer part 170 is connected to the first thermal conductive layer 12*a* through bonding. In this case, heat transfer and an electrical connection are implemented between the heat transfer part 170 and the first thermal conductive layer 12*a* by using the thermal conductive adhesive layer. In some other embodiments, the second connection layer 80*b* may alternatively be made of a thermal interface material. In this case, the thermal interface material may be added between the heat transfer part 170 and the first thermal conductive layer 12*a* through mounting, dispensing, coating or the like, to form the second heat transfer layer 180. In this case, the heat transfer part 170 is indirectly connected to the first thermal conductive layer 12*a* by using the thermal interface material, to implement heat transfer and an electrical connection to the first thermal conductive layer 12*a*. Alternatively, the second connection layer 80*b* may be made of solder. In this case, the heat transfer part 170 is connected to the first thermal conductive layer 12*a* through soldering.

In this embodiment, the main heat generation component 30 and the middle plate 115 are spaced from each other by the first circuit board 10 and the second circuit board 20, and heat generated when the main heat generation component 30 works may be sequentially transferred to the fourth thermal conductive layer 22*b* by using the heat dissipation pin 31, transferred to the second thermal conductive block 41*b* by using the second thermal conductive structure 23 and the third thermal conductive layer 22*a*, transferred to the second thermal conductive layer 12*b* by using the thermal interface material layer 42 of the thermal conductive assembly 40 and the first thermal conductive block 41*a*, transferred to the heat transfer part 170 by using the first thermal conductive structure 13 and the first thermal conductive layer 12*a*, and finally transferred to the middle plate 115 by using the heat transfer part 170, so as to implement heat dissipation for the main heat generation component 30.

In this case, the two thermal conductive layers 22 and the second thermal conductive structure 23 of the second circuit board 20, the two thermal conductive blocks 41 and the thermal interface material layer 42 of the thermal conductive assembly 40, the two thermal conductive layers 12 and the first thermal conductive structure 13 of the first circuit board 10, the heat transfer part 170, and the middle plate 115 form a three-dimensional (3D) heat dissipation topology network. The three-dimensional heat dissipation topology network may receive, by using the heat dissipation pin 31, heat generated when the main heat generation component 30 works, to implement heat dissipation for the main heat generation component 30, so that the heat dissipation apparatus 160 has low heat flux density, high heat dissipation efficiency, and good working reliability.

The three-dimensional heat dissipation topology network shown in this embodiment may transfer heat generated when the main heat generation component 30 of the second circuit board 20 that is far away from the middle plate 115 works to the middle plate 115 for effective heat diffusion, thereby implementing heat redistribution inside the electronic device 100. This can not only reduce a junction temperature of the main heat generation component 30, effectively resolve a heat dissipation problem of the main heat generation component 30, and improve working efficiency and a service life of the main heat generation component 30, but also can prevent the main heat generation component 30 from forming a local hot spot on the housing 110 of the electronic device 100, and avoid limiting an application environment of the electronic device 100 by the heat of the main heat generation component 30.

In some other embodiments, the heat dissipation apparatus 160 may further include three or more circuit boards. In this case, the main heat generation component 30 and the middle plate 115 may be spaced from each other by the three or more circuit boards. The three or more circuit boards may also construct a three-dimensional heat dissipation topology network to implement effective heat dissipation of the main heat generation component 30.

Next, for ease of understanding, total heat E generated when the main heat generation component 30 works is used as an example to describe a heat dissipation path of the main heat generation component 30 in the three-dimensional heat dissipation topology network. For the heat dissipation path of the main heat generation component 30, refer to a bold black dashed line with an arrow shown in FIG. 6.

When the main heat generation component 30 works, a part of heat E1 is transferred to an external environment by using a structure of the main heat generation component 30, and the remaining heat E2 is transferred to the fourth thermal conductive layer 22*b* by using the heat dissipation pin 31. The heat E2 is transferred to the second thermal conductive structure 23 by using the fourth thermal conductive layer 22*b*, and then transferred to the third thermal conductive layer 22*a* by using the second thermal conductive structure 23. In this case, a part of heat E3 in the heat E2 is transferred to the external environment by using the second circuit board 20, and the remaining heat E4 is transferred to the thermal conductive assembly 40 by using the third thermal conductive layer 22*a*, and then to the second thermal conductive layer 12*b* by using the thermal conductive assembly 40. The heat E4 is transferred to first thermal conductive structure 13 by using the second thermal conductive layer 12*b*, and then transferred to the first thermal conductive layer 12*a* by using the first thermal conductive structure 13. In this case, a part of heat E5 in the heat E4 is transferred to the external environment by using the first circuit board 10, and the remaining heat E6 is transferred to the heat transfer part 170 by using the first thermal conductive layer 12*a*, and then transferred to the middle plate 115 by using the heat transfer part 170. In this case, the heat E6 is transferred to the external environment by using the middle plate 115.

It may be understood that, on a premise that a loss in a heat transfer process is ignored, E=E1+E2, E2=E3+E4, and E4=E5+E6, that is, E=E1+E3+E5+E6. In other words, heat generated when the main heat generation component 30 works may be transferred to the external environment by using four components: the main heat generation component 30, the second circuit board 20, the first circuit board 10, and the middle plate 115, to implement effective heat dissipation for the main heat generation component 30.

Refer to the following Table 1. The following Table 1 shows temperatures of components that are obtained through testing in finite element simulation in the existing heat dissipation apparatus and the heat dissipation apparatus shown in this embodiment. The three-dimensional heat dissipation topology network shown in this embodiment is not constructed in the existing heat dissipation apparatus.

TABLE 1

Temperatures of components in the existing heat dissipation apparatus and the heat dissipation apparatus shown in this embodiment

| Solution | Main heat generation component | Second circuit board | Thermal conductive assembly | First circuit board | Heat transfer part | Middle plate |
| --- | --- | --- | --- | --- | --- | --- |
| Existing | 69.1° C. | 61.8° C. | / | 47.4° C. | / | 35.4° C. |
| In this embodiment | 51.2° C. | 49.2° C. | 43.6° C. | 42.5° C. | 40.6° C. | 36.3° C. |

It can be learned from Table 1 that in the heat dissipation apparatus 160 of the electronic device 100 shown in this embodiment, temperatures of the main heat generation component 30, the second circuit board 20, and the first circuit board 10 are obviously lower than a temperature of the existing heat dissipation apparatus. Especially, in this embodiment, the temperature of the main heat generation component 30 is reduced from 69.1° C. to 51.2° C., and a junction temperature gain is about 60%. The junction temperature gain=100%−[(temperature of the main heat generation component in this embodiment−temperature of the middle plate in this embodiment)/(temperature of the existing main heat generation component−temperature of the existing middle plate)]. Therefore, the three-dimensional heat dissipation topology network constructed in the heat dissipation apparatus 160 shown in this embodiment effectively reduces the temperature of the main heat generation component 30, and resolves a heat generation problem of the main heat generation component 30.

Figure 7:
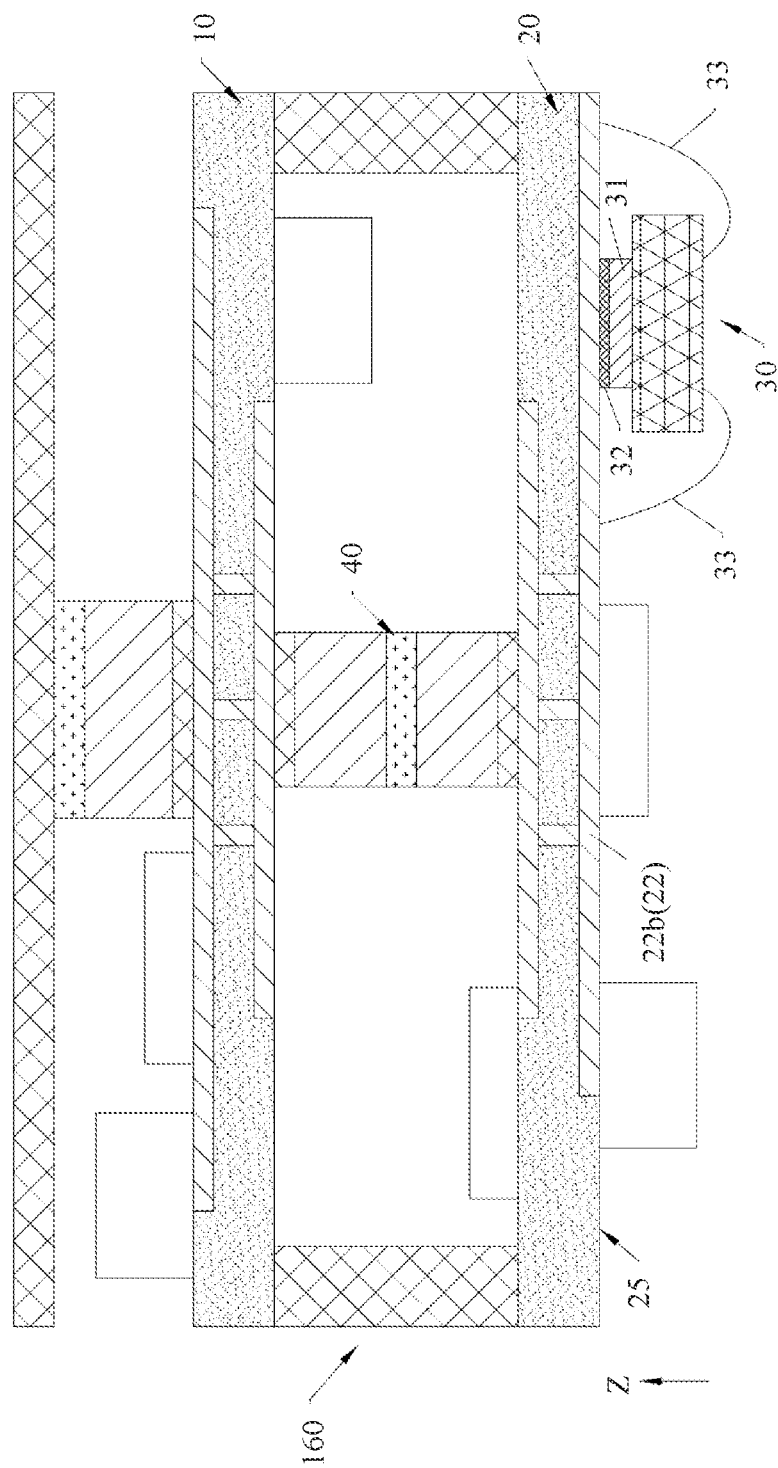
FIG. 7 is a schematic diagram of a partial cross-sectional structure cut from the structure shown in FIG. 5 along I-I according to another embodiment.

FIG. 7 is a schematic diagram of a partial cross-sectional structure cut from the structure shown in FIG. 5 along I-I according to another embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between the components of the electronic device 100 shown in this embodiment is basically the same as a structure between the components of the electronic device 100 shown in the first embodiment, and a difference from the first embodiment lies in that a fourth thermal conductive layer 22b is exposed relative to the bottom surface 25 of the substrate 21. A bottom surface (not shown in the figure) of the fourth thermal conductive layer 22b is flush with the bottom surface 25 of the substrate 21. It should be understood that, that the fourth thermal conductive layer 22b is exposed relative to the bottom surface 21 of the substrate 21 means that the substrate 21 of the second circuit board 20 does not completely cover the fourth thermal conductive layer 22b. In some other embodiments, the bottom surface of the fourth thermal conductive layer 22b protrudes relative to the bottom surface 25 of the substrate 21, or the bottom surface of the fourth thermal conductive layer 22b is recessed relative to the bottom surface 25 of the substrate 21.

The main heat generation component 30 includes a heat dissipation pin 31 and a conducting wire 33. The heat dissipation pin 31 is a heat dissipation layer. The heat dissipation pin 31 is connected to the fourth thermal conductive layer 22b, that is, the main heat generation component 30 is connected to the fourth thermal conductive layer 22b by using the heat dissipation pin 31, to implement heat transfer between the main heat generation component 30 and the fourth thermal conductive layer 22b. For example, the heat dissipation pin 31 is connected to the fourth thermal conductive layer 22b in a die attach (or die bond) manner. In this case, the heat dissipation pin 31 is indirectly connected to the fourth thermal conductive layer 22b by using a solder layer 32.

The conducting wire 33 is electrically connected to the fourth thermal conductive layer 22b, that is, the main heat generation component 30 is electrically connected to the fourth thermal conductive layer 22b by using the conducting wire 33, to implement an electrical connection between the main heat generation component 30 and the fourth thermal conductive layer 22b, and further implement electrical communication between the main heat generation component 30 and the second circuit board 20. For example, the conducting wire 33 is electrically connected to the fourth thermal conductive layer 22b in a wire bonding (WB) manner. There may be two or more conducting wires 33.

Figure 8:
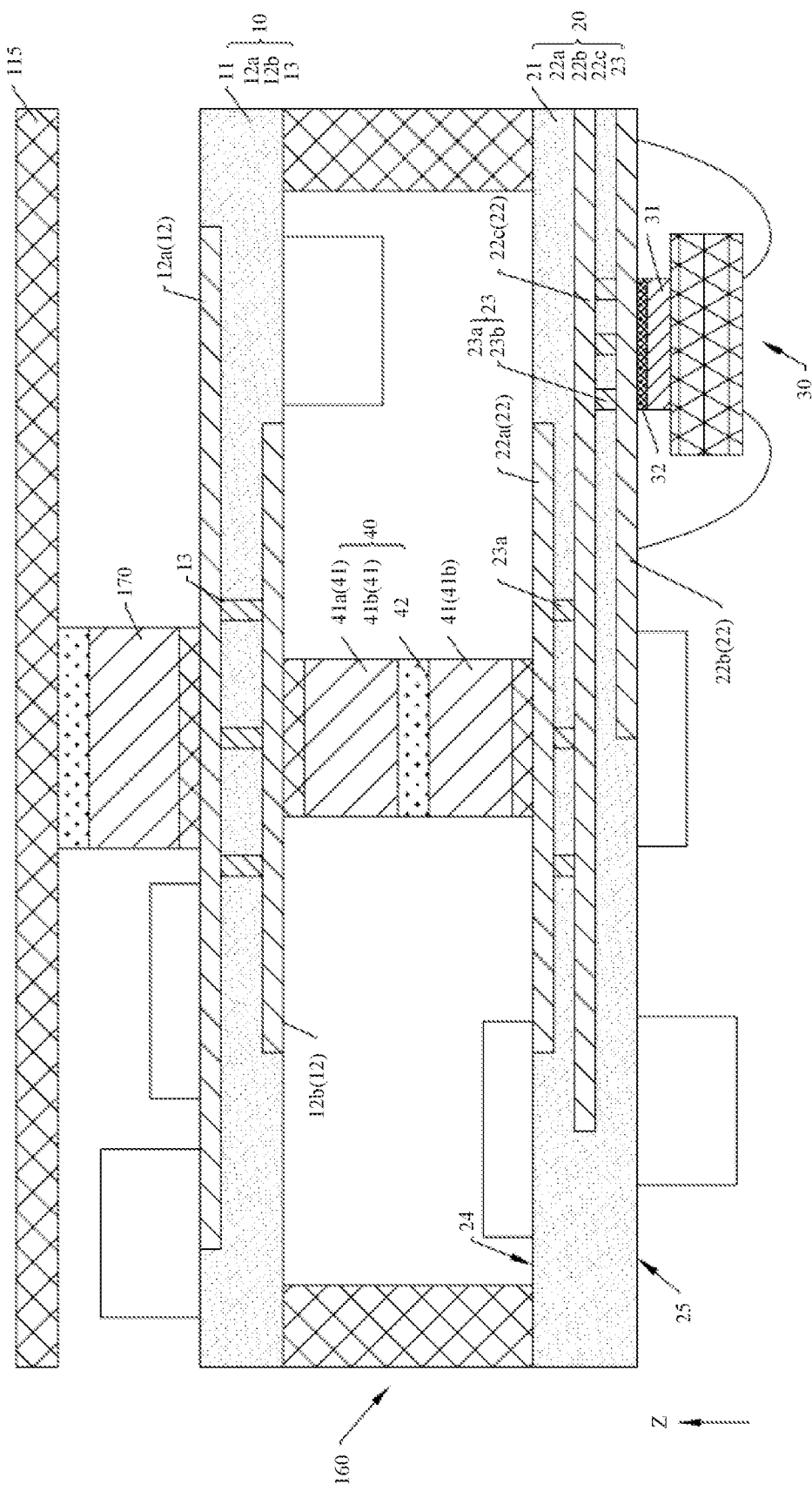
FIG. 8 is a schematic diagram of a partial cross-sectional structure cut from the structure shown in FIG. 5 along I-I according to a third embodiment.

FIG. 8 is a schematic diagram of a partial cross-sectional structure cut from the structure shown in FIG. 5 along I-I according to a third embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the second embodiment. A difference from the second embodiment lies in that the second circuit board 20 includes a substrate 21, three thermal conductive layers 22, and a second thermal conductive structure 23. Both the three thermal conductive layers 22 and the second thermal conductive structure 23 are embedded into the substrate 21. The three thermal conductive layers 22 are disposed in a mutually spaced manner. The second thermal conductive structure 23 includes a plurality of thermal conductive parts, and each thermal conductive part of the second thermal conductive structure 23 is connected between the two thermal conductive layers 22.

Specifically, the three thermal conductive layers 22 are respectively a third thermal conductive layer 22a, a fourth thermal conductive layer 22b, and a fifth thermal conductive layer 22c. The third thermal conductive layer 22a is exposed relative to a top surface 24 of the substrate 21. The fourth thermal conductive layer 22b is located on a bottom side of the third thermal conductive layer 22a, is parallel to and spaced from the third thermal conductive layer 22a, and is exposed relative to a bottom surface 25 of the substrate 21. The fifth thermal conductive layer 22c is located between the third thermal conductive layer 22a and the fourth thermal conductive layer 22b, and is parallel to and spaced from the third thermal conductive layer 22a and the fourth thermal conductive layer 22b. For example, the third thermal conductive layer 22a, the fourth thermal conductive layer 22b, and the fifth thermal conductive layer 22c are all ground planes. The third thermal conductive layer 22a, the fourth thermal conductive layer 22b, and the fifth thermal conductive layer 22c may be made of a metal material like copper, silver, aluminum, magnesium, or tin, to ensure that the third thermal conductive layer 22a, the fourth thermal conductive layer 22b, and the fifth thermal conductive layer 22c have high thermal conductivity.

Some of the thermal conductive parts of the second thermal conductive structure 23 are connected between the third thermal conductive layer 22a and the fourth thermal conductive layer 22b, and some of the thermal conductive parts of the second thermal conductive structure 23 are connected between the fourth thermal conductive layer 22b and the fifth thermal conductive layer 22c, to implement heat transfer and an electrical connection between the third thermal conductive layer 22a, the fourth thermal conductive layer 22b, and the fifth thermal conductive layer 22c. Specifically, the plurality of thermal conductive parts of the second thermal conductive structure 23 are respectively a first thermal conductive part 23a and a second thermal conductive part 23b. The first thermal conductive part 23a is connected between the third thermal conductive layer 22a and the fifth thermal conductive layer 22c. The second thermal conductive part 23b is connected between the fourth thermal conductive layer 22b and the fifth thermal conductive layer 22c. In this embodiment, there are a plurality of first thermal conductive parts 23a and second thermal conductive parts 23b. The plurality of first thermal conductive parts 23a are arranged in a mutually spaced manner, to increase a heat transfer path between the third thermal conductive layer 22a and the fifth thermal conductive layer 22c, and increase a heat transfer speed between the third thermal conductive layer 22a and the fifth thermal conductive layer 22c. The plurality of second thermal conductive parts 23b are arranged in a mutually spaced manner, to increase a heat transfer path between the fourth thermal conductive layer 22b and the fifth thermal conductive layer 22c, and increase a heat transfer speed between the fourth thermal conductive layer 22b and the fifth thermal conductive layer 22c. In some other embodiments, some of the thermal conductive parts of the second thermal conductive structure 23 may be connected between the third thermal conductive layer 22a and the fourth thermal conductive layer 22b, to shorten a heat transfer path between the third thermal conductive layer 22a and the fourth thermal conductive layer 22b, and improve heat transfer efficiency between the third thermal conductive layer 22a and the fourth thermal conductive layer 22b.

In this embodiment, heat generated when the main heat generation component 30 works may be sequentially transferred to the fourth thermal conductive layer 22b by using a heat dissipation pin 31, transferred to the fifth thermal conductive layer 22c by using the second thermal conductive part 23b, transferred to the second thermal conductive block 41b by using the first thermal conductive part 23a and the third thermal conductive layer 22a, transferred to the second thermal conductive layer 12b by using the thermal interface material layer 42 and the first thermal conductive block 41a of the thermal conductive assembly 40, transferred to the heat transfer part 170 by using the first thermal conductive structure 13 and the first thermal conductive layer 12a, and finally transferred to the middle plate 115 by using the heat transfer part 170, to implement heat dissipation for the main heat generation component 30.

In this case, the three thermal conductive layers 22 and the second thermal conductive structure 23 of the second circuit board 20, the two thermal conductive blocks 41 and the thermal interface material layer 42 of the thermal conductive assembly 40, the two thermal conductive layers 12 and the second thermal conductive structure 13 of the first circuit board 10, the heat transfer part 170, and the middle plate 115 form a three-dimensional heat dissipation topology network. The heat generated when the main heat generation component 30 works may be transferred to the three-dimensional heat dissipation topology network by using the heat dissipation pin 31, and the three-dimensional heat dissipation topology network may evenly disperse the heat inside the electronic device 100. This can not only reduce a junction temperature of the main heat generation component 30, effectively resolve a heat dissipation problem of the main heat generation component 30, and improve working efficiency and a service life of the main heat generation component 30, but also can prevent the main heat generation component 30 from forming a local hot spot on the housing 110 of the electronic device 100, and avoid limiting application of the electronic device 100 by the heat of the main heat generation component 30.

Figure 9:
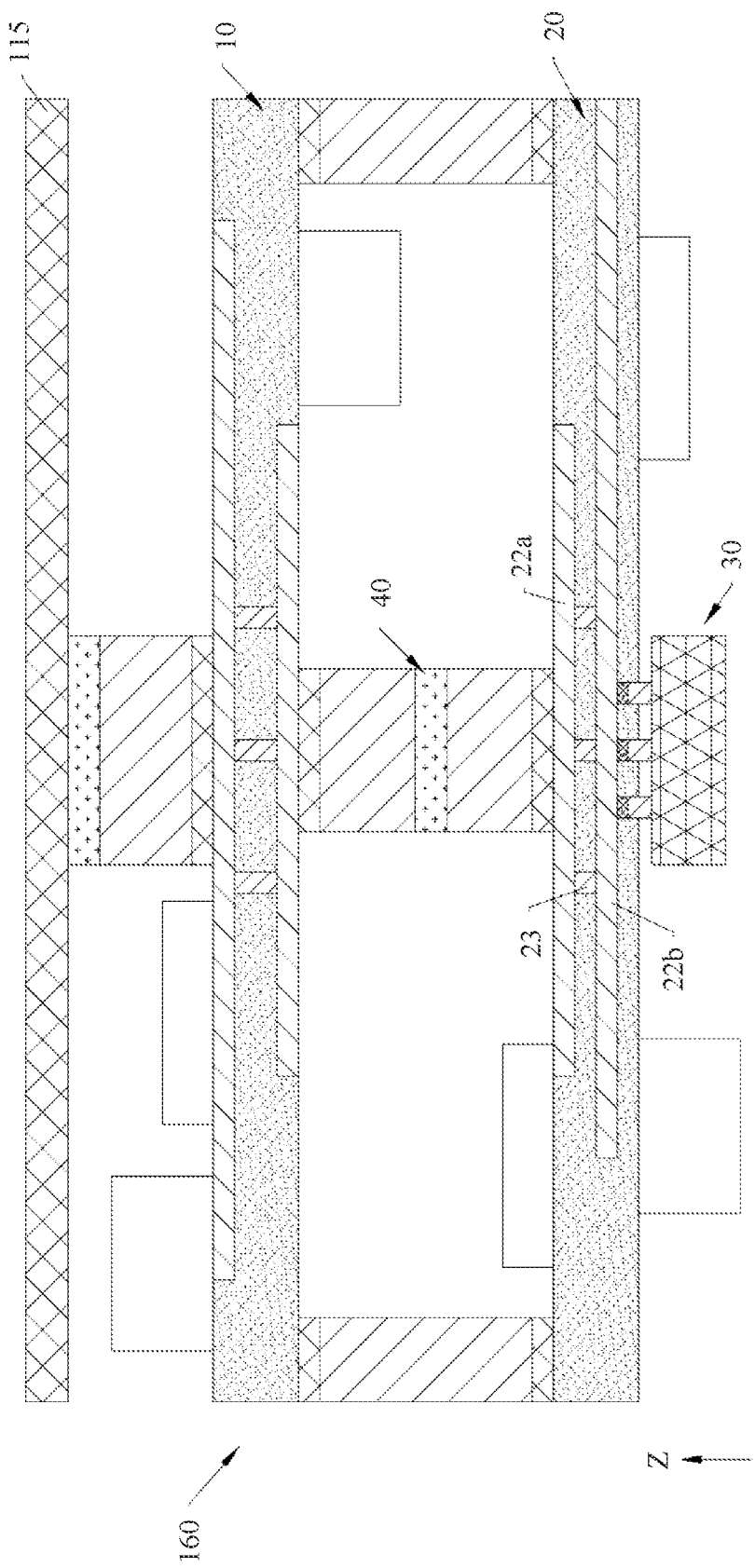
FIG. 9 is a schematic diagram of a partial cross-sectional structure cut from the structure shown in FIG. 5 along I-I according to a fourth embodiment.

FIG. 9 is a schematic diagram of a partial cross-sectional structure cut from the structure shown in FIG. 5 along I-I according to a fourth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment. A difference from the first embodiment lies in that, in the Z-axis direction, the main heat generation component 30 and the second thermal conductive structure 23 are at least partially overlapped. In this case, an orthographic projection of the main heat generation component 30 and an orthographic projection of the second thermal conductive structure 23 on the fourth thermal conductive layer 22b are at least partially overlapped. This helps shorten a heat dissipation path in which heat generated when the main heat generation component 30 works is transferred from a heat dissipation pin 31 of the main heat generation component 30 to the third thermal conductive layer 22a, and a heat dissipation path in which the heat generated when the main heat generation component 30 works is transferred to the middle plate 115, and improves heat dissipation efficiency of the main heat generation component 30.

Figure 10:
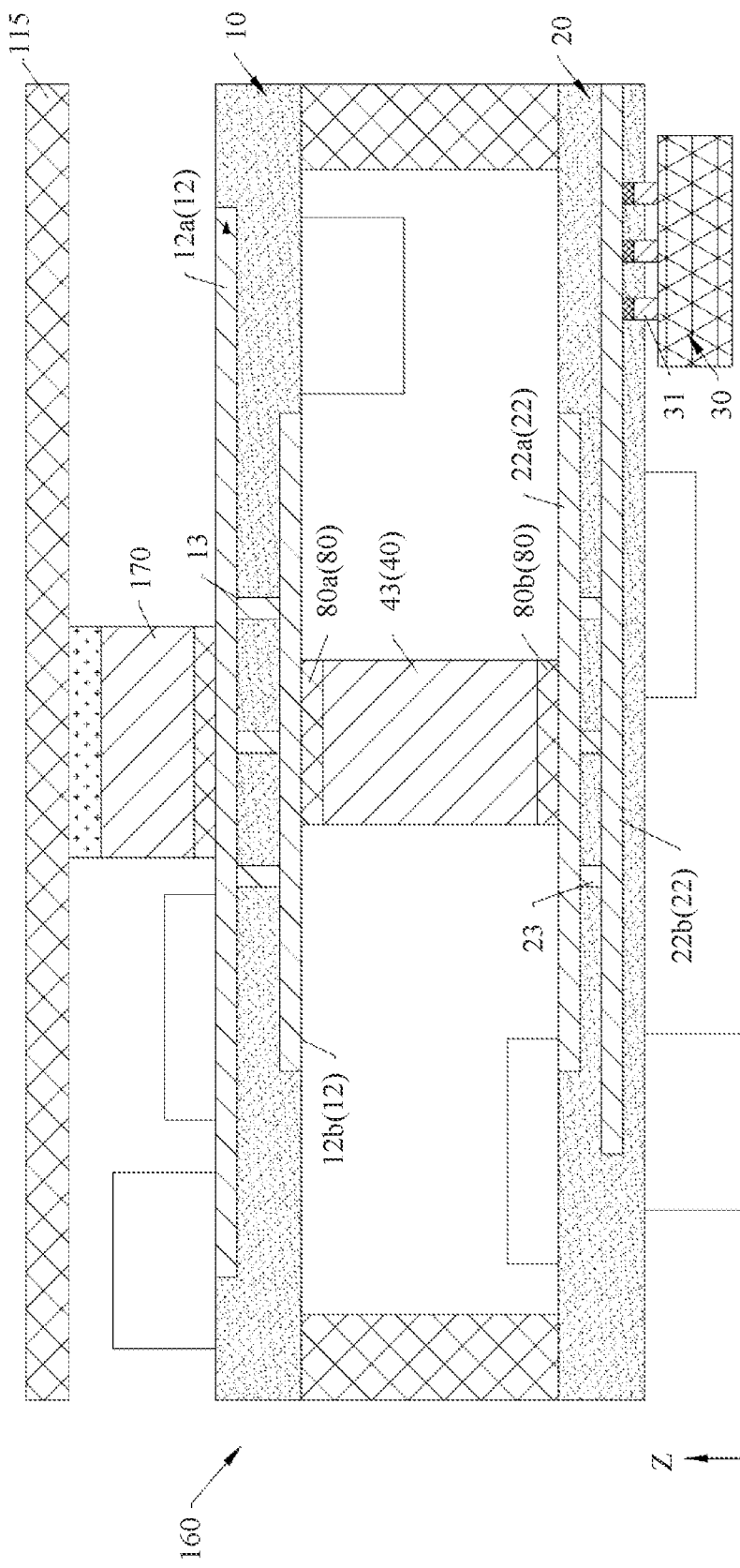
FIG. 10 is a schematic diagram of a partial cross-sectional structure cut from the structure shown in FIG. 5 along I-I according to a fifth embodiment.

FIG. 10 is a schematic diagram of a partial cross-sectional structure cut from the structure shown in FIG. 5 along I-I according to a fifth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment. A difference from the first embodiment lies in that the thermal conductive assembly 40 includes a thermal conductive post 43, and there is one thermal conductive post 43. The thermal conductive post 43 is connected between the thermal conductive layer 12 of the first circuit board 10 and the thermal conductive layer 22 of the second circuit board 20, to implement heat transfer and an electrical connection between the first circuit board 10 and the second circuit board 20. The thermal conductive post 43 may be made of a metal material like copper, silver, aluminum, magnesium, or tin, to ensure high thermal conductivity of the thermal conductive post 43.

Specifically, the thermal conductive post 43 is connected between the second thermal conductive layer 12*b* and the third thermal conductive layer 22*a*. The thermal conductive post 43 is indirectly connected to the second thermal conductive layer 12*b* by using the first connection layer 80*a*, and is indirectly connected to the third thermal conductive layer 22*a* by using the second connection layer 80*b*.

In this embodiment, heat generated when the main heat generation component 30 works may be sequentially transferred to the fourth thermal conductive layer 22*b* by using a heat dissipation pin 31, transferred to the thermal conductive post 43 of the thermal conductive assembly 40 by using the second thermal conductive structure 23 and the third thermal conductive layer 22*a*, transferred to the second thermal conductive layer 12*b* by using the thermal conductive post 43 of the thermal conductive assembly 40, transferred to the heat transfer part 170 by using the first thermal conductive structure 13 and the first thermal conductive layer 12*a*, and finally transferred to the middle plate 115 by using the heat transfer part 170, to implement heat dissipation for the main heat generation component 30.

In this case, the two thermal conductive layers 22 and the second thermal conductive structure 23 of the second circuit board 20, the thermal conductive post 43 of the thermal conductive assembly 40, the two thermal conductive layers 12 and the first thermal conductive structure 13 of the first circuit board 10, the heat transfer part 170, and the middle plate 115 form a three-dimensional heat dissipation topology network. Heat generated when the main heat generation component 30 works may be transferred to the three-dimensional heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting an application environment of the electronic device 100 by the heat of the main heat generation component 30.

Figure 11:
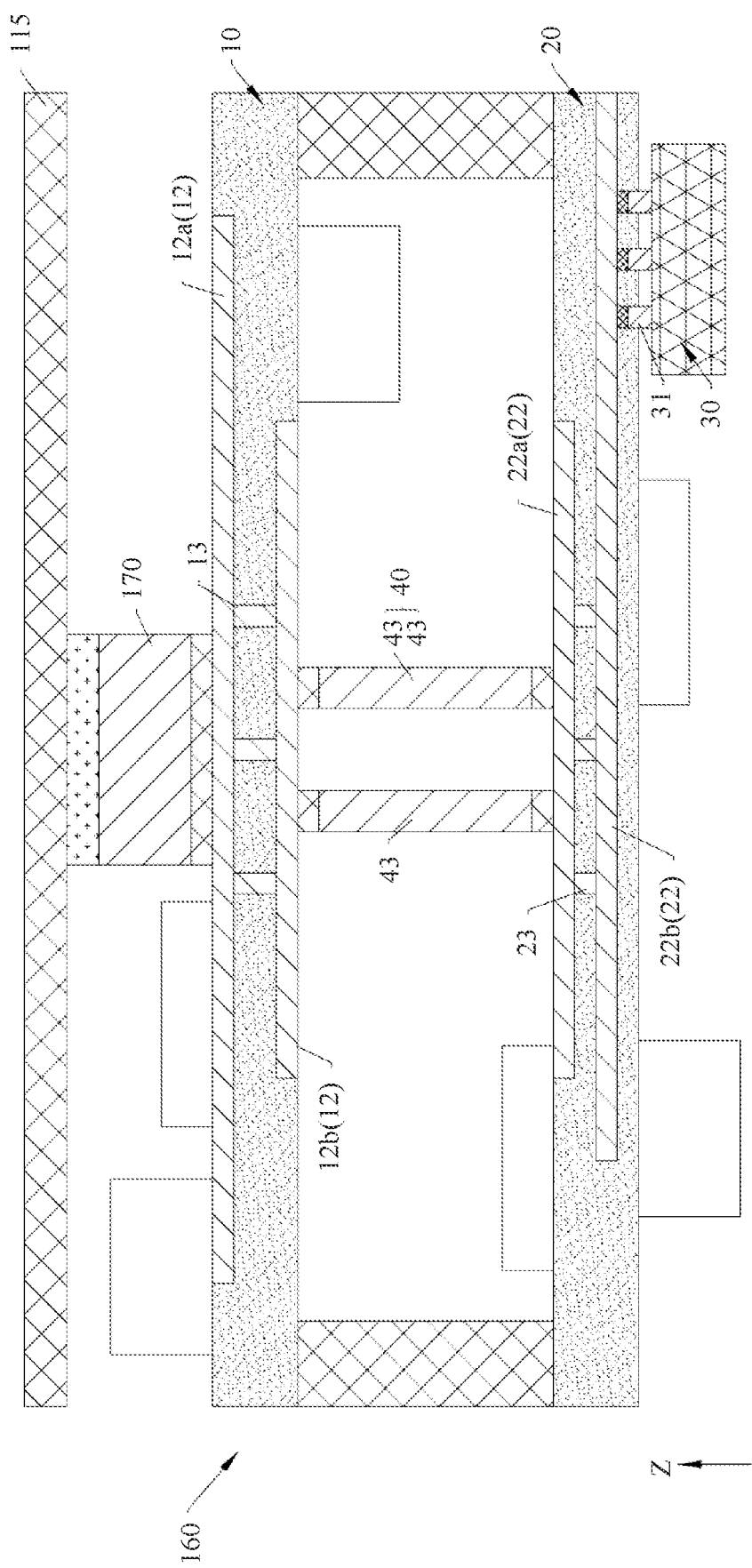
FIG. 11 is a schematic diagram of a partial cross-sectional structure cut from the structure shown in FIG. 5 along I-I according to a sixth embodiment.

FIG. 11 is a schematic diagram of a partial cross-sectional structure cut from the structure shown in FIG. 5 along I-I according to a sixth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the fifth embodiment. A difference from the fifth embodiment lies in that there are two thermal conductive posts 43, and the two thermal conductive posts 43 are disposed in a mutually spaced manner. Each thermal conductive post 43 is connected between the second thermal conductive layer 12*b* and the third thermal conductive layer 22*a*, to increase a heat transfer path between the first circuit board 10 and the second thermal conductive layer 12*b* and the third thermal conductive layer 22*a*, and improve heat transfer efficiency between the first circuit board 10 and the second thermal conductive layer 12*b* and the third thermal conductive layer 22*a*. For example, the thermal conductive post 43 is connected to the second thermal conductive layer 12*b* and the third thermal conductive layer 22*a* by using a surface mounting technology (SMT), to implement heat transfer and electrical communication with the second thermal conductive layer 12*b* and the third thermal conductive layer 22*a*.

In this embodiment, heat generated when the main heat generation component 30 works may be sequentially transferred to the fourth thermal conductive layer 22*b* by using a heat dissipation pin 31, transferred to the two thermal conductive posts 43 of the thermal conductive assembly 40 by using the second thermal conductive structure 23 and the third thermal conductive layer 22*a*, transferred to the second thermal conductive layer 12*b* by using the two thermal conductive posts 43 of the thermal conductive assembly 40, transferred to the heat transfer part 170 by using the first thermal conductive structure 13 and the first thermal conductive layer 12*a*, and finally transferred to the middle plate 115 by using the heat transfer part 170, to implement heat dissipation for the main heat generation component 30.

In this case, the two thermal conductive layers 22 and the second thermal conductive structure 23 of the second circuit board 20, the two thermal conductive posts 43 of the thermal conductive assembly 40, the two thermal conductive layers 12 and the first thermal conductive structure 13 of the first circuit board 10, the heat transfer part 170, and the middle plate 115 form a three-dimensional heat dissipation topology network. Heat generated when the main heat generation component 30 works may be transferred to the three-dimensional heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting an application scenario of the electronic device 100 by the heat of the main heat generation component 30.

Figure 12:
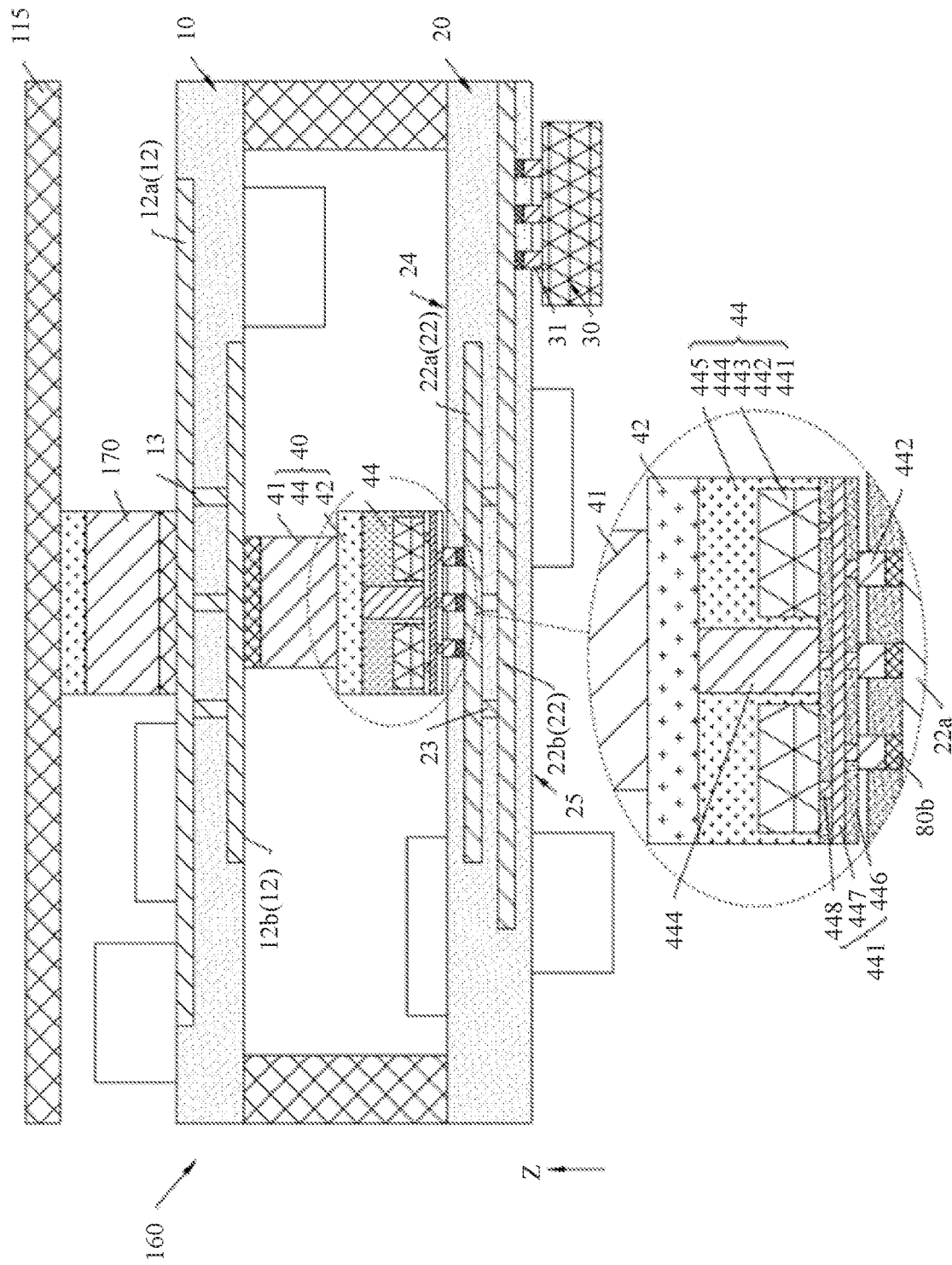
FIG. 12 is a schematic diagram of a partial cross-sectional structure cut from the structure shown in FIG. 5 along I-I according to a seventh embodiment.

FIG. 12 is a schematic diagram of a partial cross-sectional structure cut from the structure shown in FIG. 5 along I-I according to a seventh embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment, and a difference from the first embodiment lies in that a third thermal conductive layer 22a is located between a top surface 24 and a bottom surface 25 of the substrate 21, that is, the third thermal conductive layer 22a is not exposed relative to the top surface 24 of the substrate 21.

The thermal conductive assembly 40 includes a thermal conductive block 41, a thermal interface material layer 42, and a packaging component 44. The thermal conductive block 41 is connected to the thermal conductive layer 12 of the first circuit board 10, the packaging component 44 is connected to the thermal conductive layer 22 of the second circuit board 20, and the thermal interface material layer 42 is connected between the thermal conductive block 41 and the packaging component 44. In some other embodiments, the thermal conductive block 41 may alternatively be connected to the thermal conductive layer 22 of the second circuit board 20, and the packaging component 44 may be connected to the thermal conductive layer 12 of the first circuit board 10.

Specifically, the thermal conductive block 41 is connected to the second thermal conductive layer 12b, to implement heat transfer and an electrical connection between the thermal conductive block 41 and the second thermal conductive layer 12b. The thermal conductive block 41 is connected to the second thermal conductive layer 12b by using the first connection layer 80a. For example, the thermal conductive block 41 is made of a metal material like copper, silver, aluminum, magnesium, or tin, to ensure that the thermal conductive block 41 has high thermal conductivity.

The packaging component 44 is connected to the third thermal conductive layer 22a. For example, the packaging component 44 may be a radio frequency front-end module, a Wi-Fi Bluetooth communication module, or a power management module. In this embodiment, the packaging component 44 includes a bearing plate 441, a heat dissipation pin 442, a component 443, a heat dissipation post 444, and a packaging layer 445. The heat dissipation pin 442 is mounted on a bottom surface (not shown in the figure) of the bearing plate 441. The component 442 is mounted on a top surface (not shown in the figure) of the bearing plate 441. There are two components 443, and the two components 443 are mounted on the top surface of the bearing plate in a mutually spaced manner. The heat dissipation post 444 is mounted on the top surface of the bearing plate 441 and is located between the two components 443. The packaging layer 445 covers the bearing plate 441, the component 443, and the heat dissipation post 444.

The heat dissipation post 444 is exposed relative to a top surface (not shown in the figure) of the packaging layer 445. In this embodiment, a top surface (not shown in the figure) of the heat dissipation post 444 is flush with the top surface of the packaging layer 445. It should be understood that, that the heat dissipation post 444 is exposed relative to the top surface of the packaging layer 445 means that the packaging layer 445 does not completely cover the heat dissipation post 444. In some other embodiments, the top surface of the heat dissipation post 444 may protrude relative to the top surface of the packaging layer 445, or the top surface of the heat dissipation post 444 may be recessed relative to the top surface of the packaging layer 445.

In some embodiments, the packaging layer 445 is provided with a communication hole (not shown in the figure), and the communication hole exposes the bearing plate 441 relative to the packaging layer 445. The heat dissipation post 444 is located in the communication hole to connect to the bearing plate 441. The heat dissipation post 444 may be made of a metal material like copper, silver, aluminum, magnesium, or tin, to ensure high thermal conductivity of the heat dissipation post 444. In this case, the heat dissipation post 444 may be a metal post formed by filling the communication hole with the metal material, or the heat dissipation post 444 may be a metal layer formed by partially covering or completely covering a hole wall of the communication hole with the metal material.

The bearing plate 441 includes a substrate 446, a heat dissipation layer 447, and a heat dissipation part 448. Both the heat dissipation layer 447 and the heat dissipation part 448 are embedded into the substrate 446. The heat dissipation layer 447 may be made of a metal material like copper, silver, aluminum, magnesium, or tin, to ensure that the heat dissipation layer 447 has high thermal conductivity. There are a plurality of heat dissipation parts 448, and the plurality of heat dissipation parts 448 are arranged in a mutually spaced manner. Some of the heat dissipation parts 448 are located on one side of the heat dissipation layer 447, and are connected between the heat dissipation layer 447 and a heat dissipation pin 31. Some of the heat dissipation parts 448 are located on the other side of the heat dissipation layer 447, and are connected between the heat dissipation layer 447 and the heat dissipation post 444. In this case, the heat dissipation pin 442, the heat dissipation part 448 of the bearing plate 441, the heat dissipation layer 447, and the heat dissipation post 444 form a heat dissipation channel inside the packaging component 44.

In some embodiments, the substrate 446 is provided with a communication hole (not shown in the figure), and the communication hole exposes the heat dissipation layer 447 relative to the substrate 446. The heat dissipation part 448 is located in the communication hole, to connect to the heat dissipation layer 447. The heat dissipation part 448 may be made of a metal material like copper, silver, aluminum, magnesium, or tin, to ensure that the heat dissipation part 448 has high thermal conductivity. In this case, the heat dissipation part 448 may be a metal post formed by filling the communication hole with the metal material, or the heat dissipation part 448 may be a metal layer formed by partially covering or completely covering a hole wall of the communication hole with the metal material.

Specifically, the heat dissipation post 444 of the packaging component 44 is connected to the thermal interface material layer 42, to implement heat transfer and an electrical connection between the packaging component 44 and the thermal conductive block 41 by using the thermal interface material layer 42. In this case, the thermal interface material layer 42 covers a top surface (not shown in the figure) of the heat dissipation post 444 of the packaging component 44 and a top surface (not shown in the figure) of the packaging layer 445. A thermal interface material may be added between the packaging component 44 and the thermal conductive block 41 through mounting, dispensing, coating or the like, to form the thermal interface material layer 42. In this case, the packaging component 44 and the thermal conductive block 41 are indirectly connected by using the thermal interface material layer 42, to implement heat transfer and an electrical connection. The thermal interface material between the packaging component 44 and the thermal conductive block 41 may fill an air gap and tolerance redundancy between the heat dissipation post 444 of the packaging component 44 and the thermal conductive block 41, to reduce interface thermal resistance between the heat dissipation post 444 of the packaging component 44 and the thermal conductive block 41, and improve heat transfer efficiency.

The heat dissipation pin 442 of the packaging component 44 is connected to the third thermal conductive layer 22a, to implement heat transfer and an electrical connection between the packaging component 44 and the third thermal conductive layer 22a. That is, the packaging component 44 may not only implement heat transfer with the third thermal conductive layer 22a by using the heat dissipation pin 442, but also implement electrical communication with the second circuit board 20 by using the heat dissipation pin 442. In some other embodiments, the heat dissipation pin 442 of the packaging component 44 may alternatively be connected to the fourth thermal conductive layer 22b.

In this case, the heat dissipation pin 442 of the packaging component 44 has both heat dissipation and grounding functions, that is, the heat dissipation pin 442 of the packaging component 44 is also used as a grounding pin of the packaging component 44. The heat dissipation pin 442 of the packaging component 44 is connected to the third thermal conductive layer 22a by using the second connection layer 80b. For example, the second connection layer 80b is a solder layer. The heat dissipation pin 442 of the packaging component 44 may be connected to the third thermal conductive layer 22a by using a through molding via (TMV) process and a soldering process of the packaging component.

In this embodiment, heat generated when the main heat generation component 30 works may be sequentially transferred to the fourth thermal conductive layer 22b by using the heat dissipation pin 31, transferred to the packaging component 44 in the thermal conductive assembly 40 by using the second thermal conductive structure 23 and the third thermal conductive layer 22a, transferred to the thermal interface material layer 42 of the thermal conductive assembly 40 by using the heat dissipation part 448 of the packaging component 44, the heat dissipation layer 447 and the heat dissipation post 444, transferred to the second thermal conductive layer 12b by using the thermal conductive block 41 of the thermal conductive assembly 40, transferred to the heat transfer part 170 by using the first thermal conductive structure 13 and the first thermal conductive layer 12a, and finally transferred to the middle plate 115 by using the heat transfer part 170, to implement heat dissipation for the main heat generation component 30.

In this case, the two thermal conductive layers 22 and the second thermal conductive structure 23 of the second circuit board 20, the thermal conductive post 43 of the thermal conductive assembly 40, the heat dissipation channel inside the thermal interface material layer 42 and the packaging component 44, the two thermal conductive layers 12 and the first thermal conductive structure 13 of the first circuit board 10, the heat transfer part 170, and the middle plate 115 form a three-dimensional heat dissipation topology network. Heat generated when the main heat generation component 30 works may be transferred to the three-dimensional heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting application of the electronic device 100 by the heat of the main heat generation component 30.

In addition, in this embodiment, the three-dimensional heat dissipation topology network is formed by using the heat dissipation channel of the packaging component 44 and other components together. This can reduce a quantity of thermal conductive blocks 41 (as shown in the first embodiment) in the three-dimensional heat dissipation topology network, can improve area utilization of the second circuit board 20, and facilitates a miniaturized design of the electronic device 100.

Figure 13:
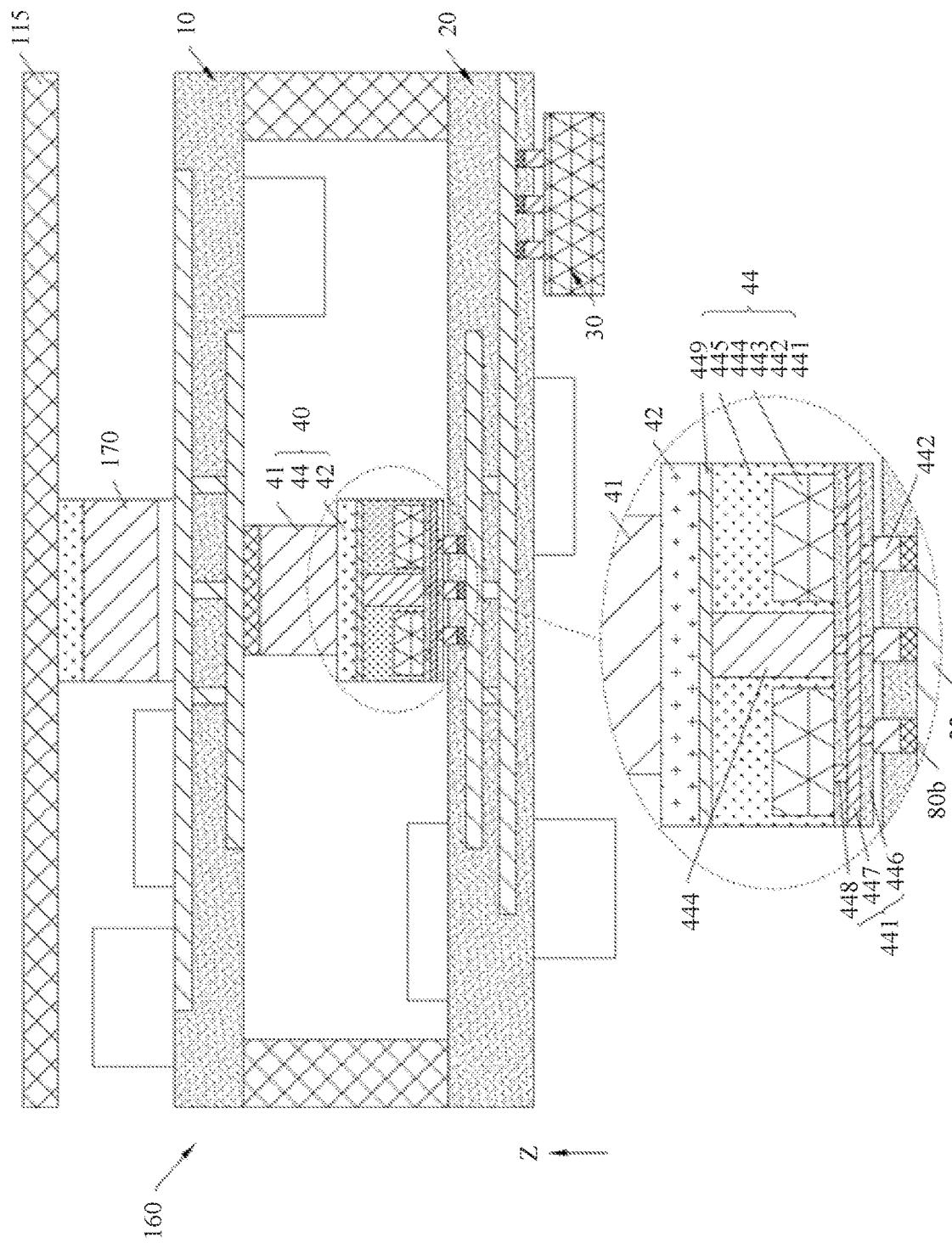
FIG. 13 is a schematic diagram of a partial cross-sectional structure cut from the structure shown in FIG. 5 along I-I according to an eighth embodiment.

FIG. 13 is a schematic diagram of a partial cross-sectional structure cut from the structure shown in FIG. 5 along I-I according to an eighth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the seventh embodiment, and a difference from the seventh embodiment lies in that the packaging component 44 further includes an auxiliary heat dissipation layer 449. The auxiliary heat dissipation layer 449 is connected between the heat dissipation post 444 and the thermal interface material layer 42, so that the packaging component 44 is indirectly connected to the thermal conductive block 41 by using the auxiliary heat dissipation layer 449 and the thermal interface material layer 42, to implement heat transfer and electrical communication between the packaging component 44 and the thermal conductive block 41. The auxiliary heat dissipation layer 449 covers a top surface of the heat dissipation post 444 and a top surface of the packaging layer 445. In this case, the heat dissipation pin 442 of the packaging component 44, the heat dissipation part 448 and the heat dissipation layer 447 of the bearing plate 441, the heat dissipation post 444, and the auxiliary heat dissipation layer 449 form a heat dissipation channel of the packaging component 44.

Figure 14:
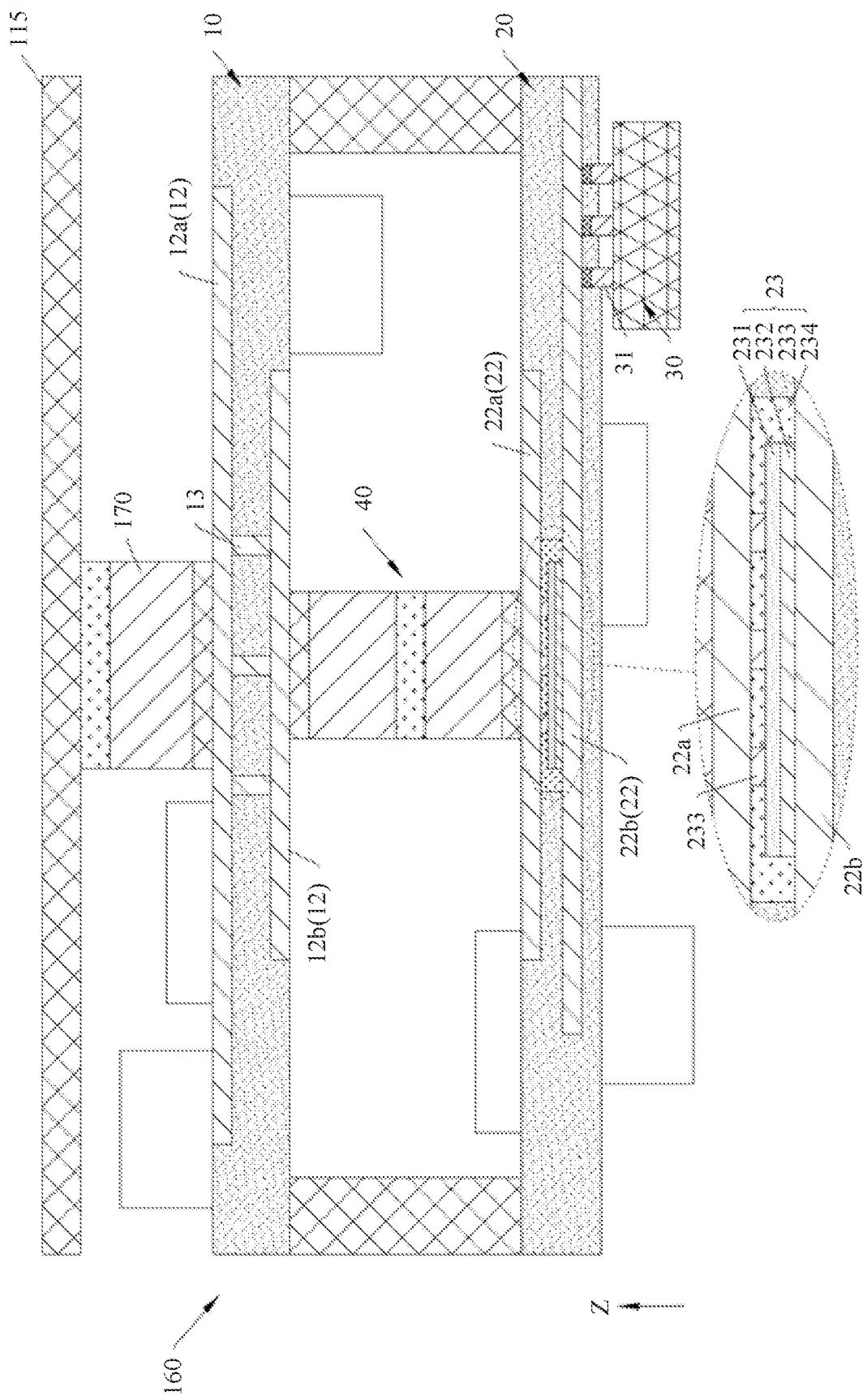
FIG. 14 is a schematic diagram of a partial cross-sectional structure cut from the structure shown in FIG. 5 along I-I according to a ninth embodiment.

FIG. 14 is a schematic diagram of a partial cross-sectional structure cut from the structure shown in FIG. 5 along I-I according to a ninth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment. A difference from the first embodiment lies in that a second thermal conductive structure 23 includes a chip, and the chip is connected between two thermal conductive layers 12 of the second circuit board 20, to implement heat transfer and electrical communication between the two thermal conductive layers 12. In some other embodiments, a first thermal conductive structure 13 may also include a chip.

The chip includes a wafer layer 231, a thermal conductive surface layer 232, a leg 233, and a packaging layer 234. The wafer layer 231 may be made of a semiconductor material like silicon, gallium nitride, or silicon carbide. In this case, the wafer layer 231 has good thermal conductivity, and a coefficient of thermal conductivity of 100 W/mk or more. The thermal conductive surface layer 232 is fixedly connected to a bottom surface (not shown in the figure) of the wafer layer 231. The thermal conductive surface layer 232 may be made of a metal material like copper, silver, aluminum, magnesium, or tin, to ensure that the thermal conductive surface layer 232 has high thermal conductivity. The leg 233 is fixedly connected to a top surface (not shown in the figure) of the wafer layer 231. There are a plurality of legs 233, and the plurality of legs 233 are arranged in a mutually spaced manner. The packaging layer 234 covers the wafer layer 231, the thermal conductive surface layer 232, and the leg 233. In this case, the thermal conductive surface layer 232, the wafer layer 231, and the leg 233 form a heat dissipation channel inside the chip.

Specifically, the thermal conductive surface layer 232 is exposed relative to a bottom surface (not shown in the figure) of the packaging layer 234, and is connected to a fourth thermal conductive layer 22b. A bottom surface (not shown in the figure) of the thermal conductive surface layer 232 is flush with the bottom surface of the packaging layer 234. It should be understood that, that the thermal conductive surface layer 232 is exposed relative to the bottom surface of the packaging layer 234 means that the packaging layer 234 does not completely cover the thermal conductive surface layer 232. In some other embodiments, the bottom surface of the thermal conductive surface layer 232 may alternatively protrude relative to the bottom surface of the packaging layer 234, or the bottom surface of the thermal conductive surface layer 232 may alternatively be recessed relative to the bottom surface of the packaging layer 234.

The leg 233 is exposed relative to a top surface (not shown in the figure) of the packaging layer 234, and is connected to the third thermal conductive layer 22a. A top surface (not shown in the figure) of the leg 233 is flush with the top surface of the packaging layer 234. It should be understood that, that the leg 233 is exposed relative to the top surface of the packaging layer 234 means that the packaging layer 234 does not completely cover the leg. In some other embodiments, the top surface of the leg 233 may alternatively protrude relative to the top surface of the packaging layer 234, or the top surface of the leg 233 may alternatively be recessed relative to the top surface of the packaging layer 234.

In this embodiment, heat generated when the main heat generation component 30 works may be sequentially transferred to the fourth thermal conductive layer 22b by using a heat dissipation pin 31, transferred to the chip by using the fourth thermal conductive layer 22b, transferred to the third thermal conductive layer 22a by using the thermal conductive surface layer 232, the wafer layer 231, and the leg 233, transferred to the second thermal conductive layer 12b by using the thermal conductive assembly 40, transferred to the heat transfer part 170 by using the first thermal conductive structure 13 and the first thermal conductive layer 12a, and finally transferred to the middle plate 115 by using the heat transfer part 170, to implement heat dissipation for the main heat generation component 30.

In this case, the heat dissipation channel inside the two thermal conductive layers 22 of the second circuit board 20 and the chip, the thermal conductive assembly 40, the two thermal conductive layers 12 and the first thermal conductive structure 13 of the first circuit board 10, the heat transfer part 170, and the middle plate 115 form a three-dimensional heat dissipation topology network. Heat generated when the main heat generation component 30 works may be transferred to the heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting application of the electronic device 100 by the heat of the main heat generation component 30.

In addition, in this embodiment, the heat dissipation channel of the chip replaces the metal post or the metal layer used by the second thermal conductive structure 23 in the second circuit board 20 shown in the foregoing embodiment. Because the wafer layer 231 of the chip has good thermal conductive performance, thermal resistance of the three-dimensional heat dissipation topology network formed by the heat dissipation channel of the chip and other components can be effectively reduced, and effective heat dissipation of the main heat generation component 30 is implemented.

In addition, because a size of the chip in a plane direction is between 500 μm and 5000 μm, and a size in a thickness direction is between 50 μm and 500 μm, high-density integration of high thermal-conductivity materials in the heat dissipation topology network is implemented, benefits of area utilization of the second circuit board 20 are increased, and integration of the heat dissipation apparatus 160 is improved.

Figure 15:
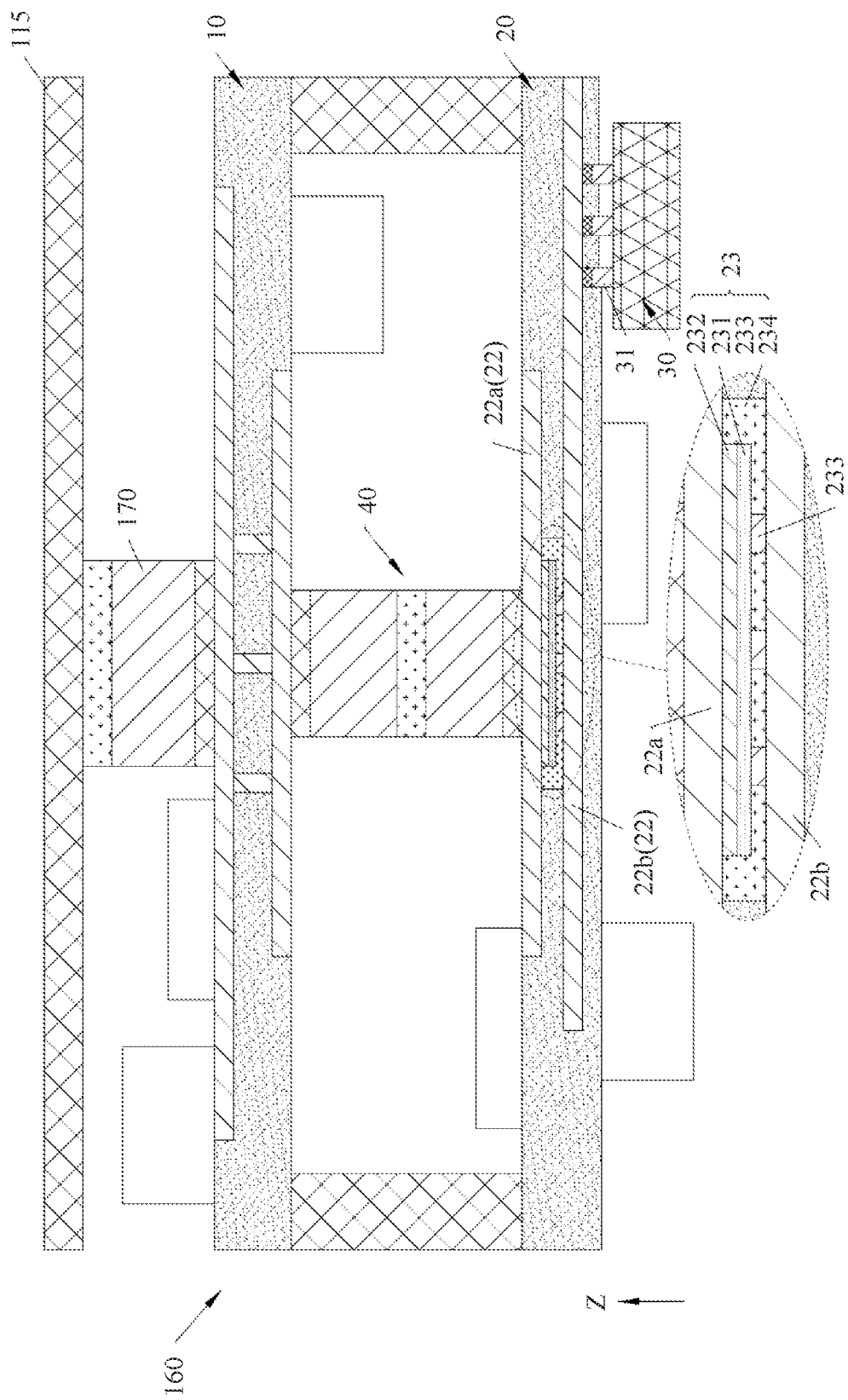
FIG. 15 is a schematic diagram of a partial cross-sectional structure cut from the structure shown in FIG. 5 along I-I according to a tenth embodiment.

FIG. 15 is a schematic diagram of a partial cross-sectional structure cut from the structure shown in FIG. 5 along I-I according to a tenth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the ninth embodiment, and a difference from the ninth embodiment lies in that the thermal conductive surface layer 232 is connected to the third thermal conductive layer 22a, and the leg 233 is connected to the fourth thermal conductive layer 22b, so that a chip is connected between the fourth thermal conductive layer 22b and the third thermal conductive layer 22a, to implement heat transfer and an electrical connection between the fourth thermal conductive layer 22b and the third thermal conductive layer 22a.

In this embodiment, heat generated when the main heat generation component 30 works may be sequentially transferred to the fourth thermal conductive layer 22b by using the heat dissipation pin 31, transferred to the chip by using the fourth thermal conductive layer 22b, transferred to the third thermal conductive layer 22a by using the leg 233 of the chip, the wafer layer 231, and the thermal conductive surface layer 232, transferred to the second thermal conductive layer 12b by using the thermal conductive assembly 40, transferred to the heat transfer part 170 by using the first thermal conductive structure 13 and the first thermal conductive layer 12a, and finally transferred to the middle plate 115 by using the heat transfer part 170, to implement heat dissipation for the main heat generation component 30.

Figure 16:
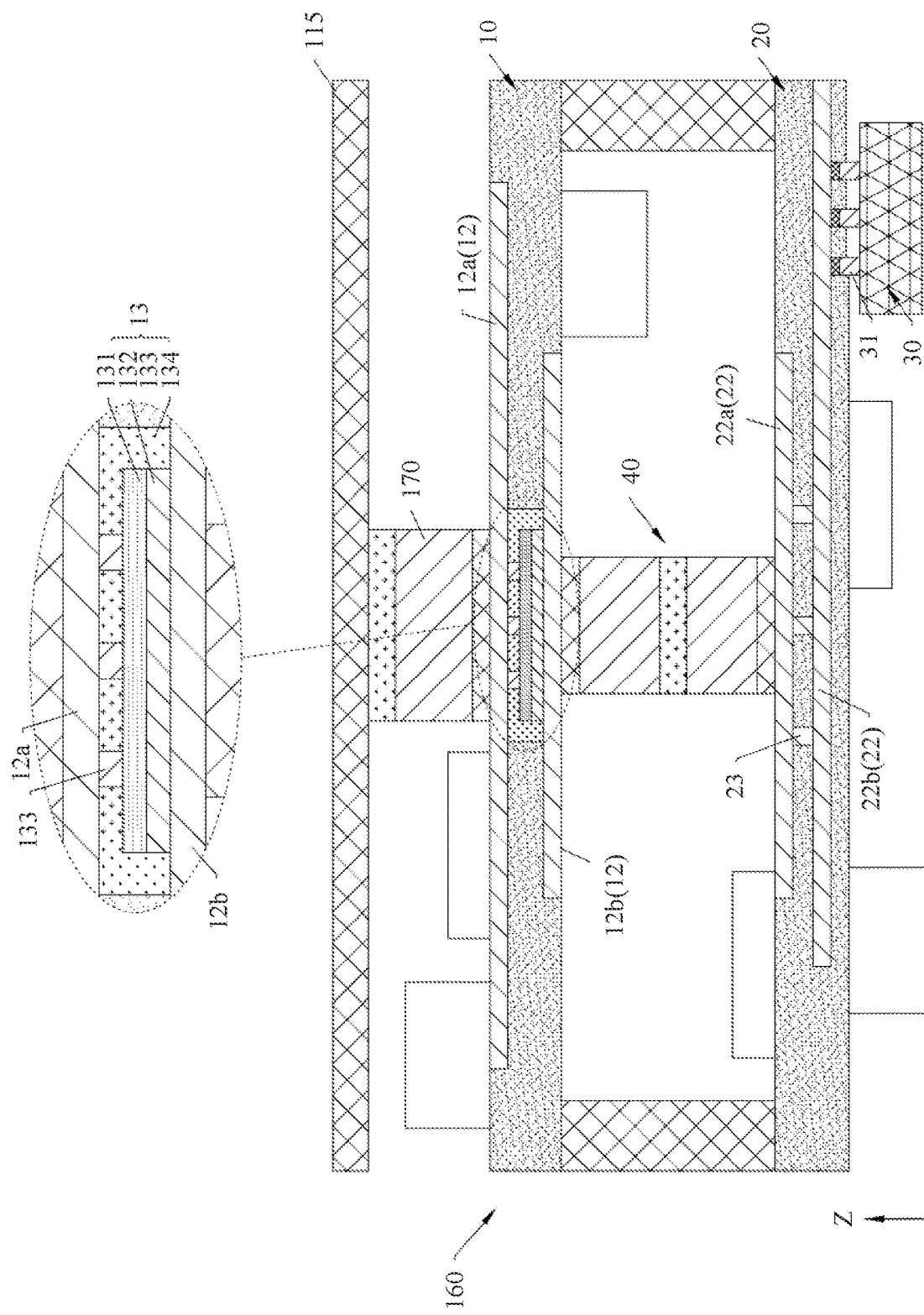
FIG. 16 is a schematic diagram of a partial cross-sectional structure cut from the structure shown in FIG. 5 along I-I according to an eleventh embodiment.

FIG. 16 is a schematic diagram of a partial cross-sectional structure cut from the structure shown in FIG. 5 along I-I according to an eleventh embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment. A difference from the first embodiment lies in that the first thermal conductive structure 13 includes a chip, and the chip is connected between two thermal conductive layers 12 of the first circuit board 10, to implement heat transfer and electrical communication between the two thermal conductive layers 12.

The chip includes a wafer layer 131, a thermal conductive surface layer 132, a leg 133, and a packaging layer 134. The wafer layer 131 may be made of a semiconductor material like silicon, gallium nitride, or silicon carbide. In this case, the wafer layer 131 has good thermal conductivity, and a coefficient of thermal conductivity of 100 W/mk or more. The thermal conductive surface layer 132 is fixedly connected to a bottom surface (not shown in the figure) of the wafer layer 131. The thermal conductive surface layer 132 may be made of a metal material like copper, silver, aluminum, magnesium, or tin, to ensure that the thermal conductive surface layer 132 has high thermal conductivity. The leg 133 is fixedly connected to a top surface (not shown in the figure) of the wafer layer 131. There are a plurality of legs 133, and the plurality of legs 133 are arranged in a mutually spaced manner. The packaging layer 134 covers the wafer layer 131, the thermal conductive surface layer 132, and the leg 133. In this case, the thermal conductive surface layer 132, the wafer layer 131, and the leg 133 form a heat dissipation channel inside the chip.

Specifically, the thermal conductive surface layer 132 is exposed relative to a bottom surface (not shown in the figure) of the packaging layer 134, and is connected to the second thermal conductive layer 12b. A bottom surface (not shown in the figure) of the thermal conductive surface layer 132 is flush with the bottom surface of the packaging layer 134. It should be understood that, that the thermal conductive surface layer 132 is exposed relative to the bottom surface of the packaging layer 134 means that the packaging layer 134 does not completely cover the thermal conductive surface layer 132. In some other embodiments, the bottom surface of the thermal conductive surface layer 132 may alternatively protrude relative to the bottom surface of the packaging layer 134, or the bottom surface of the thermal conductive surface layer 132 may alternatively be recessed relative to the bottom surface of the packaging layer 134.

The leg 133 is exposed relative to a top surface (not shown in the figure) of the packaging layer 134, and is connected to the first thermal conductive layer 12a. A top surface (not shown in the figure) of the leg 133 is flush with the top surface of the packaging layer 134. It should be understood that, that the leg 133 is exposed relative to the top surface of the packaging layer 134 means that the packaging layer 134 does not completely cover the leg. In some other embodiments, the top surface of the leg 133 may alternatively protrude relative to the top surface of the packaging layer 134, or the top surface of the leg 133 may alternatively be recessed relative to the top surface of the packaging layer 134.

In this embodiment, heat generated when the main heat generation component 30 works may be sequentially transferred to the fourth thermal conductive layer 22b by using a heat dissipation pin 31, transferred to the thermal conductive assembly 40 by using the second thermal conductive structure 23 and the third thermal conductive layer 22a, transferred to the second thermal conductive layer 12b by using the thermal conductive assembly 40, transferred to the chip by using the second thermal conductive layer 12b, transferred to the heat transfer part 170 by using the thermal conductive surface layer 132, the wafer layer 131 and the leg 133 of the chip, and the first thermal conductive layer 12a, and finally transferred to the middle plate 115 by using the heat transfer part 170, to implement heat dissipation for the main heat generation component 30.

In this case, the two thermal conductive layers 22 and the second thermal conductive structure 23 of the second circuit board 20, the thermal conductive assembly 40, the heat dissipation channel inside the two thermal conductive layers 12 of the first circuit board 10 and the chip, the heat transfer part 170, and the middle plate 115 form a three-dimensional heat dissipation topology network. Heat generated when the main heat generation component 30 works may be transferred to the heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting application of the electronic device 100 by the heat of the main heat generation component 30.

In addition, in this embodiment, the heat dissipation channel of the chip replaces the metal post or the metal layer used by the first thermal conductive structure 13 in the first circuit board 10 shown in the foregoing embodiment. Because the wafer layer 131 of the chip has good thermal conductive performance, thermal resistance of the three-dimensional heat dissipation topology network formed by the heat dissipation channel of the chip and other components can be effectively reduced, and effective heat dissipation of the main heat generation component 30 is implemented.

In addition, because a size of the chip in a plane direction is between 500 µm and 5000 µm, and a size in a thickness direction is between 50 µm and 500 µm, high-density integration of high thermal-conductivity materials in the heat dissipation topology network is implemented, benefits of area utilization of the first circuit board 10 are increased, and integration of the heat dissipation apparatus 160 is improved.

In some other embodiments, the thermal conductive surface layer 132 of the chip may be connected to the first thermal conductive layer 12a, and the leg 133 of the chip may be connected to the second thermal conductive layer 12b, so that the chip is connected between the second thermal conductive layer 22b and the first thermal conductive layer 12a.

Figure 17:
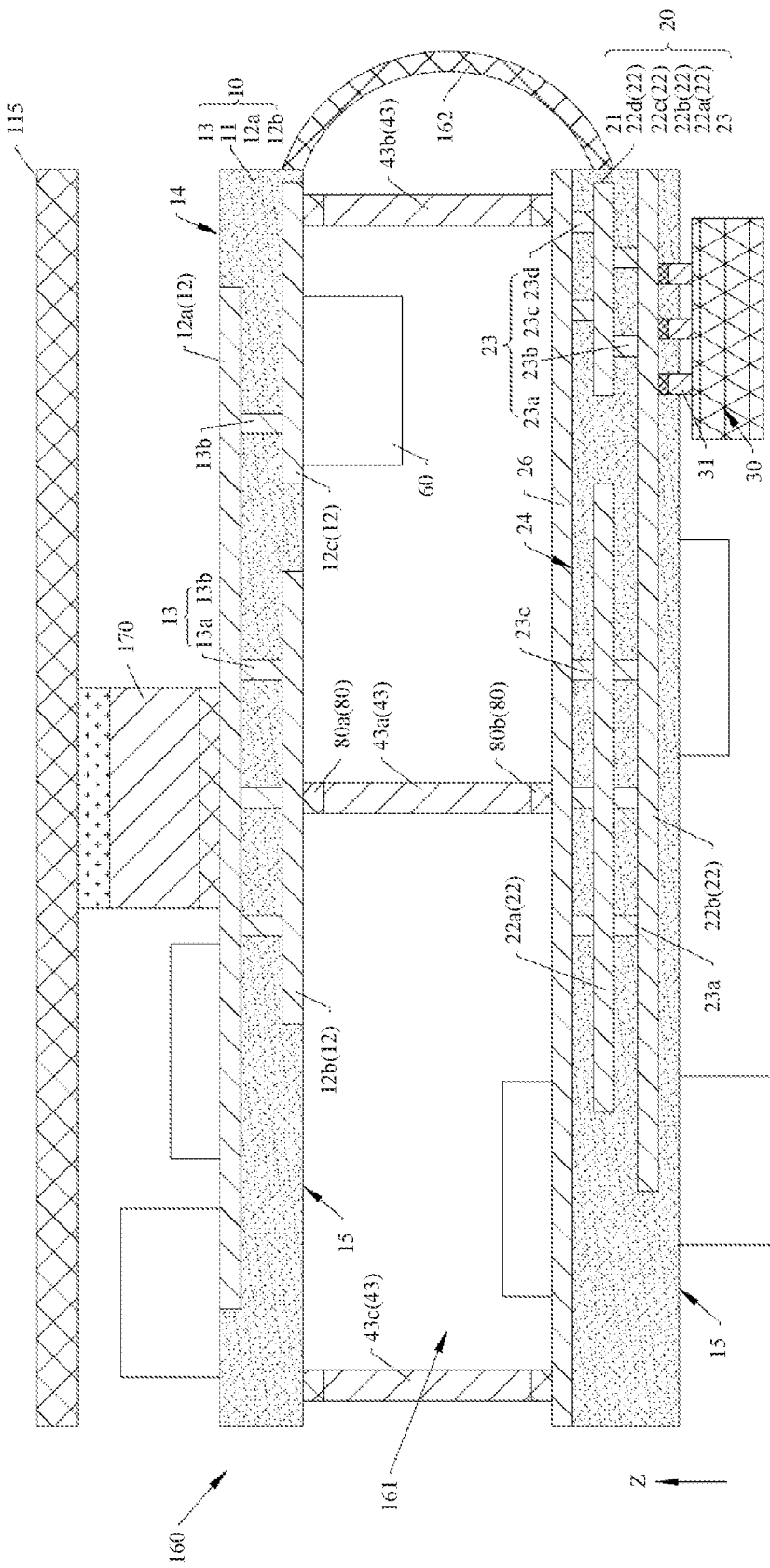
FIG. 17 is a schematic diagram of a partial cross-sectional structure cut from the structure shown in FIG. 5 along I-I according to a twelfth embodiment.

FIG. 17 is a schematic diagram of a partial cross-sectional structure cut from the structure shown in FIG. 5 along I-I according to a twelfth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment. A difference from the first embodiment lies in that the first circuit board 10 includes a substrate 11, three thermal conductive layers 12, and a first thermal conductive structure 13. The three thermal conductive layers 12 and the first thermal conductive structure 13 are all embedded into the substrate 11. The three thermal conductive layers 12 are disposed in a mutually spaced manner. The first thermal conductive structure 13 includes a plurality of thermal conductive parts, and each thermal conductive part of the first thermal conductive structure 13 is connected between two thermal conductive layers 12.

Specifically, the three thermal conductive layers 12 are respectively a first thermal conductive layer 12a, a second thermal conductive layer 12b, and a sixth thermal conductive layer 12c. The first thermal conductive layer 12a is exposed relative to a top surface 14 of the substrate 11. Both the second thermal conductive layer 12b and the sixth thermal conductive layer 12c are located on a bottom side of the first thermal conductive layer 12a, are parallel to and spaced from the first thermal conductive layer 12a, and are exposed relative to a bottom surface 15 of the substrate 11.

The first thermal conductive layer 12a, the second thermal conductive layer 12b, and the sixth thermal conductive layer 12c are all ground planes. In this case, the first thermal conductive layer 12a, the second thermal conductive layer 12b, and the sixth thermal conductive layer 12c may be made of a metal material like copper, silver, aluminum, magnesium, or tin, to ensure that the first thermal conductive layer 12a, the second thermal conductive layer 12b, and the third thermal conductive layer 12b have high thermal conductivity.

Some of the thermal conductive parts of the first thermal conductive structure 13 are connected between the first thermal conductive layer 12a and the second thermal conductive layer 12b, and some of the thermal conductive parts of the first thermal conductive structure 13 are connected between the first thermal conductive layer 12a and the sixth thermal conductive layer 12c, to implement a connection between the first thermal conductive layer 12a, the second thermal conductive layer 12b, and the sixth thermal conductive layer 12c. Specifically, the plurality of thermal conductive parts of the first thermal conductive structure 13 are respectively a first thermal conductive part 13a and a second thermal conductive part 13b. The first thermal conductive part 13a is connected between the first thermal conductive layer 12a and the second thermal conductive layer 12b. The second thermal conductive part 13b is connected between the first thermal conductive layer 12a and the sixth thermal conductive layer 12c. In some other embodiments, some of the thermal conductive parts of the first thermal conductive structure 13 may alternatively be connected between the second thermal conductive layer 12b and the sixth thermal conductive layer 12c.

In this embodiment, there are a plurality of first thermal conductive parts 13a and second thermal conductive parts 13b. The plurality of first thermal conductive parts 13a are arranged in a mutually spaced manner, to increase a heat transfer path between the first thermal conductive layer 12a and the second thermal conductive layer 12b, and increase a heat transfer speed between the first thermal conductive layer 12a and the second thermal conductive layer 12b. The plurality of second thermal conductive parts 13b are arranged in a mutually spaced manner, to increase a heat transfer path between the first thermal conductive layer 12a and the sixth thermal conductive layer 12c, and increase a heat transfer speed between the second thermal conductive layer 12b and the sixth thermal conductive layer 12c.

In some embodiments, the substrate 11 is provided with a plurality of first communication holes (not shown in the figure) and a plurality of second communication holes (not shown in the figure). The first communication hole connects the first thermal conductive layer 12a and the second thermal conductive layer 12b, and the second communication hole connects the first thermal conductive layer 12a and the third thermal conductive layer 12c. Specifically, each first thermal conductive part 13a is located in one first communication hole, to connect the first thermal conductive layer 12a and the second thermal conductive layer 12b. Each second thermal conductive part 13b is located in one second communication hole, to connect the first thermal conductive layer 12a and the sixth thermal conductive layer 12c. The first thermal conductive part 13a and the second thermal conductive part 13b may be made of a metal material like copper, silver, aluminum, magnesium, or tin, to ensure that the first thermal conductive part 13a and the second thermal conductive part 13b have high thermal conductivity, and improve heat transfer efficiency between the first thermal conductive layer 12a and the second thermal conductive layer 12*b* and the third thermal conductive layer 13*c*. In this case, the first thermal conductive part 13*a* and the second thermal conductive part 13*b* may be metal posts formed by filling the communication hole with the metal material; or the first thermal conductive part 13*a* and the second thermal conductive part 13*b* may be a metal layer formed by partially covering or completely covering a hole wall of the communication hole with the metal material.

The second circuit board 20 includes a substrate 21, three thermal conductive layers 22, a second thermal conductive structure 23, and an auxiliary thermal conductive layer 26. The three thermal conductive layers 22 and the second thermal conductive structure 23 are all embedded into the substrate 21, and the three thermal conductive layers 22 are disposed in a mutually spaced manner. The auxiliary thermal conductive layer 26 is fixedly connected to a top surface 24 of the substrate 21. The second thermal conductive structure 23 includes a plurality of thermal conductive parts. Some of the thermal conductive parts of the second thermal conductive structure 23 are connected between two thermal conductive layers 22, and some of the thermal conductive parts of the second thermal conductive structure 23 are connected between the thermal conductive layer 23 and the auxiliary thermal conductive layer 26.

Specifically, the three thermal conductive layers 22 are all located between the top surface 24 and a top surface 25 of the substrate 21, and the three thermal conductive layers 22 are respectively a third thermal conductive layer 22*a*, a fourth thermal conductive layer 22*b*, and a fifth thermal conductive layer 22*c*. The fourth thermal conductive layer 22*b* is located on a bottom side of the third thermal conductive layer 22*a*, is parallel to and spaced from the third thermal conductive layer 22*a*, and is located between the bottom surface 25 and the top surface 24 of the substrate 21. The fifth thermal conductive layer 22*c* is located on a top side of the fourth thermal conductive layer 22*b*, and is parallel to and spaced from the fourth thermal conductive layer 22*b*. The third thermal conductive layer 22*a*, the fourth thermal conductive layer 22*b*, and the fifth thermal conductive layer 22*c* are all ground planes. In this case, the third thermal conductive layer 22*a*, the fourth thermal conductive layer 22*b*, and the fifth thermal conductive layer 22*c* may be made of a metal material like copper, silver, aluminum, magnesium, or tin, to ensure that the third thermal conductive layer 22*a*, the fourth thermal conductive layer 22*b*, and the fifth thermal conductive layer 22*c* have high thermal conductivity.

The auxiliary thermal conductive layer 26 covers the top surface 24 of the substrate 21, to improve heat dissipation efficiency of the heat dissipation apparatus 160. The auxiliary thermal conductive layer 27 is parallel to and spaced from the third thermal conductive layer 22*a*. The auxiliary thermal conductive layer 26 is a ground plane. In this case, the auxiliary thermal conductive layer 26 may be made of a metal material like copper, silver, aluminum, magnesium, or tin, to ensure that the auxiliary thermal conductive layer 26 has high thermal conductivity.

Some of the thermal conductive parts of the second thermal conductive structure 23 are connected between the first thermal conductive layer 22*a* and the fifth thermal conductive layer 22*c*, some of the thermal conductive parts of the second thermal conductive structure 23 are connected between the fifth thermal conductive layer 22*c* and the fourth thermal conductive layer 22*b*, some of the thermal conductive parts of the second thermal conductive structure 23 are connected between the third thermal conductive layer 22*a* and the auxiliary thermal conductive layer 26, and some of the thermal conductive parts of the second thermal conductive structure 23 are connected between the fifth thermal conductive layer 22*c* and the auxiliary thermal conductive layer 26, to implement a pairwise connection between the third thermal conductive layer 22*a*, the fourth thermal conductive layer 22*b*, the fifth thermal conductive layer 22*c*, and the auxiliary thermal conductive layer 26. In some other embodiments, alternatively, some of the thermal conductive parts of the second thermal conductive structure 23 may be connected between the auxiliary thermal conductive layer 26 and the fourth thermal conductive layer 22*b*, and/or some of the thermal conductive parts of the second thermal conductive structure 23 may be connected between the third thermal conductive layer 22*a* and the fifth thermal conductive layer 22*c*.

Specifically, the thermal conductive parts of the second thermal conductive structure 23 are respectively a first thermal conductive part 23*a*, a second thermal conductive part 23*b*, a third thermal conductive part 23*c*, and a fourth thermal conductive part 23*d*. The first thermal conductive part 23*a* is connected between the third thermal conductive layer 22*a* and the fourth thermal conductive layer 22*b*. The second thermal conductive part 23*b* is connected between the fifth thermal conductive layer 22*c* and the fourth thermal conductive layer 22*b*. The third thermal conductive part 23*c* is connected between the third thermal conductive layer 22*a* and the auxiliary thermal conductive layer 26. The fourth thermal conductive part 23*d* is connected between the fifth thermal conductive layer 22*c* and the auxiliary thermal conductive layer 26.

In this embodiment, there are a plurality of first thermal conductive parts 23*a*, second thermal conductive parts 23*b*, third thermal conductive parts 23*c*, and fourth thermal conductive parts 23*d*. The plurality of first thermal conductive parts 23*a* are arranged in a mutually spaced manner, to increase a heat transfer path between the third thermal conductive layer 22*a* and the fourth thermal conductive layer 22*b*, and increase a heat transfer speed between the third thermal conductive layer 22*a* and the fourth thermal conductive layer 22*b*. The plurality of second thermal conductive parts 23*b* are arranged in a mutually spaced manner, to increase a heat transfer path between the fourth thermal conductive layer 22*b* and the fifth thermal conductive layer 22*c*, and increase a heat transfer speed between the fourth thermal conductive layer 22*b* and the fifth thermal conductive layer 22*c*. The plurality of third thermal conductive parts 23*c* are arranged in a mutually spaced manner, to increase a heat transfer path between the third thermal conductive layer 22*a* and the auxiliary thermal conductive layer 26, and increase a heat transfer speed between the third thermal conductive layer 22*a* and the auxiliary thermal conductive layer 26. The plurality of fourth thermal conductive parts 23*d* are arranged in a mutually spaced manner, to increase a heat transfer path between the fifth thermal conductive layer 22*c* and the auxiliary thermal conductive layer 26, and increase a heat transfer speed between the fifth thermal conductive layer 22*c* and the auxiliary thermal conductive layer 26.

In some embodiments, the substrate 21 is provided with a plurality of first communication holes (not shown in the figure), a plurality of second communication holes (not shown in the figure), a plurality of third communication holes (not shown in the figure), and a plurality of fourth communication holes (not shown in the figure). The first communication hole connects the third thermal conductive layer 22*a* and the fourth thermal conductive layer 22*b*, the second communication hole connects the fourth thermal conductive layer 22b and the fifth thermal conductive layer 22c, the third communication hole exposes the third thermal conductive layer 22a relative to the substrate 11, and the fourth communication hole exposes the fifth thermal conductive layer 22c relative to the substrate 11. Specifically, each first thermal conductive part 23a is located in one first communication hole, each second thermal conductive part 23b is located in one second communication hole, each third thermal conductive part 23c is located in one third communication hole, and each fourth thermal conductive part 23d is located in one fourth communication hole. The first communication hole and the second communication hole are via holes or buried holes, and the third communication hole and the fourth communication hole are blind holes.

The first thermal conductive part 23a, the second thermal conductive part 23b, the third thermal conductive part 23c, and the fourth thermal conductive part 23d may be made of a metal material like copper, silver, aluminum, magnesium, or tin, to ensure that the first thermal conductive part 23a, the second thermal conductive part 23b, the third thermal conductive part 23c, and the fourth thermal conductive part 23d have high thermal conductivity, and heat transfer efficiency between that third thermal conductive layer 22a, the fourth thermal conductive layer 22b, the third thermal conductive layer 23c, and the auxiliary thermal conductive layer 26 is improved. In this case, the first thermal conductive part 23a, the second thermal conductive part 23b, the third thermal conductive part 23c, and the fourth thermal conductive part 23d may be metal posts formed by filling corresponding communication holes with the metal material, or the first thermal conductive part 23a, the second thermal conductive part 23b, the third thermal conductive part 23c, and the fourth thermal conductive part 23d may be metal layers formed by partially covering or completely covering hole walls of corresponding communication holes with the metal material.

In this embodiment, the heat dissipation apparatus 160 further includes a flexible printed circuit (FPC) 162. The flexible printed circuit 162 is electrically connected between the first circuit board 10 and the second circuit board 20, to implement electrical communication between the first circuit board 10 and the second circuit board 20, and a communication connection between the first circuit board 10 and the second circuit board 20. In some other embodiments, the first circuit board 10 and the second circuit board 20 may alternatively be electrically connected by using a signal frame plate structure.

The thermal conductive assembly 40 includes a thermal conductive post 43, and the thermal conductive post 43 is connected between the first circuit board 10 and the second circuit board 20. Each thermal conductive post 43 is indirectly connected to the first circuit board 10 by using the first connection layer 80a, and is indirectly connected to the second circuit board 20 by using the second connection layer 80b. The thermal conductive post 43 is made of a metal material like copper, silver, aluminum, magnesium, or tin, to ensure that the thermal conductive post 43 has high thermal conductivity.

Specifically, the thermal conductive post 43 is connected between the second thermal conductive layer 12b and the auxiliary thermal conductive layer 26 of the second circuit board 20, to implement heat transfer between the second thermal conductive layer 12b and the auxiliary thermal conductive layer 26 of the second circuit board 20. In this case, the thermal conductive post 43 is electrically connected to the ground planes of the first circuit board 10 and the second circuit board 20. Therefore, the thermal conductive post 43 is also in a grounded state.

In this embodiment, the two support posts 50 are respectively a first support post 50a and a second support post 50b. The first support post 50a is connected between the sixth thermal conductive layer 12c of the first circuit board 10 and the auxiliary thermal conductive layer 26 of the second circuit board 20, to implement heat transfer and an electrical connection between the sixth thermal conductive layer 12c of the first circuit board 10 and the auxiliary thermal conductive layer 26 of the second circuit board 20. The second support post 50a is connected between the substrate 11 of the first circuit board 10 and the auxiliary thermal conductive layer 26 of the second circuit board 20. The first support post 50a is electrically connected to the ground plane of the second circuit board 20, so that the first support post 50a is also in a grounded state.

Figure 18:
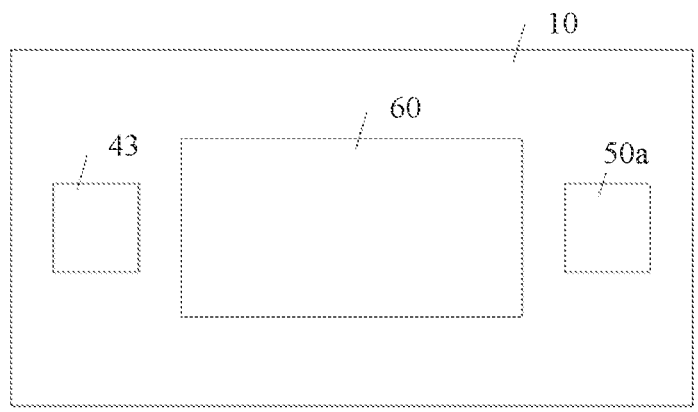
FIG. 18 is a schematic diagram of a partial structure of an orthographic projection of a thermal conductive assembly and a first component on a bottom surface of a first circuit board in the structure shown in FIG. 17 according to an implementation.

FIG. 18 is a schematic diagram of a partial structure of orthographic projections of a thermal conductive assembly 40 and a first component 60 on a bottom surface of a first circuit board 10 in the structure shown in FIG. 17 according to an implementation.

In this implementation, one first component 60 is located between the thermal conductive post 43 and the first support post 50a. In this case, the thermal conductive post 43 and the first support post 50a are respectively located on two sides of a functional component, and are grounded, and may form an electromagnetic shielding structure of the first component 60 with an auxiliary thermal conductive layer 26 of the first circuit board 10, to have specific electromagnetic shielding effect, and prevent electromagnetic interference caused by an external component to the first component 60, or prevent electromagnetic interference caused by the first component 60 to another component. It should be understood that a shape of the thermal conductive post 43 is not limited to a square post shown in FIG. 19, and may alternatively be a cylindrical post or another special-shaped post.

Figure 19:
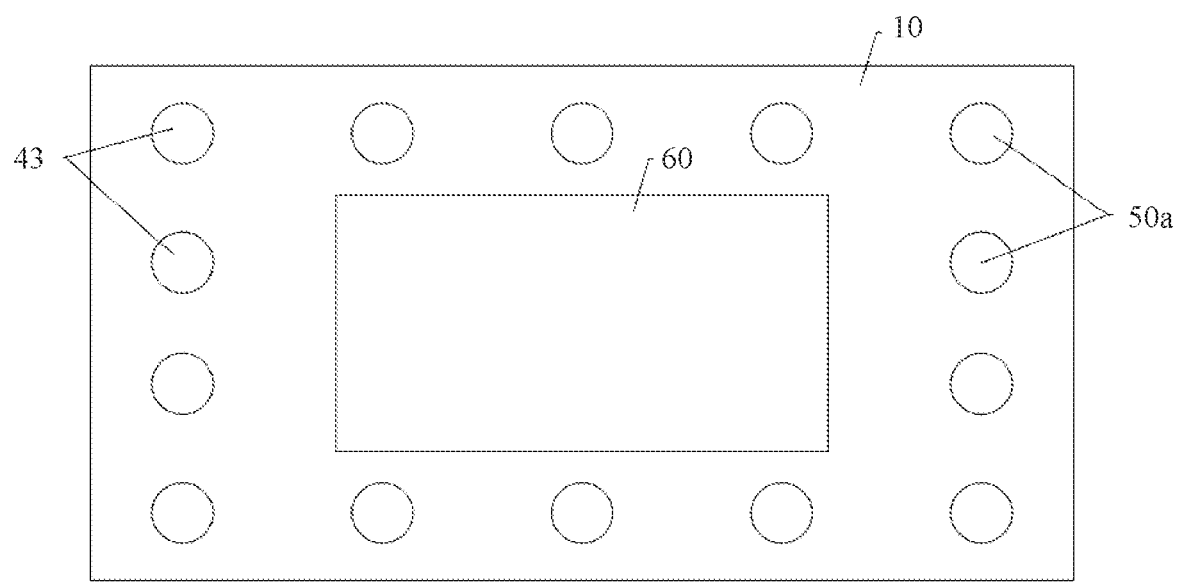
FIG. 19 is a schematic diagram of a partial structure of an orthographic projection of a thermal conductive assembly and a first component on a bottom surface of a first circuit board in the structure shown in FIG. 17 according to another implementation.

FIG. 19 is a schematic diagram of a partial structure of orthographic projections of a thermal conductive assembly 40 and a first component 60 on a bottom surface of a first circuit board 10 in the structure shown in FIG. 17 according to another implementation.

In this implementation, there are a plurality of thermal conductive posts 43 and first support posts 50a. The plurality of thermal conductive posts 43 and the plurality of first support posts 50a are disposed around the first component 60 in a mutually spaced manner. The plurality of thermal conductive posts 43 and the plurality of first support posts 50a and the auxiliary thermal conductive layer 26 of the second circuit board 20 may form an electromagnetic shielding structure of the first component 60, to prevent electromagnetic interference of an external component to the first component 60, or prevent the first component 60 from causing electromagnetic interference to another component. It should be understood that a shape of the thermal conductive post 43 is not limited to a cylindrical post shown in FIG. 19, and may alternatively be a square post or another special-shaped post.

In some other embodiments, there may be only one thermal conductive post 43, and the rest are all first support posts 50a; or there may be only one first support post 50a, and the rest are all thermal conductive posts 43. This is not specifically limited in this application.

Figure 20:
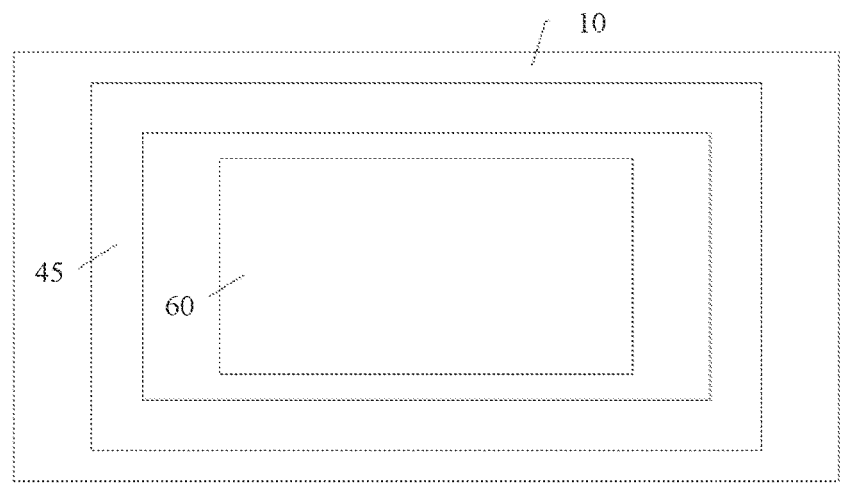
FIG. 20 is a schematic diagram of a partial structure of an orthographic projection of a thermal conductive assembly and a first component on a bottom surface of a first circuit board in the structure shown in FIG. 17 according to a third implementation.

FIG. 20 is a schematic diagram of a partial structure of orthographic projections of a thermal conductive assembly 40 and a first component 60 on a bottom surface of a first circuit board 10 in the structure shown in FIG. 17 according to a third implementation.

In this implementation, the plurality of thermal conductive posts 43 and the plurality of first support posts 50a are fixedly connected to each other to enclose a thermal conductive frame 45, and the first component 60 is located on an inner side of the thermal conductive frame 45. The plurality of thermal conductive posts 43 and the plurality of first support posts 50a may be integrally formed to form the thermal conductive frame 45. In this case, the thermal conductive frame 45 and the auxiliary thermal conductive layer 26 of the second circuit board 20 may form an electromagnetic shielding structure of the first component 60, to comprehensively protect a functional component, and prevent electromagnetic interference of an external component to the first component 60, or prevent the first component 60 from causing electromagnetic interference to another component. It should be understood that a shape of the metal frame 45 is not limited to a square ring shown in FIG. 20, and may alternatively be a circular ring or another special-shaped ring.

In this embodiment, heat generated when the main heat generation component 30 works may be sequentially transferred to the fourth thermal conductive layer 22b by using a heat dissipation pin 31, transferred to the third thermal conductive layer 23c and the third thermal conductive layer 23c of the second circuit board by using the first thermal conductive part 23a and the second thermal conductive part 23b, transferred to the auxiliary thermal conductive layer 26 of the second circuit board 20 by using the third thermal conductive part 23c and the fourth thermal conductive part 23d of the second circuit board 20, respectively transferred to the second thermal conductive layer 12b and the sixth thermal conductive layer 12c by using the thermal conductive post 43 of the thermal conductive assembly 40 and the first support post 50a, transferred to the first thermal conductive layer 12a by using the first thermal conductive part 13a and the second thermal conductive part 13b of the first circuit board 10, and finally transferred to the middle plate 115 by using the heat transfer part 170, to implement heat dissipation for the main heat generation component 30.

In this case, the three thermal conductive layers 22, the second thermal conductive structure 23, and the auxiliary thermal conductive layer 26 of the second circuit board 20, the thermal conductive post 43 of the thermal conductive assembly 40, the first support post 50a, the three thermal conductive layers 12 and the first thermal conductive structure 13 of the first circuit board 10, the heat transfer part 170 and the middle plate 115 form a three-dimensional heat dissipation topology network. Heat generated when the main heat generation component 30 works may be transferred to the heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting application of the electronic device 100 by the heat of the main heat generation component 30.

In addition, in this embodiment, signal communication between the second circuit board 20 and the first circuit board 10 is implemented by using the flexible printed circuit 162, so that signal transmission between the second circuit board 20 and the first circuit board 10 does not need to be implemented in a hard contact manner. In this case, the thermal conductive post 43 in the thermal conductive assembly 40 may be connected to the thermal conductive layer 22 of the second circuit board 20 and the auxiliary thermal conductive layer 26 of the first circuit board 10 through soldering. This can reduce introduction of a thermal interface material, help reduce thermal resistance of the three-dimensional heat dissipation topology network, and further reduce a junction temperature of the main heat generation component 30. In addition, the thermal conductive post 43 of the thermal conductive assembly 40 and the auxiliary thermal conductive layer 26 of the second circuit board 20 may form an electromagnetic shielding structure of the first component 60, to implement an electromagnetic shielding function.

Figure 21:
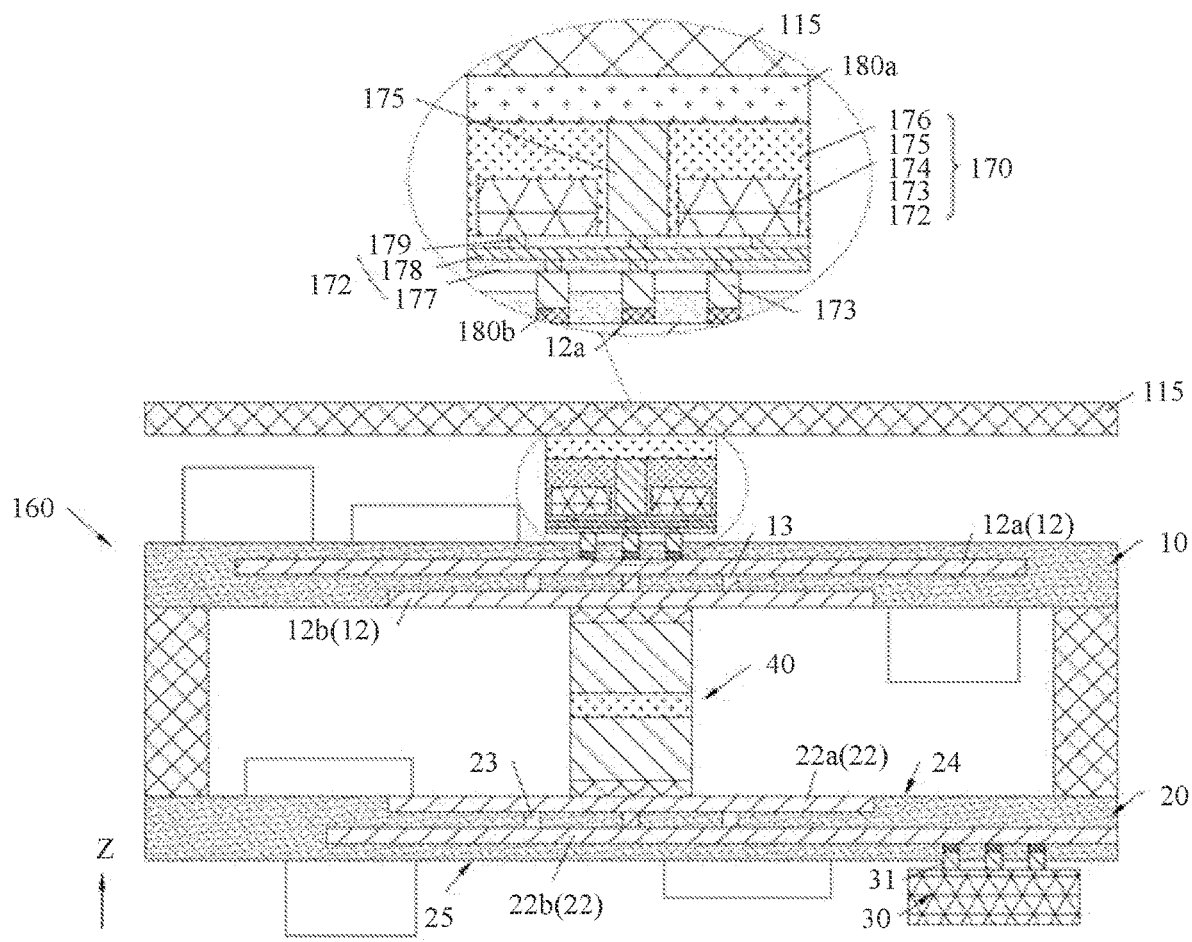
FIG. 21 is a schematic diagram of a partial cross-sectional structure cut from the structure shown in FIG. 5 along I-I according to a thirteenth embodiment.

FIG. 21 is a schematic diagram of a partial cross-sectional structure cut from the structure shown in FIG. 5 along I-I according to a thirteenth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment, and a difference from the first embodiment lies in that a first thermal conductive layer 12a is located between a top surface 14 and a bottom surface 15 of a substrate 11, that is, the first thermal conductive layer 12a of the second circuit board 10 is not exposed relative to the top surface 14 of the substrate 11.

A heat transfer part 170 includes a packaging component. For example, the packaging component may be a radio frequency front-end module, a Wi-Fi Bluetooth communication module, or a power management module. In this embodiment, the packaging component includes a bearing plate 172, a heat dissipation pin 173, a component 174, a heat dissipation post 175, and a packaging layer 176. The heat dissipation pin 173 is mounted on a bottom surface (not shown in the figure) of the bearing plate 172. The component 173 is mounted on a top surface (not shown in the figure) of the bearing plate 172. There are two components 174, and the two components 174 are mounted on the top surface of the bearing plate in a mutually spaced manner. The heat dissipation post 175 is mounted on the top surface of the bearing plate 172 and is located between the two components 174. The packaging layer 176 covers the bearing plate 172, the component 174, and the heat dissipation post 175.

The heat dissipation post 175 is exposed relative to a top surface (not shown in the figure) of the packaging layer 176. In this embodiment, a top surface (not shown in the figure) of the heat dissipation post 175 is flush with the top surface of the packaging layer 176. It should be understood that, that the heat dissipation post 175 is exposed relative to the top surface of the packaging layer 176 means that the packaging layer 176 does not completely cover the heat dissipation post 175. In some other embodiments, the top surface of the heat dissipation post 175 may alternatively protrude relative to the top surface of the packaging layer 176, or the top surface of the heat dissipation post 175 may alternatively be recessed relative to the top surface of the packaging layer 176.

In some embodiments, the packaging layer 176 is provided with a communication hole (not shown in the figure), and the communication hole exposes the bearing plate 172 relative to the packaging layer 176. The heat dissipation post 175 is located in the communication hole to connect to the bearing plate 172. The heat dissipation post 175 may be made of a metal material like copper, silver, aluminum, magnesium, or tin, to ensure that the heat dissipation post 175 has high thermal conductivity. In this case, the heat dissipation post 175 may be a metal post formed by filling the communication hole with the metal material, or the heat dissipation post 175 may be a metal layer formed by partially covering or completely covering a hole wall of the communication hole with the metal material.

The bearing plate 172 includes a substrate 177, a heat dissipation layer 178, and a heat dissipation part 179. Both the heat dissipation layer 178 and the heat dissipation part 179 are embedded into the substrate 177. The heat dissipation layer 178 may be made of a metal material like copper, silver, aluminum, magnesium, or tin, to ensure that the heat dissipation layer 178 has high thermal conductivity. There are a plurality of heat dissipation parts 179, and the plurality of heat dissipation parts 179 are arranged in a mutually spaced manner. Some of the heat dissipation parts 179 are located on one side of the heat dissipation layer 178, and are connected between the heat dissipation layer 178 and the heat dissipation pin 31.

Some of the heat dissipation parts 179 are located on the other side of the heat dissipation layer 178, and are connected between the heat dissipation layer 178 and the heat dissipation post 175. In this case, the heat dissipation pin 173, the heat dissipation part 179 of the bearing plate 172, the heat dissipation layer 178, and the heat dissipation post 175 form a heat dissipation channel of the packaging component.

In some embodiments, the substrate 177 is provided with a communication hole (not shown in the figure), and the communication hole exposes the heat dissipation layer 178 relative to the substrate 177. The heat dissipation part 179 is located in the communication hole, to connect to the heat dissipation layer 178. The heat dissipation part 179 may be made of a metal material like copper, silver, aluminum, magnesium, or tin, to ensure that the heat dissipation part 179 has high thermal conductivity. In this case, the heat dissipation part 179 may be a metal post formed by filling the communication hole with the metal material, or the heat dissipation part 179 may be a metal layer formed by partially covering or completely covering a hole wall of the communication hole with the metal material.

Specifically, the heat dissipation post 175 of the packaging component is connected to the middle plate 115, to implement heat transfer and electrical communication between the packaging component and the middle plate 115. In this embodiment, the heat dissipation post 175 of the packaging component is connected to the middle plate 115 by using the first heat transfer layer 180*a*. In this case, the first heat transfer layer 180*a* covers a top surface (not shown in the figure) of the heat dissipation post 175 of the packaging component and a top surface (not shown in the figure) of the packaging layer 176. For example, the first heat transfer layer 180*a* is a thermal interface material layer. A thermal interface material may be added between the packaging component and the middle plate 115 through mounting, dispensing, coating or the like, to form the first heat transfer layer 180*a*. In this case, the packaging component and the middle plate 115 are indirectly connected by using the first heat transfer layer 180*a*, to implement heat transfer and an electrical connection. The thermal interface material between the packaging component and the middle plate 115 may fill an air gap and tolerance redundancy between the heat dissipation post 175 of the packaging component and the middle plate 115, to reduce interface thermal resistance between the heat dissipation post 175 of the packaging component and the middle plate 115, and improve heat transfer efficiency.

The heat dissipation pin 173 of the packaging component is connected to the first thermal conductive layer 12*a*, to implement heat transfer and an electrical connection between the packaging component and first thermal conductive layer 12*a*. That is, the packaging component may not only implement heat transfer with the first thermal conductive layer 12*a* by using the heat dissipation pin 173, but also implement electrical communication with the first circuit board 10 by using the heat dissipation pin 173. In some other embodiments, the heat dissipation pin of the packaging component may alternatively be connected to the second thermal conductive layer 12*b*.

In this case, the heat dissipation pin 173 of the packaging component has both heat dissipation and grounding functions, that is, the heat dissipation pin 173 of the packaging component is also used as a grounding pin of the packaging component. The heat dissipation pin 172 of the packaging component is connected to the first thermal conductive layer 12*a* by using a second heat transfer layer 180*b*. For example, the second heat transfer layer 180*b* is a solder layer. The heat dissipation pin 173 of the packaging component may be connected to the first thermal conductive layer 12*a* by using a through molding via (TMV) process and a soldering process of the packaging component.

In other embodiments, the heat transfer part 170 may also include a heat transfer block. There is one heat transfer block. One heat transfer block is connected between a heat dissipation channel of the packaging component and the middle plate 115, or one heat transfer block is connected between a heat dissipation channel of the packaging component and the first thermal conductive layer 12*a*. Alternatively, there are two heat transfer blocks. One heat transfer block is connected between the heat dissipation channel of the packaging component and the middle plate 115, and the other heat transfer block is connected between the heat dissipation channel of the packaging component and the first thermal conductive layer 12*a*.

In this embodiment, heat generated when the main heat generation component 30 works may be sequentially transferred to the fourth thermal conductive layer 22*b* by using a heat dissipation pin 31, transferred to the thermal conductive assembly 40 by using the second thermal conductive structure 23 and the third thermal conductive layer 22*a*, transferred to the second thermal conductive layer 12*b* by using the thermal conductive assembly 40, transferred to the packaging component by using the first thermal conductive structure 13 and the first thermal conductive layer 12*a*, and finally transferred to the middle plate 115 by using the heat dissipation part 179, the heat dissipation layer 178, and the heat dissipation post 175 of the packaging component, to implement heat dissipation for the main heat generation component 30.

In this case, the two thermal conductive layers 22 and the second thermal conductive structure 23 of the second circuit board 20, the thermal conductive assembly 40, the two thermal conductive layers 12 and the first thermal conductive structure 13 of the first circuit board 10, the heat dissipation channel of the packaging component, and the middle plate 115 form a three-dimensional heat dissipation topology network. Heat generated when the main heat generation component 30 works may be transferred to the three-dimensional heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting application of the electronic device 100 by the heat of the main heat generation component 30.

In addition, in this embodiment, the three-dimensional heat dissipation topology network is formed by using the heat dissipation channel of the packaging component and other components together. This can reduce a quantity of heat transfer blocks (as shown in the first embodiment) in the three-dimensional heat dissipation topology network, can improve area utilization of the first circuit board 10, and facilitates a miniaturized design of the electronic device 100.

Figure 22:
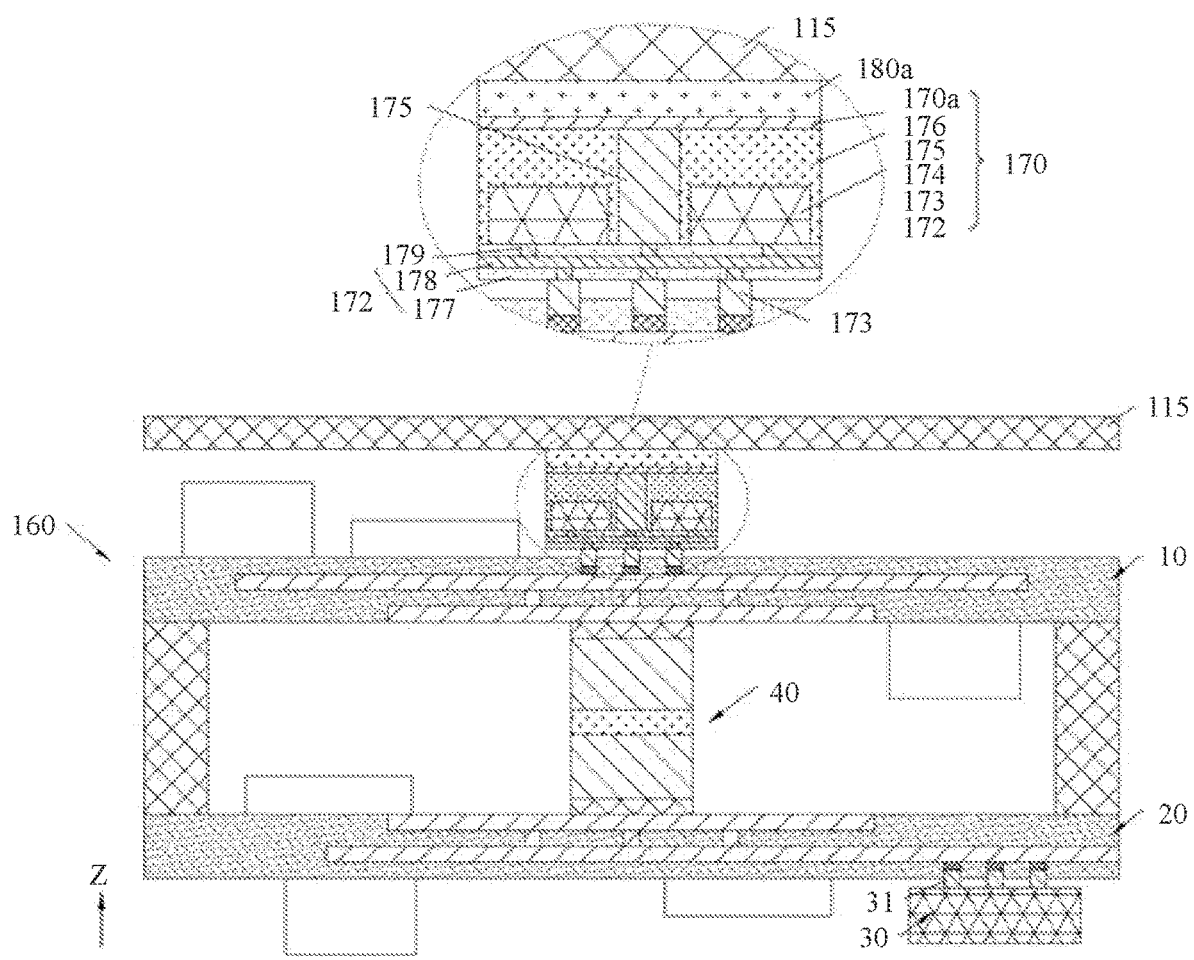
FIG. 22 is a schematic diagram of a partial cross-sectional structure cut from the structure shown in FIG. 5 along I-I according to a fourteenth embodiment.

FIG. 22 is a schematic diagram of a partial cross-sectional structure cut from the structure shown in FIG. 5 along I-I according to a fourteenth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the thirteenth embodiment, and a difference from the thirteenth embodiment lies in that the packaging component further includes an auxiliary heat dissipation layer 170a. The auxiliary heat dissipation layer 170a is connected between the heat dissipation post 175 and the first heat transfer layer 180a, so that the packaging component is indirectly connected to the middle plate 115 by using the auxiliary heat dissipation layer 170a and the first heat transfer layer 180a, to implement heat transfer and electrical communication between the packaging component and the middle plate 115. The auxiliary heat dissipation layer 170a covers a top surface of the heat dissipation post 175 and a top surface of the packaging layer 176. In this case, the heat dissipation pin 173 of the packaging component, the heat dissipation part 179 and the heat dissipation layer 178 of the bearing plate 172, the heat dissipation post 175, and the auxiliary heat dissipation layer 170a form a heat dissipation channel of the packaging component.

Figure 23:
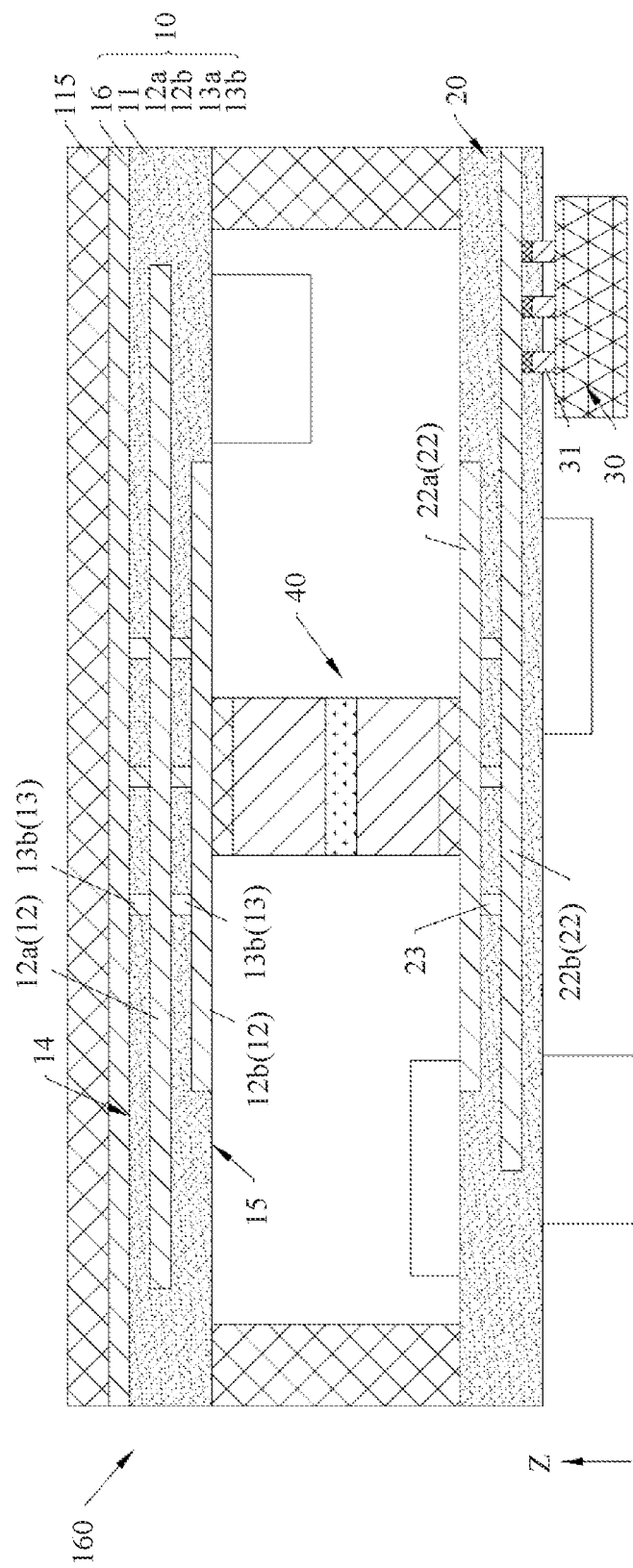
FIG. 23 is a schematic diagram of a partial cross-sectional structure cut from the structure shown in FIG. 5 along I-I according to a fifteenth embodiment.

FIG. 23 is a schematic diagram of a partial cross-sectional structure cut from the structure shown in FIG. 5 along I-I according to a fifteenth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the first embodiment. A difference from the first embodiment lies in that the first circuit board 10 includes a substrate 11, two thermal conductive layers 12, a first thermal conductive structure 13, and an auxiliary thermal conductive layer 16. The two thermal conductive layers 12 and the first thermal conductive structure 13 are all embedded into the substrate 11, and the two thermal conductive layers 12 are disposed in a mutually spaced manner. The auxiliary thermal conductive layer 16 is fixedly connected to a top surface 14 of the substrate 11. The first thermal conductive structure 13 includes a plurality of thermal conductive parts. Some of the thermal conductive parts of the first thermal conductive structure 13 are connected between two thermal conductive layers 12, and some of the thermal conductive parts of the first thermal conductive structure 13 are connected between the thermal conductive layer 13 and the auxiliary thermal conductive layer 16.

Specifically, the two thermal conductive layers 12 are respectively a first thermal conductive layer 12a and a second thermal conductive layer 12b. The first thermal conductive layer 12a is located between the top surface 14 and a bottom surface 15 of the substrate 11. The second thermal conductive layer 12b is located on a bottom side of the first thermal conductive layer 12a, is parallel to and spaced from the first thermal conductive layer 12a, and is exposed relative to the bottom surface 15 of the substrate 11. Both the first thermal conductive layer 12a and the second thermal conductive layer 12b are ground planes. In this case, the first thermal conductive layer 12a and the second thermal conductive layer 12b may be made of a metal material like copper, silver, aluminum, magnesium, or tin, to ensure that the first thermal conductive layer 12a and the second thermal conductive layer 12b have high thermal conductivity.

The auxiliary thermal conductive layer 16 covers the top surface of the substrate 11, and is disposed parallel to and spaced from the first thermal conductive layer 11. The auxiliary thermal conductive layer 16 is a ground plane. In this case, the auxiliary thermal conductive layer 16 may be made of a metal material like copper, silver, aluminum, magnesium, or tin, to ensure that the auxiliary thermal conductive layer 16 has high thermal conductivity.

The plurality of thermal conductive parts of the first thermal conductive structure 13 are respectively a first thermal conductive part 13a and a second thermal conductive part 13b, the first thermal conductive part 13a is connected between the first thermal conductive layer 12a and the second thermal conductive layer 12b, and the second thermal conductive part 13b is connected between the first thermal conductive layer 12a and the auxiliary thermal conductive layer 16, to implement a pairwise connection between the first thermal conductive layer 12a, the second thermal conductive layer 12b, and the auxiliary thermal conductive layer 16. In some other embodiments, some of the thermal conductive parts of the first thermal conductive structure 13 may alternatively be connected between the second thermal conductive layer 12b and the auxiliary thermal conductive layer 16.

In this embodiment, there are a plurality of first thermal conductive parts 13a and second thermal conductive parts 13b. The plurality of first thermal conductive parts 13a are arranged in a mutually spaced manner, to increase a heat transfer path between the first thermal conductive layer 12a and the second thermal conductive layer 12b, and increase a heat transfer speed between the first thermal conductive layer 12a and the second thermal conductive layer 12b. The plurality of second thermal conductive parts 13b are arranged in a mutually spaced manner, to increase a heat transfer path between the first thermal conductive layer 12a and the auxiliary thermal conductive layer 16, and increase a heat transfer speed between the first thermal conductive layer 12a and the auxiliary thermal conductive layer 16.

In some embodiments, the substrate 11 is provided with a plurality of first communication holes (not shown in the figure) and a plurality of second communication holes (not shown in the figure). The first communication hole connects the first thermal conductive layer 12a and the third thermal conductive layer 12b, and the second communication hole connects the first thermal conductive layer 12a and the auxiliary thermal conductive layer 16. Specifically, each first thermal conductive part 13a is located in one first communication hole, and each second thermal conductive part 13b is located in one second communication hole. The first thermal conductive part 13a and the second thermal conductive part 13b may be made of a metal material like copper, silver, aluminum, magnesium, or tin, to ensure that the first thermal conductive part 13a and the second thermal conductive part 13b have high thermal conductivity, and improve heat transfer efficiency between the first thermal conductive layer 12a and the second thermal conductive layer 12b and the auxiliary thermal conductive layer 16. In this case, the first thermal conductive part 13a and the second thermal conductive part 13b may be metal posts formed by filling the corresponding communication holes with the metal material; or the first thermal conductive part 13a and the second thermal conductive part 13b may be a metal layer formed by partially covering or completely covering hole walls of the corresponding communication holes with the metal material.

In this embodiment, the auxiliary thermal conductive layer 16 of the first circuit board 10 is fixedly connected to the middle plate 115, to implement heat transfer and electrical communication between the middle plate 115 and the first thermal conductive layer 12a. For example, the first circuit board 10 and the middle plate 115 may be fastened to each other by using a fastener like a screw or a bolt.

Heat generated when the main heat generation component 30 works may be sequentially transferred to the fourth thermal conductive layer 22b by using a heat dissipation pin 31, transferred to the thermal conductive assembly 40 by using the second thermal conductive structure 23 and the third thermal conductive layer 22a of the second circuit board 22b, transferred to the first thermal conductive layer 12a by using the second thermal conductive layer 12b and the first thermal conductive part 13a, and transferred to the middle plate 115 by using the second thermal conductive part 13b and the auxiliary thermal conductive layer 16 of the first circuit board 10, to implement heat dissipation for the main heat generation component 30.

In this case, the two thermal conductive layers 22 and the first thermal conductive structure 23 of the second circuit board 20, the thermal conductive assembly 40, the two thermal conductive layers 12, the first thermal conductive structure 13 and the auxiliary thermal conductive layer 16 of the first circuit board 10, and the middle plate 115 form a three-dimensional heat dissipation topology network. The heat generated when the main heat generation component 30 works may be transferred to the three-dimensional heat dissipation topology network by using the heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting application of the electronic device 100 by the heat of the main heat generation component 30.

In addition, in this embodiment, the auxiliary thermal conductive layer 16 of the first circuit board 10 is used to transfer heat to the middle plate 115, and the heat transfer part 170 (as shown in FIG. 6) shown in the foregoing embodiment is not required. This helps reduce thermal resistance of the three-dimensional heat dissipation topology network, and improves heat dissipation efficiency of the main heat generation component 30.

Figure 24:
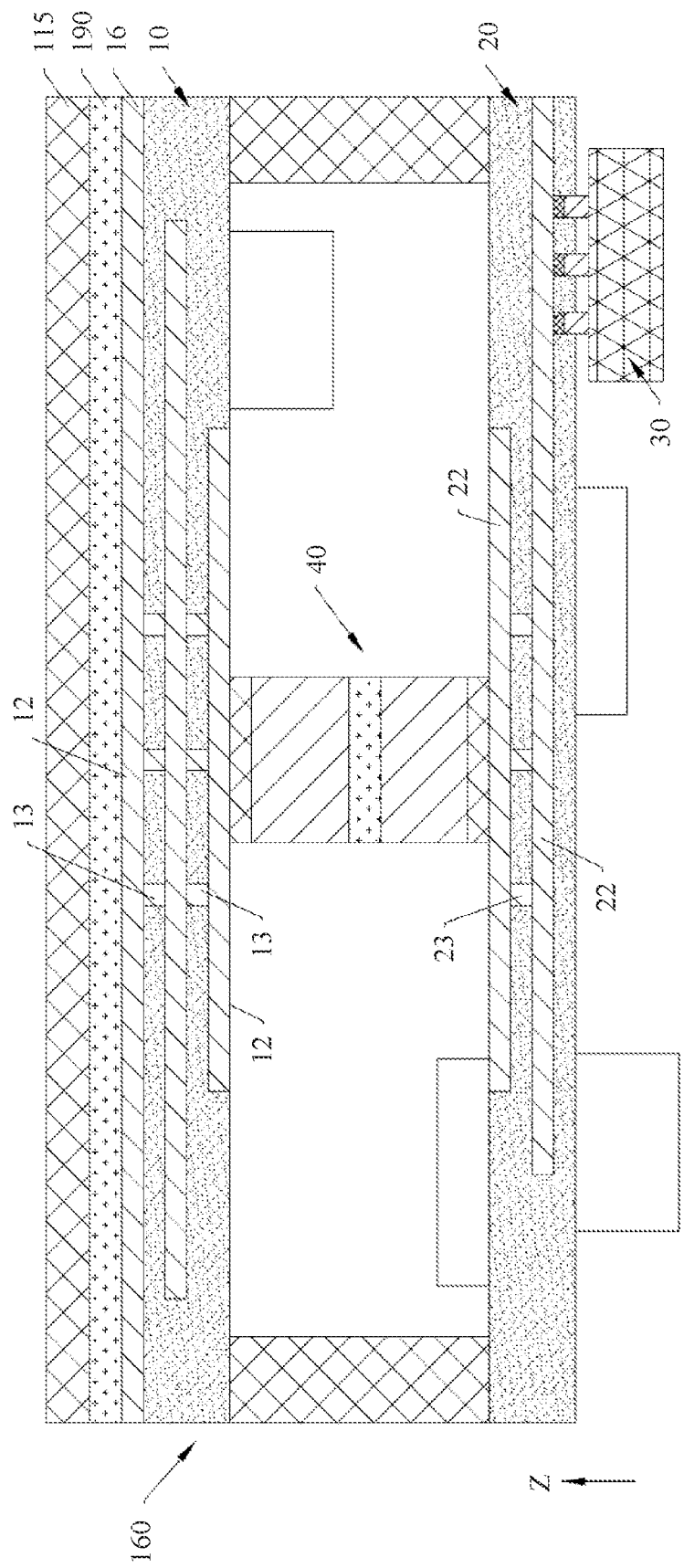
FIG. 24 is a schematic diagram of a partial cross-sectional structure cut from the structure shown in FIG. 5 along I-I according to a sixteenth embodiment.

FIG. 24 is a schematic diagram of a partial cross-sectional structure cut from the structure shown in FIG. 5 along I-I according to a sixteenth embodiment.

The heat dissipation apparatus 160 includes a first circuit board 10, a second circuit board 20, a main heat generation component 30, and a thermal conductive assembly 40. The second circuit board 20 is located on a bottom side of the first circuit board 10, and is spaced from the first circuit board 10. The main heat generation component 30 is mounted on the second circuit board 20, and is electrically connected to the second circuit board 20. The thermal conductive assembly 40 is connected between the first circuit board 10 and the second circuit board 20.

A structure between components of the electronic device 100 shown in this embodiment is basically the same as a structure between components of the electronic device 100 shown in the fourteenth embodiment. A difference from the fourteenth embodiment lies in that the electronic device 100 further includes an auxiliary heat transfer layer 190. The auxiliary heat transfer layer 190 is connected between the middle plate 115 and the auxiliary thermal conductive layer 16 of the first circuit board 10. That is, the middle plate 115 is connected to the auxiliary thermal conductive layer 16 of the first circuit board 10 by using the auxiliary heat transfer layer 190.

In an implementation, the auxiliary heat transfer layer 190 is a solder layer. Specifically, the auxiliary thermal conductive layer 16 of the first circuit board 10 is soldered to the middle plate 115 through soldering. In this case, heat transfer and electrical communication may be implemented between the first circuit board 10 and the middle plate 115 by using the solder layer.

In another implementation, the auxiliary heat transfer layer 190 is a thermal interface material layer. For example, a thermal interface material may be added between the auxiliary thermal conductive layer 16 of the first circuit board 10 and the middle plate 115 through mounting, dispensing, coating or the like, to form the auxiliary heat transfer layer 190. In this case, the auxiliary thermal conductive layer 16 of the first circuit board 10 is indirectly connected to the middle plate 115 by using the thermal interface material, to implement heat transfer between the auxiliary thermal conductive layer 16 and the middle plate 115. The thermal interface material is located between the first thermal conductive layer 12a and the middle plate 115, and may fill an air gap and tolerance redundancy between the auxiliary thermal conductive layer 16 of the first circuit board 10 and the middle plate 115, to reduce interface thermal resistance between the auxiliary thermal conductive layer 16 of the first circuit board 10 and the middle plate 115, and improve heat transfer efficiency between the auxiliary thermal conductive layer 16 of the first circuit board 10 and the middle plate 115.

In a third implementation, the auxiliary heat transfer layer 190 is a thermal conductive adhesive layer. Specifically, the auxiliary thermal conductive layer 16 of the first circuit board 10 is soldered to the middle plate 115 through bonding. In this case, heat transfer and electrical communication may be implemented between the auxiliary thermal conductive layer 16 of the first circuit board 10 and the middle plate 115 by using the thermal conductive adhesive layer.

In this embodiment, the two thermal conductive layers 22 and the second thermal conductive structure 23 of the second circuit board 20, the thermal conductive assembly 40, the two thermal conductive layers 12, the first thermal conductive structure 13 and the auxiliary thermal conductive layer 16 of the first circuit board 10, and the middle plate 115 form a three-dimensional heat dissipation topology network. Heat generated when the main heat generation component 30 works may be transferred to the three-dimensional heat dissipation topology network by using a heat dissipation pin 31, and the three-dimensional heat dissipation topology network may disperse the heat inside the electronic device 100. This can not only reduce a junction temperature of the main heat generation component 30, and can improve working efficiency and a service life of the main heat generation component 30, but also can prevent the main heat generation component 30 from forming a local hot spot on the housing 110 of the electronic device 100, and avoid limiting an application scenario of the electronic device 100 by the heat of the main heat generation component 30.

The foregoing descriptions are merely some embodiments and implementations of this application, but are not intended to limit the protection scope of this application. Any variation or replacement readily figured out by a person skilled in the art within the technical scope disclosed in this application shall fall within the protection scope of this application. When no conflict occurs, embodiments of this application and the features in the embodiments may be mutually combined. Therefore, the protection scope of this application shall be subject to the protection scope of the claims.

What is claimed is:

1. A heat dissipation apparatus, comprising:
   a first circuit board, comprising a first thermal conductive layer, a second thermal conductive layer, and a first thermal conductive structure, wherein the first thermal conductive layer and the second thermal conductive layer are spaced from each other, the first thermal conductive structure is connected between the first thermal conductive layer and the second thermal conductive layer, and the first thermal conductive layer is configured to connect to a heat sink;
   a second circuit board, located on a side of the first circuit board and spaced from the first circuit board, wherein the second circuit board comprises a third thermal conductive layer, a fourth thermal conductive layer, and a second thermal conductive structure, wherein the third thermal conductive layer and the fourth thermal conductive layer are spaced from each other, and the second thermal conductive structure is connected between the third thermal conductive layer and the fourth thermal conductive layer;
   a support post connected between the first circuit board and the second circuit board to form an air layer between the first circuit board and the second circuit board;
   a main heat generation component mounted on the second circuit board, wherein a heat dissipation pin of the main heat generation component is connected to the fourth thermal conductive layer; and
   a thermal conductive assembly connected between the second thermal conductive layer and the third thermal conductive layer.

2. The heat dissipation apparatus according to claim 1, wherein:
   the first thermal conductive layer and the second thermal conductive layer are arranged at an interval in a thickness direction of the first circuit board, and the second thermal conductive layer is located on a side that is of the first circuit board and that is relatively closer to the second circuit board than another side of the first circuit board where the first thermal conductive layer is located;
   the third thermal conductive layer and the fourth thermal conductive layer are arranged at an interval in a thickness direction of the second circuit board, and the fourth thermal conductive layer is located on a side that is of the second circuit board and that is relatively farther away from the first circuit board than another side of the second circuit board where the third thermal conductive layer is located; and
   the main heat generation component is mounted on the side that is of the second circuit board and that is relatively farther away from the first circuit board than another side of the second circuit board where the third thermal conductive layer is located, and a thermal conductive assembly is located in the air layer.

3. The heat dissipation apparatus according to claim 1, wherein the thermal conductive assembly comprises two thermal conductive blocks and a thermal interface material layer, one of the two thermal conductive blocks is connected to the second thermal conductive layer, the other one of the two thermal conductive blocks is connected to the third thermal conductive layer, and the thermal interface material layer is connected between the two thermal conductive blocks.

4. The heat dissipation apparatus according to claim 1, wherein the thermal conductive assembly comprises a thermal conductive post, and the thermal conductive post is connected between the second thermal conductive layer and the third thermal conductive layer.

5. The heat dissipation apparatus according to claim 4, wherein:
   the heat dissipation apparatus further comprises a first component, and the first component is mounted on the first circuit board or the second circuit board;
   the thermal conductive post and the support post are both made of a metal material and are both in a grounded state; and
   when the thermal conductive assembly comprises only one thermal conductive post, the thermal conductive post and the support post are respectively located on both sides of the first component; or
   when the thermal conductive assembly comprises a plurality of thermal conductive posts:
      the plurality of thermal conductive posts and the support post are disposed in a mutually spaced manner around the first component; or the plurality of thermal conductive posts and the support post are fixedly connected to each other to enclose a metal frame, and the first component is located on an inner side of the metal frame.

6. The heat dissipation apparatus according to claim 1, wherein the thermal conductive assembly comprises a packaging component, the packaging component is provided with a heat dissipation channel, and the heat dissipation channel of the packaging component is connected between the second thermal conductive layer and the third thermal conductive layer.

7. The heat dissipation apparatus according to claim 6, wherein the packaging component comprises:
a bearing plate, wherein a heat dissipation part is disposed inside the bearing plate;
a heat dissipation pin located on one side of the bearing plate and connected to the heat dissipation part of the bearing plate;
a heat dissipation post located on another side of the bearing plate and connected to the heat dissipation part of the bearing plate; and
a packaging layer covering the bearing plate and the heat dissipation post, wherein the heat dissipation post is exposed relative to the packaging layer, wherein
the heat dissipation pin, the heat dissipation part, and the heat dissipation post form the heat dissipation channel of the packaging component.

8. The heat dissipation apparatus according to claim 6, wherein the packaging component comprises:
a bearing plate, wherein a heat dissipation part is disposed inside the bearing plate;
a heat dissipation pin located on one side of the bearing plate and connected to the heat dissipation part of the bearing plate;
a heat dissipation post located on another side of the bearing plate and connected to the heat dissipation part of the bearing plate;
a packaging layer covering the bearing plate and the heat dissipation post, wherein the heat dissipation post is exposed relative to the packaging layer; and
an auxiliary heat dissipation layer covering the heat dissipation post and the packaging layer, wherein
the heat dissipation pin, the heat dissipation part, the heat dissipation post, and the auxiliary heat dissipation layer form the heat dissipation channel of the packaging component.

9. The heat dissipation apparatus according to claim 6, wherein:
the thermal conductive assembly further comprises a thermal conductive block; and
when thermal conductive assembly comprises only one thermal conductive block, the thermal conductive block is connected between the heat dissipation channel of the packaging component and the second thermal conductive layer, or the thermal conductive block is connected between the heat dissipation channel of the packaging component and the third thermal conductive layer; or
when thermal conductive assembly comprises two thermal conductive blocks, one of the two thermal conductive blocks is connected between the heat dissipation channel of the packaging component and the second thermal conductive layer, and the other one of the two thermal conductive blocks is connected between the heat dissipation channel of the packaging component and the third thermal conductive layer.

10. The heat dissipation apparatus according to claim 1, wherein:
the heat dissipation apparatus further comprises a connection layer, and the connection layer is made of solder, a thermal interface material, or a thermal conductive adhesive; and
when the heat dissipation apparatus comprises only one connection layer, the connection layer is connected between the thermal conductive assembly and the second thermal conductive layer, or the connection layer is connected between the thermal conductive assembly and the third thermal conductive layer; or
when the heat dissipation apparatus comprises two connection layers, one of the two connection layers is connected between the thermal conductive assembly and the second thermal conductive layer, and the other one of the two connection layers is connected between the thermal conductive assembly and the third thermal conductive layer.

11. The heat dissipation apparatus according to claim 1, wherein the first thermal conductive structure comprises a chip, the chip of the first thermal conductive structure is provided with a heat dissipation channel, and the heat dissipation channel of the chip of the first circuit board is connected between the first thermal conductive layer and the second thermal conductive layer.

12. The heat dissipation apparatus according to claim 11, wherein the chip of the first thermal conductive structure comprises:
a wafer layer;
a thermal conductive surface layer, wherein the thermal conductive surface layer is located on one side of the wafer layer and is connected to the wafer layer;
a leg, wherein the leg is located on another side of the wafer layer and is connected to the wafer layer; and
a packaging layer, wherein the packaging layer covers the wafer layer, the thermal conductive surface layer, and the leg, and the thermal conductive surface layer and the leg are exposed relative to the packaging layer, wherein
the thermal conductive surface layer, the wafer layer, and the leg form the heat dissipation channel of the chip of the first thermal conductive structure.

13. The heat dissipation apparatus according to claim 1, wherein the second thermal conductive structure comprises a chip, the chip of the second thermal conductive structure is provided with a heat dissipation channel, and the heat dissipation channel of the chip of the second thermal conductive structure is connected between the third thermal conductive layer and the second thermal conductive layer.

14. An electronic device, comprising
a heat dissipation apparatus, wherein the heat dissipation apparatus comprises:
a first circuit board, comprising a first thermal conductive layer, a second thermal conductive layer, and a first thermal conductive structure, wherein the first thermal conductive layer and the second thermal conductive layer are spaced from each other, the first thermal conductive structure is connected between the first thermal conductive layer and the second thermal conductive layer, and the first thermal conductive layer is configured to connect to a heat sink;
a second circuit board, located on a side of the first circuit board and spaced from the first circuit board, wherein the second circuit board comprises a third thermal conductive layer, a fourth thermal conductive layer, and a second thermal conductive structure, wherein the third thermal conductive layer and the fourth thermal conductive layer are spaced from each other, and the second thermal conductive structure is connected between the third thermal conductive layer and the fourth thermal conductive layer;

a support post, connected between the first circuit board and the second circuit board to form an air layer between the first circuit board and the second circuit board;

a main heat generation component mounted on the second circuit board, wherein a heat dissipation pin of the main heat generation component is connected to the fourth thermal conductive layer;

a thermal conductive assembly connected between the second thermal conductive layer and the third thermal conductive layer; and a heat sink connected to the first thermal conductive layer.

15. The electronic device according to claim 14, wherein the electronic device further comprises a heat transfer part, and the heat transfer part is connected between the heat sink and the first thermal conductive layer.

16. The electronic device according to claim 15, wherein in a thickness direction of a first circuit board, the heat transfer part at least partially overlaps the first thermal conductive structure.

17. The electronic device according to claim 15, wherein:
the heat transfer part comprises a heat transfer block, or
the heat transfer part comprises a packaging component, the packaging component of the heat transfer part is provided with a heat dissipation channel, and the heat dissipation channel of the packaging component of the heat transfer part is connected between the heat sink and the first thermal conductive layer.

18. The electronic device according to claim 15, wherein:
the heat dissipation apparatus further comprises a heat transfer layer, and the heat transfer layer is made of solder, a thermal interface material, or a thermal conductive adhesive; and when the heat dissipation apparatus comprises only one heat transfer layer, the heat transfer layer is connected between the heat transfer part and the first thermal conductive layer, or the heat transfer layer is connected between the heat transfer part and the heat sink; or when heat dissipation apparatus comprises two heat transfer layers, one of the two heat transfer layers is connected between the heat transfer part and the first thermal conductive layer, and the other one of the two heat transfer layers is connected between the heat transfer part and the heat sink.

19. The electronic device according to claim 14, wherein the electronic device further comprises an auxiliary heat transfer layer, the auxiliary heat transfer layer is made of a thermal interface material, and the auxiliary heat transfer layer is connected between the heat sink and the first thermal conductive layer.

20. The electronic device according to claim 14, wherein the heat sink is a middle frame, a graphite film, a graphene film, a thermal conductive metal film, a heat pipe heat sink, a vapor chamber heat sink, or a fan.

* * * * *